United States Patent
Tanaka et al.

(10) Patent No.: US 6,304,320 B1
(45) Date of Patent: Oct. 16, 2001

(54) STAGE DEVICE AND A METHOD OF MANUFACTURING SAME, A POSITION CONTROLLING METHOD, AN EXPOSURE DEVICE AND A METHOD OF MANUFACTURING SAME, AND A DEVICE AND A METHOD OF MANUFACTURING SAME

(75) Inventors: Keiichi Tanaka, Funabashi (JP); Andrew Hazelton, San Carlos; Mike Binnard, Belmont, both of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/512,766

(22) Filed: Feb. 25, 2000

Related U.S. Application Data

(60) Provisional application No. 60/135,506, filed on Feb. 26, 1999.

(51) Int. Cl.$^7$ .............................. G03B 27/60; G03B 27/62
(52) U.S. Cl. ................................. 355/73; 355/75
(58) Field of Search ................... 355/73, 72, 76, 355/53, 318, 75, 77; 248/362, 363; 310/12

(56) References Cited

U.S. PATENT DOCUMENTS

| | | |
|---|---|---|
| 4,507,597 | 3/1985 | Trost ..................... 318/653 |
| 4,683,391 * | 7/1987 | Higuchi ................. 310/90.5 |
| 4,780,617 | 10/1988 | Umatate et al. ............ 250/548 |
| 5,196,745 | 3/1993 | Trumper .................. 310/12 |
| 5,298,939 * | 3/1994 | Swanson et al. ............ 355/53 |
| 5,448,332 | 9/1995 | Sakakibara et al. ......... 355/53 |
| 5,723,917 * | 3/1998 | Chitayat ................. 310/12 |
| 5,796,467 * | 8/1998 | Suzuki ................... 355/53 |
| 5,838,079 * | 11/1998 | Marohashi et al. .......... 310/12 |
| 5,885,747 * | 3/1999 | Yamasaki et al. .......... 430/296 |
| 5,886,432 * | 3/1999 | Markle ................... 310/12 |
| 5,939,852 * | 8/1999 | Akutsu et al. ............ 318/640 |
| 5,996,437 * | 12/1999 | Novak et al. ............. 74/490.09 |
| 6,046,555 | 4/2000 | Szoboszlay .............. 318/254 |
| 6,072,251 * | 6/2000 | Markle ................... 310/12 |
| 6,104,108 | 8/2000 | Hazelton et al. ............ 310/12 |

FOREIGN PATENT DOCUMENTS

| | | |
|---|---|---|
| 58-175020 | 10/1983 | (JP) . |
| 61-44429 | 3/1986 | (JP) . |
| 6-283403 | 10/1994 | (JP) . |
| 9-72975 | 3/1997 | (JP) . |
| 10-112433 | 4/1998 | (JP) . |

OTHER PUBLICATIONS

English–language translation of JP–A–9–72975.

* cited by examiner

Primary Examiner—Russell Adams
Assistant Examiner—Hung Henry Nguyen
(74) Attorney, Agent, or Firm—Oliff & Berridge, PLC

(57) ABSTRACT

In a stage device, prior to two-dimensional movement of a stage, a first driving device disposed on a side of the stage where an object is loaded drives the stage in a first-axis direction, and a second driving device disposed on a side of the stage opposite to the side where the object is loaded drives the stage in a second-axis direction that is different from the first-axis direction. Thus, the stage is moved in two-dimensional directions. Therefore, in order to perform two-dimensional movement of the stage, a structure is possible in which each driving device is defined as a one-dimensional driving device, and in which one driving device is not driven by another driving device. Therefore, it is possible to move the object at high speed and to accurately control the position of the object with a simple structure. By using the stage device in order to move the wafer or the like, an exposure device of high throughput and high accuracy can be realized.

65 Claims, 31 Drawing Sheets

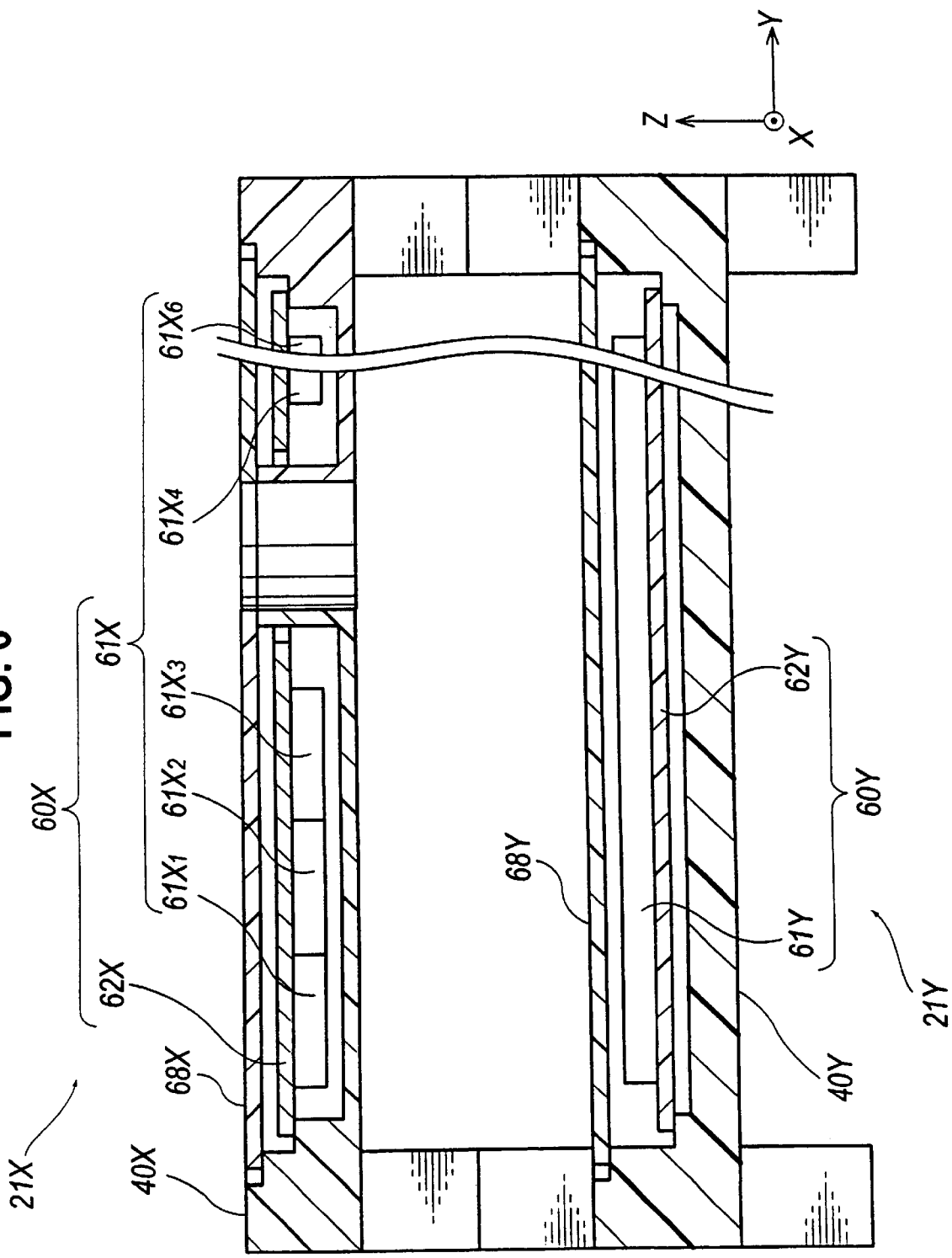

(LY + DY = PY)

STAGE DEVICE AND A METHOD OF MANUFACTURING SAME, A POSITION CONTROLLING METHOD, AN EXPOSURE DEVICE AND A METHOD OF MANUFACTURING SAME, AND A DEVICE AND A METHOD OF MANUFACTURING SAME

This nonprovisional application claims the benefit of U.S. Provisional Application No. 60/135,506, filed Feb. 26, 1999.

BACKGROUND OF THE INVENTION

1. Field of Invention

This invention relates to a stage device and to a method of manufacturing a stage device. This invention also relates to a position controlling method, and to an exposure device and a method of manufacturing an exposure device. This invention also relates to a device made by the exposure device and to a method of manufacturing such a device. More specifically, this invention relates to a stage device that controls a position and posture of an object with a high degree of accuracy, and to a method of manufacturing the stage device. The invention also relates to a method of controlling a position of an object using the stage device. The invention further relates to an exposure device having the stage device, and to a method of manufacturing the exposure device. The invention further relates to a device, such as a micro-device, that is manufactured by the exposure device, and to a method of manufacturing the device.

2. Description of Related Art

Conventionally, in a lithographic process to manufacture a semiconductor element, a liquid crystal display element, or the like, an exposure device has been used that transfers a pattern formed on a mask or a reticle (hereafter referred to as "reticle") onto a substrate such as a glass plate or a wafer, where a resist or the like is coated, through a projection optical system.

In this type of exposure device, in order to position a wafer (or other substrate) at an exposure position with high accuracy, a stage device has been used to control a position and a posture in six degrees-of-freedom, such as X, Y, Z, $\theta_X$, $\theta_Y$, $\theta_Z$, of a wafer holder that holds the wafer. On this type of stage device, conventionally, two X-axis driving linear motors, two Y-axis driving linear motors, and a stage driving guide are provided. These elements drive an X-Y stage in the two-dimensional X-Y direction, a $\theta_Z$ table loaded on this X-Y stage, and a three degrees-of-freedom leveling table, mounted on the $\theta_Z$ table, that drives a wafer holder that holds a wafer in three degrees-of-freedom such as Z, $\theta_X$, and $\theta_Y$ (focusing and leveling). This stage device has a large number of moving parts, and a high thrust motor is needed as a linear motor in order to obtain the required speed. Furthermore, because the dimensions of the moving parts are large, the range of motion is also restricted.

Recently, a stage device with a flat motor has been developed where positioning of a wafer table on which a wafer is loaded can be performed in three degrees-of-freedom directions such as X, Y, and $\theta_Z$ in a non-contact state. This enables a wafer to be positioned at high speed and with high accuracy without the effects of a mechanical guide surface. Additionally, a long life expectancy can be expected by avoiding mechanical friction. With respect to this stage device, a variable magnetic reluctance driving method has been suggested that combines two linear pulse motors of a variable magnetic reluctance driving method, such as Sawyer motors. Additionally, a stage device has been suggested that uses a flat motor as a driving device using a Lorentz electromagnetic driving method. These are disclosed in, for example, Japanese Patent Laid-Open Publication No. 58-175020 and U.S. Pat. No. 5,196,745. Furthermore, it has been suggested that the position and posture control of the wafer in the six degrees-of-freedom directions can be performed by using a stage on which a wafer is loaded that is driven in three degrees-of-freedom directions such as X, Y, $\theta_Z$ by a flat motor, and at the same time using a leveling table that can control a position and a posture of the substrate loaded on the stage in the remaining three degrees-of-freedom directions.

Incidentally, as a device rule (practical minimum line width) becomes refined along with the high density of semiconductor elements, high resolution is increasingly requested as a performance capability of an exposure device. Because of this, the exposure wavelength has shortened. As an exposure device for the next generation and thereafter, it may be desirable to use vacuum ultraviolet (VUV) light with a wavelength of 200 nm or less, X-rays in which the wavelength is even shorter, and charged particle beams, such as an electron beam, as an exposure energy beam. In this type of exposure device, when oxygen exists in the path of the energy beam, energy beam absorbing substances such as haze and ozone ($O_3$) occur due to photochemical reactions, or an energy beam is directly absorbed by air particles. Therefore, it is necessary to replace air with nitrogen $N_2$, helium He, or the like, or use a vacuum environment.

However, in the stage device using the above-mentioned flat motor, because of the characteristics of the device, the stage device cannot be used in a non-air environment because the stage is floated and supported in a non-contact state by using an air bearing or the like.

Additionally, a large wafer has been recently developed, and a stage device with a large driving force has been expected in order to move the wafer.

SUMMARY OF THE INVENTION

This invention is made in consideration of the above-mentioned circumstances. A first object is to provide a stage device that can move a loaded object at high speed and perform positioning control with high accuracy.

A second object of this invention is to perform positioning control with high accuracy when moving the object at high speed.

A third object of this invention is to provide an exposure device that can improve the exposure accuracy and throughput by moving a substrate at high speed and controlling the position of the substrate with high accuracy.

A fourth object of this invention is to provide a device (e.g., a micro-device) where a fine pattern is accurately formed as throughput is improved.

A first aspect of the invention relates to a stage device that controls the position of an object that has been loaded, having a stage, a first driving device, and a second driving device. The stage has a loading face on which an object is loaded. The first driving device drives the stage in a first-axis direction within a plane substantially parallel to the loading face, and is disposed on the loading face side of the stage. The second driving device drives the stage in a second-axis direction that crosses the first-axis direction within a plane substantially parallel to the loading face.

According to this aspect of the invention, the first driving device, which is disposed on the object loading face side of the stage, drives the stage in the first-axis direction, and the second driving device, which is disposed on the side of the stage opposite the object loading face side, drives the stage in the second-axis direction and moves the stage two-dimensionally. Therefore, a structure is possible where one driving device is not driven by another driving device, by taking each driving device as a one-dimensional driving device, so the object can be moved at high speed and positioning of the object can be accurately controlled with a simple structure.

In this case, both the first- and second-axis directions can be directions that are perpendicular to each other. In this case, thrust in other driving directions is not generated by driving one of the first and second driving devices, so both driving devices can be independently operated. Therefore, the stage can be arbitrarily moved two-dimensionally by a simple control.

In the stage device of this aspect of the invention, the first driving device can be structured to have a first movable element disposed on the loading face of the stage and a first stationary part facing toward the first movable element. In this case, the stage can be driven in the first-axis direction by driving the first movable element toward the first stationary part in the first-axis direction.

The first movable element can have a first magnetic pole unit and the first stationary part can have a first armature unit. The first driving device can drive the first movable element in the first-axis direction by electromagnetic interactions (attraction or repulsion) between the first magnetic pole unit and the first armature unit, in which current is supplied. In this case, the first movable element is driven by electromagnetic interaction that has excellent controllability and linearity, so the stage, and therefore the object that has been loaded on the stage, can be moved at high speed and position controlling can be accurately performed with respect to the first-axis direction.

Furthermore, the material of the stage can be a non-magnetic material. In this case, the non-magnetic material is usually lighter than the magnetic material in terms of relative density, so the stage can be made light-weight. Magnetic material refers to material with sufficiently large permeability compared to air, and non-magnetic material refers to material with sufficiently small permeability compared to a magnetic material, such as iron, that is substantially equal to air.

In addition, in the first driving device that generates a driving force by the electromagnetic interaction, the first magnetic pole unit can be structured so as to generate an alternating field that changes by a first cycle along the first-axis direction between the first magnetic pole unit and the first armature unit. In this case, the first magnetic pole unit can be continuously driven in the first-axis direction.

The first magnetic pole unit can be structured by a plurality of magnets that are arrayed in the first-axis direction and magnetized in a direction that is not perpendicular to the loading face. In this case, when structuring the first magnetic pole unit that forms a stable magnetic circuit with low magnetic resistance, the magnetic pole unit can be structured by magnets only, so that the weight of the movable element can be reduced.

Furthermore, needless to say, the first magnetic pole unit can be structured by a plurality of magnets that are arrayed in the first-axis direction so that the polarities of the magnetic pole faces that face toward the first armature unit are alternated, and are magnetized in a direction that is substantially perpendicular to the loading face. In this case, in order to form a stable magnetic circuit with low magnetic resistance, it is preferable to further have a magnetic body member structured by a magnetic material that supports the plurality of magnets between the facing face and the opposite side of the first armature unit.

In the first driving device where the first magnetic pole unit generates an alternating field, the first armature unit has a current path along a plane parallel to the loading face and includes a coil row structured by a plurality of armature coils arrayed in the first-axis direction. In the coil row, M (M is an integer that is 2 or more) types of current paths are arrayed per length of the first cycle along the first-axis direction. The first driving device further has a first current supply that supplies a cyclic current having mutually different phases for the respective M types of the current paths. In this case, in response to movement in the first-axis direction of the first magnetic pole unit, as the current supply supplies current to the respective armature coils facing toward the first magnetic pole unit, the first magnetic pole unit can be continuously driven at a specified driving force in the first-axis direction. In addition, the direction and size of the driving force applied to the first magnetic pole unit can be controlled by the direction and the size of the current supplied by the current supply to the respective armature coils. Furthermore, if the width of the current path in the first-axis direction of the respective armature coils is substantially 1/M of the first cycle, the phase difference of the current that is supplied to the adjacent armature coils can be made to be a constant value that is $(2\pi/M)$, so that driving control can be easy.

Here, the armature coils can have a flat polygon shape. In this case, because the current path of other coils can be arranged at a position corresponding to an empty position (a central void) of the coil, the current contributing to the generation of the driving force can be supplied in a plane without any unused spaces, and a large driving force can be generated. Particularly, when the shape of the armature coil is a flat hexagon, the processing can be easily performed to make a shape where the armature coils can be arrayed in a one-dimensional direction without any spaces between the current paths by overlapping parts of the coils.

The first driving device with a coil row further has a flat coil support member that supports the coil row on a side of the coil row that is opposite to the side facing the first magnetic pole unit of the coil rows. In this case, because shape alteration of the coil row and the armature coils can be prevented, the first magnetic pole unit can be stably driven.

Here, it is possible to structure the coil support member from a magnetic material, and it is also possible to structure the coil support member from a non-magnetic material. If the coil support member is structured from a magnetic material, the component of the magnetic flux density at the alignment position of the armature coils in the direction that is perpendicular to the face of the stage where the object is loaded can be made to be large, and the driving force of the first magnetic pole unit can be made to be large in the first-axis direction. If the coil support member is structured from a non-magnetic material, the size of the component of the magnetic flux density at the alignment position of the armature coil in the direction parallel to the face of the stage where the object is loaded can be kept large, and the contribution to the magnetic floating of the stage, discussed later, can be enlarged.

Furthermore, in the first driving device with the coil row, the first magnetic pole unit generates a magnetic induction flux having a first component in a direction perpendicular to the loading face, that cyclically changes by a first cycle along the first-axis direction in the alignment face of the coil row facing the first magnetic pole unit, and a second component in a direction perpendicular to the first-axis direction along the plane parallel to the loading face. The first current supply supplies a superimposed current to the armature coil, in which a first current that has an electromagnetic interaction with the first component drives the movable element in the first-axis direction, and a second current that has an electromagnetic interaction with the second component drives the movable element in the direction perpendicular to the loading face.

Accordingly, the first magnetic pole unit, that is, the stage, can be driven in the first-axis direction by electromagnetic interaction of the current that is supplied to the armature coil and the magnetic induction flux generated by the first magnetic pole unit. At the same time, it (the stage) is floated and driven in the direction perpendicular to the loading face. Therefore, it is not necessary to use an air bearing or the like, so it is possible to drive the stage in the first-axis direction when the stage is floated and supported even when the object is disposed under a non-air environment such as a vacuum environment.

Additionally, the stage device of this invention can be structured by further having a first reaction force cancellation mechanism that applies a force to cancel reaction forces that act on the first stationary part due to driving of the first movable element toward the first stationary part by the electromagnetic interaction. In this case, by electromagnetic interaction that has excellent controllability and linearity, the first reaction force cancellation mechanism generates a force to cancel the reaction force that acts on the first stationary part and applies it to the first stationary part, so it is possible to accurately cancel the reaction force that acts on the first stationary part. Therefore, it is possible to control the position of the stage with high accuracy when the stage is moved at high speed.

Furthermore, in the stage device of this invention, various embodiments of the structure of the first driving device, described earlier, can be applied to the second driving device as well. That is, the second driving device can be structured by having a second movable element disposed on a face of the stage that is opposite to the loading face of the stage, and a second stationary part that is opposite to the second movable element. The structure of various embodiments concerning the first movable element and first stationary part described above can be applied to the second movable element and the second stationary part, respectively, as well.

Furthermore, in the stage device of this aspect of the invention, the second driving device can be structured by further having a second reaction force cancellation mechanism that applies a force to cancel the reaction force that acts on the second stationary part due to driving the second movable element, to the second stationary part, by electromagnetic interaction. In this case, in the same manner as the case of the first reaction force cancellation mechanism, the reaction force that acts on the second stationary part can be accurately canceled, so it is possible to control the position of the stage with high accuracy when the stage is moved at high speed.

Furthermore, in the stage device of this aspect of the invention, the first driving device has a first movable element disposed on a first area of the loading face of the stage in the vicinity of the area where the object is loaded, and a first stationary part facing toward the first movable element, and the second driving device has a second movable element disposed on a second area on the rear face of the stage, that is opposite the loading face, and a second stationary part facing the second movable element. In this case, the first movable element is driven in the first-axis direction with respect to the first stationary part, and the second movable element is driven in the second-axis direction with respect to the second stationary part, so the stage can be arbitrarily driven two-dimensionally.

Here, the second area can be considered as a corresponding area of the first area, but on the rear face. In this case, the first area can be defined as two areas on either side of the area where the object is loaded on the loading face of the stage. Furthermore, as used herein, the corresponding area on the rear face refers to the area of the rear face that has a front-to-back relationship with the area on the loading face.

Furthermore, the second area can be defined as an area including an area other than a corresponding area of the first area on the rear face. In this case, the first area can be defined as two areas on either side of the area on which the object is loaded on the loading face of the stage, and the second area can be defined as an area including the area on the rear face corresponding to the area on the loading face where the object is loaded. Thus, the second area can be defined as an area that does not correspond to the first area on the rear face. In this case, the first area can be defined as areas positioned on both sides of the area where the object is loaded, in a third-axis direction within a plane substantially parallel to the loading face, and the second area can be defined as areas positioned on both sides of a corresponding area of the area where the object is loaded on the rear face in a fourth-axis direction crossing the third-axis direction within a plane substantially parallel to the loading face.

Furthermore, the stage device of this aspect of the invention can also include a position detection device that detects the position of the stage and a controlling device that controls the first and second driving devices based upon the detection result by the position detection device. In this case, while the controlling device selectively supplies current to the armature coils facing toward the first or second magnetic pole unit, it is possible to supply the current more effectively by performing current control such that the current is not supplied to the armature coil that only generates a weak Lorentz electromagnetic force, or that does not generate a Lorentz electromagnetic force, through electromagnetic interaction, and the current consumed can be decreased while maintaining the driving force.

Furthermore, in the stage device of this aspect of the invention, when at least one of the first driving device and the second driving device has a magnetic pole unit and an armature unit that mutually cooperate to drive the stage, the stage device can include an origin position obtaining device. The origin position obtaining device determines an origin position in the position relationship between the armature unit and the magnetic pole unit. In this case, based upon the origin position in the position relationship between the magnetic pole unit and the armature unit determined by the origin position obtaining device, by controlling the phase that is supplied to the armature coil and driving the stage, position control of the stage with high accuracy can be performed at a high driving force.

A second aspect of this invention relates to a method of controlling a position of an object that is loaded on a stage. The method includes the steps of driving the stage in a first-axis direction in a plane substantially parallel to the loading face from the loading face side of the stage, and driving the stage in a second-axis direction that crosses the first-axis direction in a plane substantially parallel to the loading face from the side of the stage opposite the loading face side.

According to this aspect of the invention, driving the stage in the first-axis direction is performed from the object loading face of the stage, and driving the stage in the second-axis direction is performed from the side of the stage opposite the object loading face side. Therefore, controlling the position of the object can be accurately performed, and the object can be moved at high speed using a simple structure.

Furthermore, by simultaneously performing the first and second steps, driving the object in an arbitrarily two-dimensional direction can be performed.

In the method of controlling the position of the stage in this aspect of the invention, driving the stage can include a step of returning-to-origin that determines an origin position in the position relationship between the magnetic pole unit and the armature unit, through cooperation between the armature unit and the magnetic pole unit. In this case, stage driving is controlled using the origin position that was determined by the returning-to-origin step as a reference. Therefore, highly accurate position control of the stage can be performed at a high driving force.

A third aspect of this invention relates to a method of manufacturing a stage device that controls a position of an object that has been loaded thereon. The method includes a first step of providing a stage on which to load the object, a second step of disposing a first driving device that drives the stage in a first-axis direction in a plane substantially parallel to the loading face, and a third step of disposing a second driving device that drives the stage in a second-axis direction that crosses the first-axis direction in the plane substantially parallel to the loading face. According to this aspect of the invention, as the first through third steps are performed, by combining other parts mechanically, electrically, and optically, and adjusting, as needed, a stage device of this invention can be manufactured.

The first step can include a first sub-step of disposing a first movable element, that is a structural element of the first driving device, on the loading face of the stage, and a second sub-step of disposing a first stationary part, that is a structural element of the first driving device, opposite the first movable element. The second step can include a third sub-step of disposing a second movable element, that is a structural element of the second driving device, on a face on the opposite side of the loading face of the stage, and a fourth sub-step of disposing a second stationary part, that is a structural element of the second driving device, opposite the second movable element. In this case, as the first movable element is driven in the first-axis direction with respect to the first stationary part, and the second movable element is driven in the second-axis direction with respect to the second stationary part, a stage device that can drive the stage in an arbitrary two-dimensional direction can be manufactured.

In the method of manufacturing the stage device of this invention, when at least one of the first driving device and the second driving device has a magnetic pole unit and an armature unit that drive the stage by electromagnetic interaction, a fourth step of providing a return-to-origin device (also referred to as an "origin detection device") can be included. The return-to-origin device determines the origin position in the position relationship between the armature unit and the magnetic pole unit. In this case, based upon the origin position that has been determined by the return-to-origin device, a stage device that can control the position of the stage with high accuracy at a high driving force can be manufactured.

A fourth aspect of this invention relates to an exposure device having an optical system through which passes an exposure energy beam and a stage device of this invention on which an object disposed on the path of the energy beam can be loaded as an object. Here, the object can be a substrate that is exposed by the energy beam and to which a specified pattern can be transferred. Furthermore, in the case of the exposure device where a pattern formed in a mask is transferred, needless to say, the object can be the substrate, but the object can also be a mask. Furthermore, both the object and the substrate can be masks, and each can be respectively loaded on the stage device of this invention.

According to this aspect of the invention, because the substrate or mask is loaded on the stage device of this invention and is exposed, controlling the position of the substrate or the mask can be performed with high accuracy and at high speed of movement, and both throughput and exposure accuracy can be improved.

In the exposure device of this invention, the optical system can be, for example, a charged particle beam optical system having a charged particle beam lens barrel, and a magnetic shield to prevent the entrance of magnetic induction flux to the path of progression of the charged particle beam emitted from the charged particle beam lens barrel. In this case, the magnetic shield prevents the charged particle beam emitted from the charged particle beam lens barrel from being deflected in an unexpected direction by the effects of the magnetic force generated in the stage device. Accordingly, exposure can be performed with high accuracy by using a charged particle beam such as an electron beam or an ion beam.

The magnetic shield can have a two-layer structure with an external barrel disposed at a specified clearance from the periphery of an internal barrel. It is also acceptable to form the external barrel with a small permeability compared to the internal barrel.

Furthermore, the exposure device of this invention can have a structure where the optical system and the driving force generating member in the stage device can be independently mechanically disposed. In this case, because vibration generated by the driving force generating member is prevented from being transmitted to the optical system, exposure with high accuracy is possible.

A fifth aspect of this invention relates to a method of manufacturing an exposure device including a first step of providing an optical system through which an exposure energy beam passes, and a second step of disposing the stage device of this invention on which an object is disposed in the path of the energy beam. According to this aspect of the invention, as the first and second steps are performed, by combining other parts mechanically, electrically and optically, and adjusting, an exposure device can be manufactured that has the stage device of this invention as a position controlling device that controls the position of an object.

By using the above-mentioned exposure device of this invention in a lithographic process, a device with a fine pattern can be manufactured. Therefore, another aspect of this invention relates to a method of manufacturing a device (e.g., an integrated circuit or an LCD display), including a first step of preparing a substrate and a second step of exposing the substrate with an energy beam using the exposure device of this invention to transfer a specified pattern to the substrate.

BRIEF DESCRIPTION OF THE DRAWINGS

The invention will be described in conjunction with the following drawings in which like reference numerals designate like elements and wherein:

FIG. 6 is a cross-sectional view of a stationary part;

DETAILED DESCRIPTION OF PREFERRED EMBODIMENTS

Figure 1:
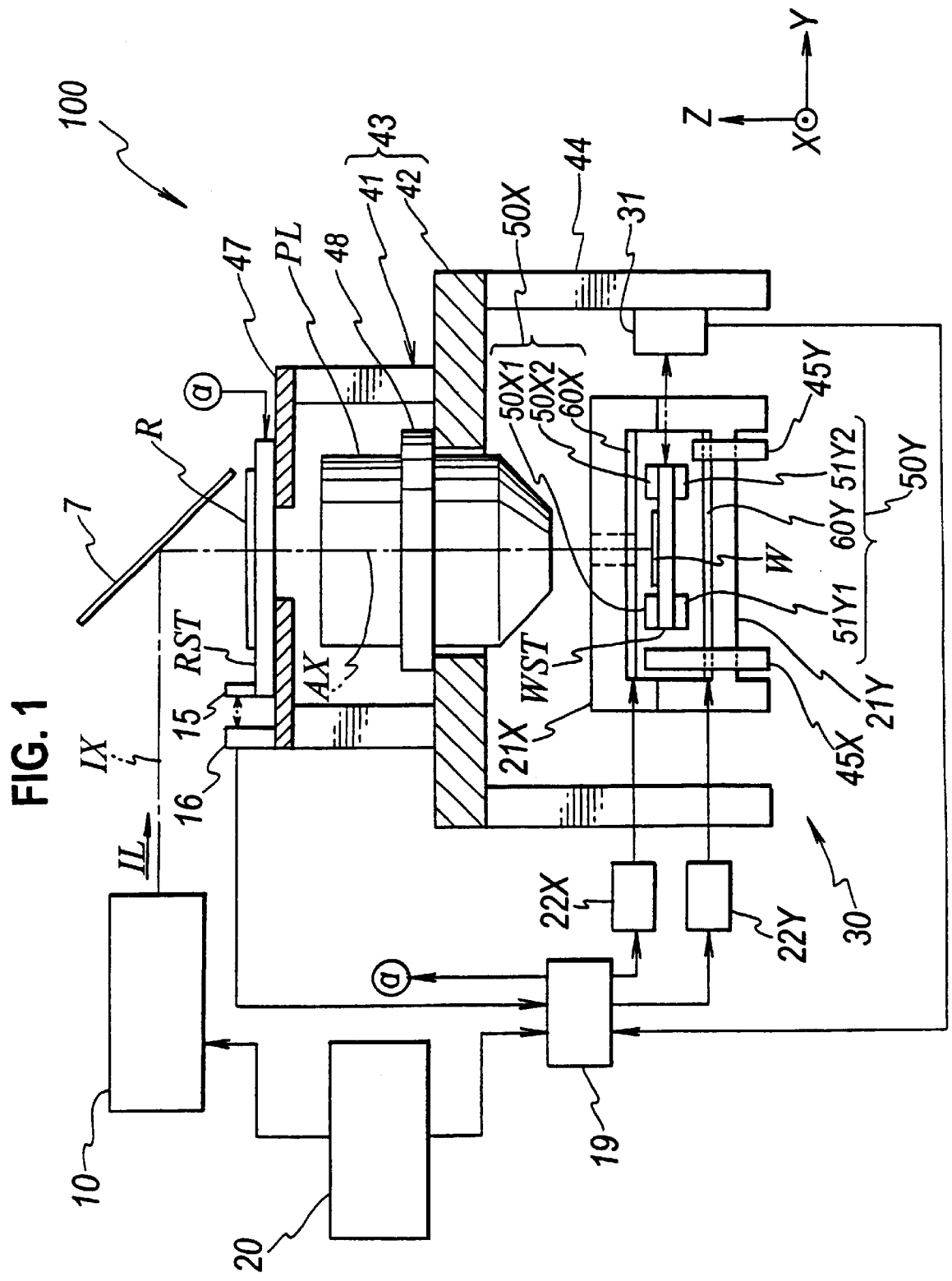
FIG. 1 is a schematic diagram of an exposure device of a first embodiment of this invention.

FIG. 1 shows a schematic structure of an exposure device 100 of a first embodiment. This exposure device 100 is a step-and-scan type of scanning exposure device, that is, a so-called scanning stepper. As discussed later, a projection optical system PL is disposed in this exposure device. The following explanation is given by defining the Z-axis as the optical axis (AX) of the projection optical system PL, the Y-axis as the direction in which a reticle R and a wafer W move relative to each other perpendicular to the Z-axis direction, and the X-axis as the direction that is perpendicular to the Z- and Y-axes.

Exposure device 100 has an exposure device main body including an illumination optical system 10, a reticle stage RST that holds a reticle R as a mask, the projection optical system PL as an optical system, a main body column 43 that holds the projection optical system, and a stage device 30 that drives a wafer stage WST, and controllers for these components. The wafer stage WST is a stage that holds (and is capable of driving) a wafer W as a substrate (or an object) in six degrees-of-freedom directions such as X, Y, Z, $\theta_X$, $\theta_Y$, and $\theta_Z$, or the like.

In the exposure device main body, the internal temperature and humidity are adjusted with high accuracy. Additionally, the exposure device main body is stored in an environmental chamber, that is not depicted, and protected with high accuracy, and the chamber is filled with nitrogen $N_2$. As an exposure light source of the exposure device, an ArF excimer laser light source, that is not depicted, is used, that generates pulsed ultraviolet light with a wavelength of 193 nm. This ArF excimer laser light source, a main controller 20, and a stage controlling system 19 are disposed in a service room with a lower degree of cleanliness, compared to a super-clean room where the exposure device 100 is disposed. The excimer laser light source is connected to the illumination optical system 10 through a beam matching unit, that is not depicted.

The illumination optical system 10 includes an illumination equalizing optical system having a fly eye lens or the like, a relay lens, a variable ND (neutral density) filter, a reticle blind, a dichroic mirror, and/or the like (none of which are depicted). This type of structure of the illumination optical system is disclosed in, for example, Japanese Patent Laid-Open Publication No. 10-112433. After illumination light IL that was output from the illumination optical system 10 is reflected by a light bending mirror 7, it illuminates an illumination area part IAR (see FIG. 14) in a slit state (e.g., rectangular or circular arc state) that is governed by a reticle blind on a reticle R on which a circuit pattern or the like is drawn, at a virtually uniform illuminance.

The reticle R is fixed by, for example, electrostatic attraction on the reticle stage RST. In order to control the position of the reticle R, the reticle stage RST can be minutely (finely) driven by a reticle stage driving part, not depicted, having a two-dimensional actuator that is structured by a magnetic floating type of linear motor using a reaction force or a Lorentz force on the reticle base 47. The reticle stage driving part drives the reticle stage RST within the X-Y plane that is perpendicular to the optical axis IX (identical to the optical axis AX of the projection optical system PL discussed later) of the illumination optical system 10. Additionally, it is also possible to drive the reticle stage RST at a designated scanning speed in a specified scanning direction (the Y direction here). Furthermore, in this embodiment, because the magnetic floating type of two-dimensional linear actuator includes a Z-driving coil in addition to an X-driving coil and a Y-driving coil, it is possible to minutely drive in the Z direction. Additionally, the reticle base 47 forms a top plate part of a table 41 that forms a main body column 43, discussed later.

The stationary part of the two-dimensional linear actuator that was discussed earlier is supported by a reaction frame, not depicted, disposed independently from the reticle base 47. Because of this, when the reticle stage RST is driven, the reaction force that acts on the stationary part of the two-dimensional linear actuator is transmitted to the ground (floor) by the reaction frame. Thus, the reaction force is not transmitted to the reticle base 47. The transmission of such reaction force to the ground (floor) through the reaction frame is disclosed in U.S. patent application Ser. No. 08/416,558, the disclosure of which is incorporated herein by reference.

The position of the stage moving face of the reticle stage RST is constantly detected at, for example, approximately 0.5–1 nm resolution through a moving mirror 15 by a reticle laser interferometer (hereafter referred to as "reticle interferometer") 16, which functions as a position detection device that is fixed to the reticle base 47. The position information of the reticle stage RST from the reticle interferometer 16 is sent to the stage controlling system 19. Based upon the position information of the reticle stage RST, the stage controlling system 19 drives the reticle stage RST through a reticle stage driving part (omitted in the drawings). In actuality, a moving mirror with a reflection face that is disposed orthogonally to the scanning direction (Y-axis direction) and a moving mirror with a reflection face that is disposed orthogonally to the non-scanning direction (X-axis direction) are arranged on the reticle stage RST, and one reticle interferometer 16 is disposed in the scanning direction and two reticle interferometers 16 are disposed in the non-scanning direction, but they are shown as a single representative moving mirror 15 and a single representative reticle interferometer 16 in FIG. 1.

The projection optical system PL is disposed below the reticle stage RST in FIG. 1, and the direction of the optical axis AX (identical to the optical axis IX of the illumination optical system 10) is the Z-axis direction. A dioptric system is used that comprises a plurality of lens elements disposed at a specified distance along the optical axis AX direction in a double-telecentric optical arrangement. This projection optical system PL is a reduction optical system with a specified projection magnification, for example, ⅕ (or ¼). Because of this, when the illumination area IAR of the reticle R is illuminated by the illumination light IL from the illumination optical system 10, by the illumination light IL that has passed through the reticle R, via the projection optical system PL, a reduced image (part-inverted image) of the circuit pattern of the reticle R within the illumination area IAR is formed in the exposure area IA (see FIG. 14) that is conjugate to the illumination area IAR on a wafer W whose surface is coated by photoresist.

The main body column 43 includes a lens barrel panel 42 that is horizontally supported by a vibration control table 44 that is fixed to the floor, and a table 41 that is fixed to the top face of the lens barrel panel 42. An opening is formed in the center part of the lens barrel panel 42. The opening is circular from the plan view, and the projection optical system PL is inserted into the opening from the upper direction. A flange 48 is disposed in the center part of the height direction of the projection optical system PL, and the projection optical system PL is supported by the lens barrel panel 42 from the lower direction through the flange 48.

The table 41 has four legs disposed in the vertical direction so as to surround the projection optical system PL on the top face of the lens barrel panel 42, and a top plate, that is, the reticle base 47, that mutually connects these four legs.

The stage device 30 has a wafer stage WST that loads a wafer W, a base 21X disposed above the wafer stage WST, a base 21Y disposed below the wafer stage WST, a driving device 50X, which functions as a first driving device that drives the wafer WST in the X and Z directions, and a driving device 50Y, which functions as a second driving device that drives the wafer stage WST in the Y and Z directions.

A wafer holder (or chuck), not depicted, is provided on the wafer stage WST. The wafer W is held by this wafer holder due to electrostatic attraction, for example.

Furthermore, the side face of the wafer stage WST is mirror processed so that a laser beam from the wafer laser interferometer (hereafter referred to as "wafer interferometer") 31, which is a position detection device, can be reflected therefrom. The position of the wafer W in the X-Y plane is constantly detected at, for example, approximately 0.5–1 nm resolution by the wafer interferometer 31 that is fixed to the vibration control table 44. Here, the position information (or speed information) of the wafer W is sent to the main controller 20 through the stage controlling system 19 from the wafer interferometer 31. In the stage controlling system 19, in response to an instruction from the main controller 20, based upon the position information (or speed information), the driving device 50X is controlled through a current driving device 22X, and the driving device 50Y is controlled through a current driving device 22Y. Additionally, in actuality, one wafer interferometer 31 is disposed in the scanning direction and two wafer interferometers are disposed in the non-scanning direction, but these are shown as a single representative wafer interferometer 31 in FIG. 1.

Although not illustrated, the bases 21X and 21Y are attached to the ground via a vibration isolation system. Alternatively, the bases 21X and 21Y can be suspended from a lower surface of the lens barrel panel 42. In either case, reaction forces generated when the wafer stage WST is driven can cause undesired movement of the bases 21X and 21Y.

Figure 2:
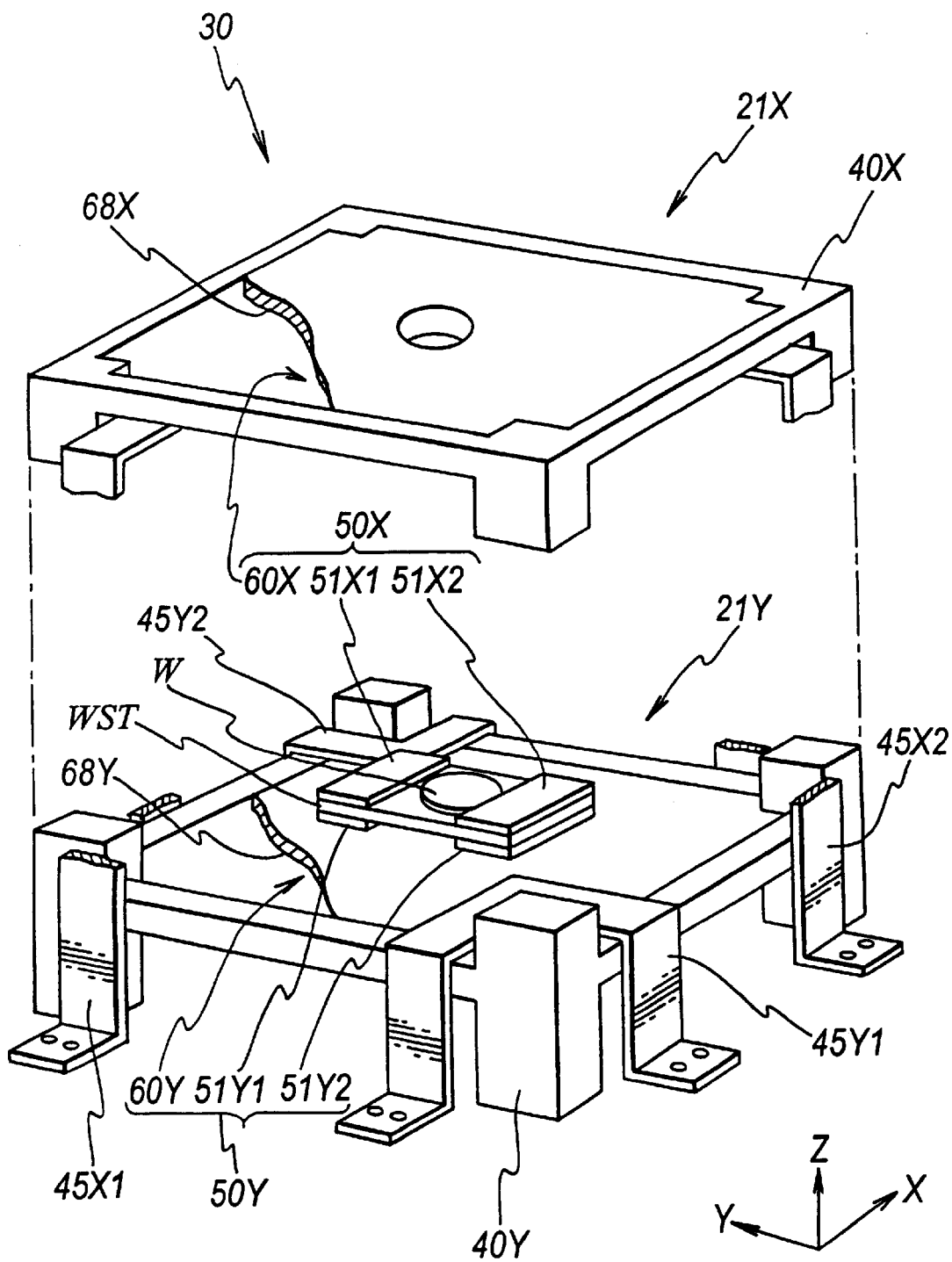
FIG. 2 is a perspective view showing a structure of the vicinity of a stage device of the FIG. 1 device.

Thus, the exposure device 100 of this embodiment has reaction force cancellation magnetic pole units 45X and 45Y. Reaction force cancellation magnetic pole unit 45X generates a magnetic field to apply a force to a stationary part 60X, which functions as a first stationary part of the driving device 50X, to cancel a reaction force that acts on the stationary part 60X. Reaction force cancellation magnetic pole unit 45Y generates a magnetic field to apply a force to a stationary part 60Y, which functions as a second stationary part of the driving device 50Y, to cancel a reaction force that acts on the stationary part 60Y. Here, the reaction force cancellation magnetic pole unit 45X generates a magnetic field to cancel the X component of the reaction force that acts on the stationary part 60X, and the reaction cancellation magnetic pole unit 45Y generates a magnetic field to cancel the Y component of the reaction force that acts on the stationary part 60Y. The structure of the reaction force cancellation magnetic pole units 45X and 45Y will be discussed later. Furthermore, in actuality, as shown in FIG. 2, reaction force cancellation magnetic pole units 45X1 and 45X2 are disposed in two respective corners that have a diagonal relationship among the four corners of the stationary part 60X, but these are shown as a single representative reaction force cancellation magnetic pole unit 45X in FIG. 1. In addition, the reaction force cancellation magnetic pole units 45Y1 and 45Y2 are disposed in the two respective corners that have a diagonal relationship among the four corners of the stationary part 60Y, but these are shown as a single representative reaction force cancellation magnetic pole unit 45Y in FIG. 1.

Also provided on the wafer stage WST is an undepicted reference mark plate on which various reference marks are formed for a base line measurement or the like to measure a distance from a detection center of an undepicted off-axis-type alignment detection system to the optical axis of the projection optical system PL.

Also disposed in the exposure device 100 of FIG. 1 is a multi-point focus position detection system, which is a focus detection system of the diagonal incident light type. The multi-point focus position detection system detects the position in the Z direction (optical axis AX direction) of the part of the surface of the wafer W within the exposure area IA and the area in the vicinity of that part. This multi-point focus position detection system includes an irradiation optical system and a light receiving optical system, not depicted. The detailed structure of this multi-point focus position detection system is disclosed in, for example, Japanese Laid-Open Patent Publication No. 6-283403 and in U.S. Pat. No. 5,448,332, which corresponds to that Japanese publication. The disclosures of the Japanese Laid-Open Patent Publication and of the U.S. patent are incorporated herein by reference.

The driving device 50X includes a stationary part 60X that is embedded in the bottom face of the base 21X and movable elements 51X1 and 51X2, which function as first movable elements, that are fixed to the top surface (the face where the wafer W is loaded) of the wafer stage WST. Additionally, the driving device 50Y includes a stationary part 60Y that is embedded in the top face of the base 21Y and movable elements 51Y1 and 51Y2, which function as second movable elements, that are fixed to the bottom face (the rear (opposite) face relative to the face where the wafer W is loaded) of the wafer stage WST.

Next, the structure of the driving devices 50X and 50Y and the structure of the reaction force canceling mechanism to cancel the reaction force that acts on the stationary parts 60X and 60Y are explained in detail, including the surrounding members.

Figure 3A:
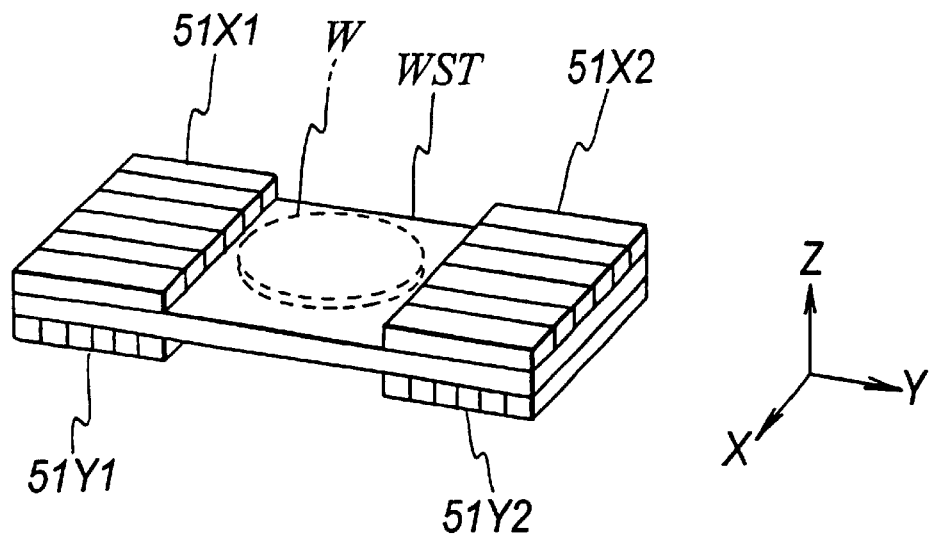
FIGS. 3A and 3B explain an arrangement of a movable element (driving magnetic pole unit) in a wafer stage.
Figure 3B:
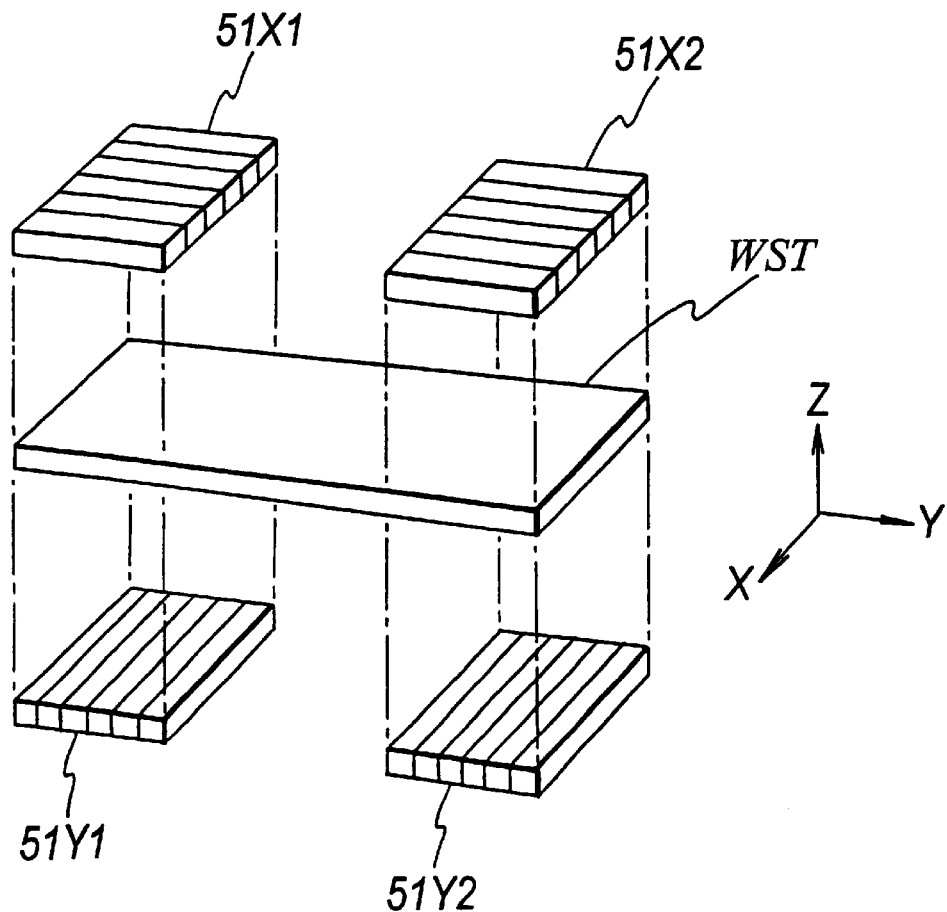

As shown in FIGS. 3A and 3B, the movable elements 51X1 and 51X2 of the driving device 50X are fixed, e.g., by adhesive on the wafer loading face of the wafer stage WST on two respective first areas that are areas located on either side of the area where the wafer W is loaded. Meanwhile, the movable elements 51Y1 and 51Y2 of the driving device 50Y are fixed, e.g., by adhesive to two respective second areas, which are areas corresponding to the first areas, on the bottom face of the wafer stage WST as shown in FIGS. 3A and 3B.

Figure 4A:
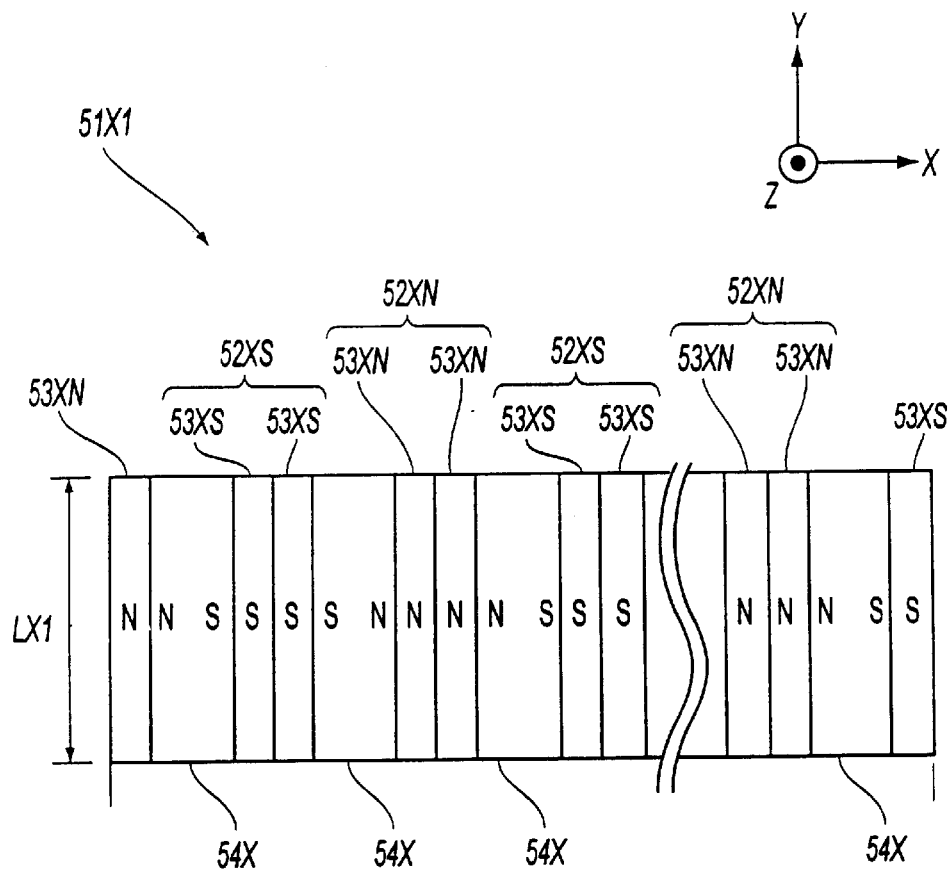
FIGS. 4A and 4B show a structure of an X-axis direction driving magnetic pole unit.
Figure 4B:
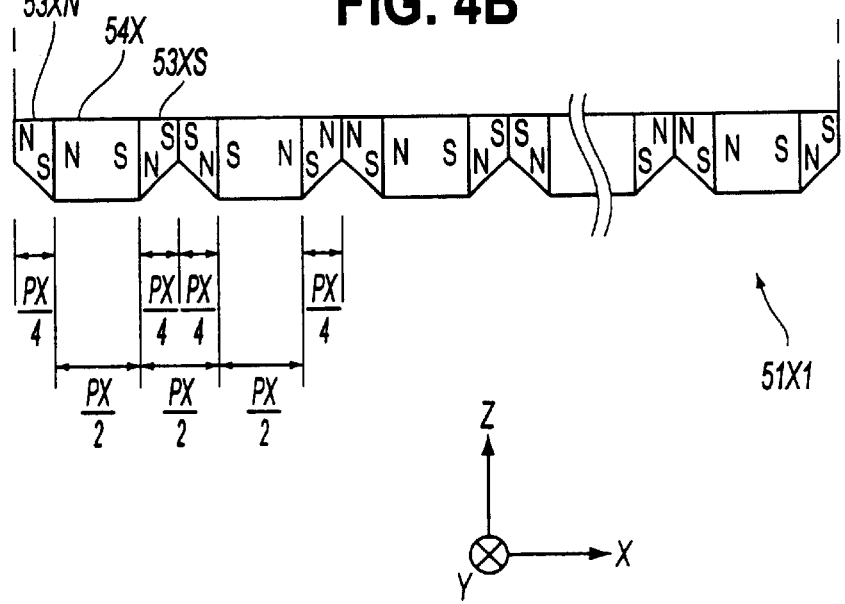

As shown in FIGS. 4A and 4B, the movable element 51X1 is a magnetic pole unit formed by an array of permanent magnets 53XN, 53XS and 54X that extends in the X-axis direction. In the following explanation, this movable element is called a driving magnetic pole unit for convenience.

The array that forms each driving magnetic pole unit 51X1 and 51X2 is also known as a wedge magnet array. The details of such wedge magnet arrays are disclosed, for example, in U.S. patent application Ser. No. 09/219,545, the disclosure of which is incorporated herein by reference in its entirety. Each wedge magnet array includes transverse magnets 54X and wedge magnets 53XN and 53XS. The transverse magnets 54X have magnetic polarities aligned parallel to the X-direction in FIGS. 4A and 4B. The wedge magnets 53XN and 53XS have magnetic polarities aligned at angles oblique relative to both the X-direction and the Z-direction. Preferably, the wedge magnets 53XN and 53XS are polarized at a 45° angle relative to the X- and Z-directions.

As can be appreciated from FIGS. 4A and 4B, the transverse magnets 54X are spaced at regular intervals along the X-axis and are oriented such that consecutive transverse magnets have alternating reversed magnetic polarities. The wedge magnets are disposed such that two wedge magnets 53XN, 53XS adjacently flank two sides respectively of each transverse magnet 54X along the X-direction. Thus, two wedge magnets, both of which are of the type 53XN or 53XS, are located between consecutive transverse magnets 54X. Two adjacent wedge magnets 53XN define a permanent magnet group 52XN, whereas two adjacent wedge magnets 53XS define a permanent magnet group 52XS.

In a preferred embodiment, all of the magnets 53XS, 53XN and 54X have a length LX1 in the Y-axis direction as shown in FIG. 4A. The transverse magnets 54X have a width in the X-axis direction of PX/2, while the wedge magnets 53XN and 53XS have a width in the X-axis direction preferably of PX/4. The X-Z cross-sectional shape of the wedge magnets 53XN and 53XS is trapezoidal, whereas the transverse magnets 54X have a rectangular X-Z cross-sectional shape.

Individual wedge magnets 53XN and 53XS are disposed at opposite ends of the magnet array in the X-axis direction. The face of the wedge magnet 53XN or of the wedge magnet 53XS facing the stationary part 60X at either end is substantially an N pole face or an S pole face. Alternatively, the wedge magnets at each end of the array could be of the same type (i.e., both 53XN or both 53XS).

Thus, the driving magnetic pole unit 51X1 is structured by combining permanent magnets whose magnetic polarization direction is not the Z-axis direction, and yoke members are not used. By doing this, the weight of the driving magnetic pole unit 51X1 as a movable element is advantageously reduced.

The driving magnetic pole unit 51X2 is structured in the same manner as the driving magnetic pole unit 51X1.

Figure 5A:
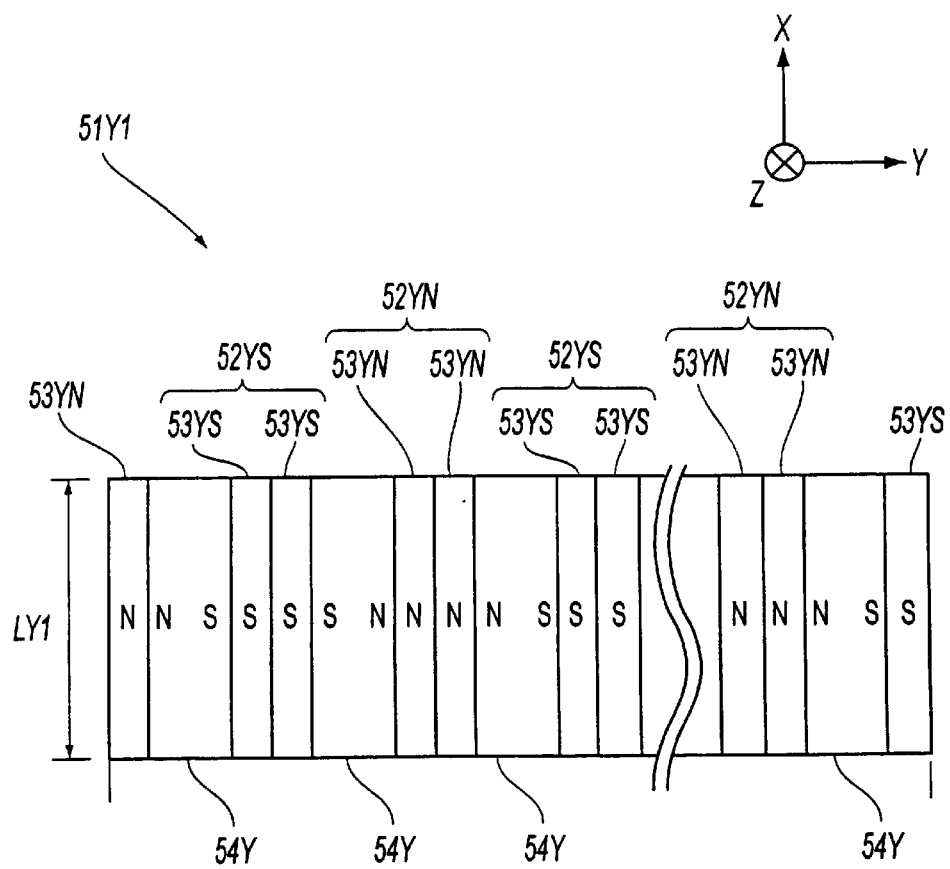
FIGS. 5A and 5B show a structure of a Y-axis direction driving magnetic pole unit.
Figure 5B:
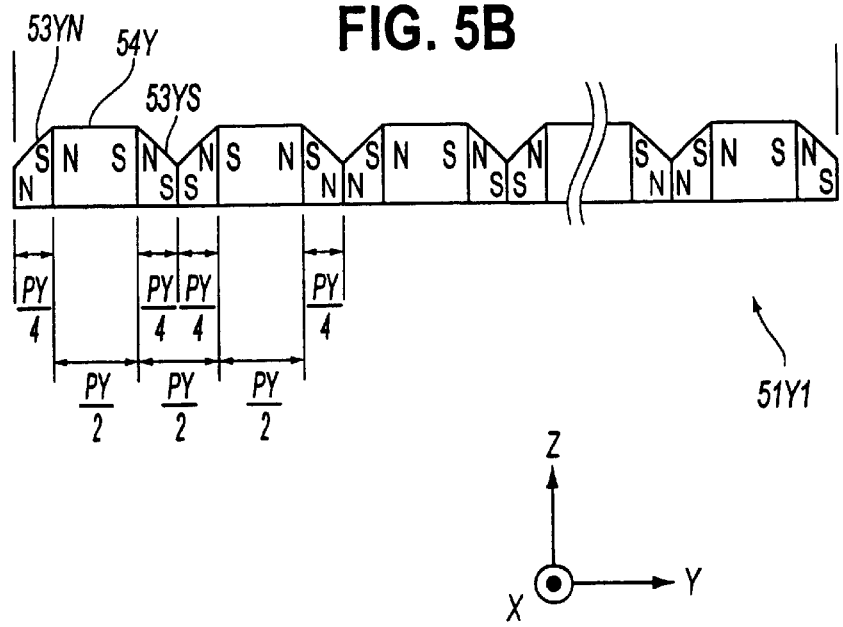

As shown in FIGS. 5A and 5B, the driving magnetic pole unit 51Y1 is structured as a magnetic pole unit where permanent wedge magnets 53YN, 53YS, and permanent transverse magnets 54Y are provided in an array extending in the Y-axis direction. Comparing FIGS. 5A and 5B with FIGS. 4A and 4B, the driving magnetic pole unit 51Y1 is structured in the same manner as the driving magnetic pole unit 51X1, except that the length of the magnets in the X-axis direction is LY1, while the wedge magnets preferably have a width of PY/4 and the transverse magnets preferably have a width of PY/2.

The driving magnetic pole unit 51Y2 is structured in the same manner as the driving magnetic pole unit 51Y1.

The schematic structure of the base 21Y including the stationary part 60Y and the base 21X including the stationary part 60X is shown in FIG. 6, which is a partially fragmented schematic sectional view. The base 21X has a container member 40X with a bottom, made from a non-magnetic material, where two steps are formed in the side walls of the inside part, and where the top face is open from the plan view and is a virtually square shape. The base 21X also has a flat magnetic member 62X, made from a magnetic material, disposed virtually parallel to and at a specified distance from the bottom face of the container member 40X, and a flat member 68X, made from a non-magnetic material such as ceramics, engaging from the upper direction with the upper step part in a state where the upper opening part of the container member 40X is closed. In part of the internal bottom face of the container member 40X, a cylindrical protruding part that has virtually the same height as the upper step part is integrally formed. Corresponding to this cylindrical protruding part, a circular opening with a larger diameter than the diameter of the protruding part is formed in the magnetic member 62X. Furthermore, in the flat member 68X, a circular opening is formed with the same diameter as the inside surface of the protruding part. In addition, the container member 40X has four legs extending vertically downward.

Figure 7:
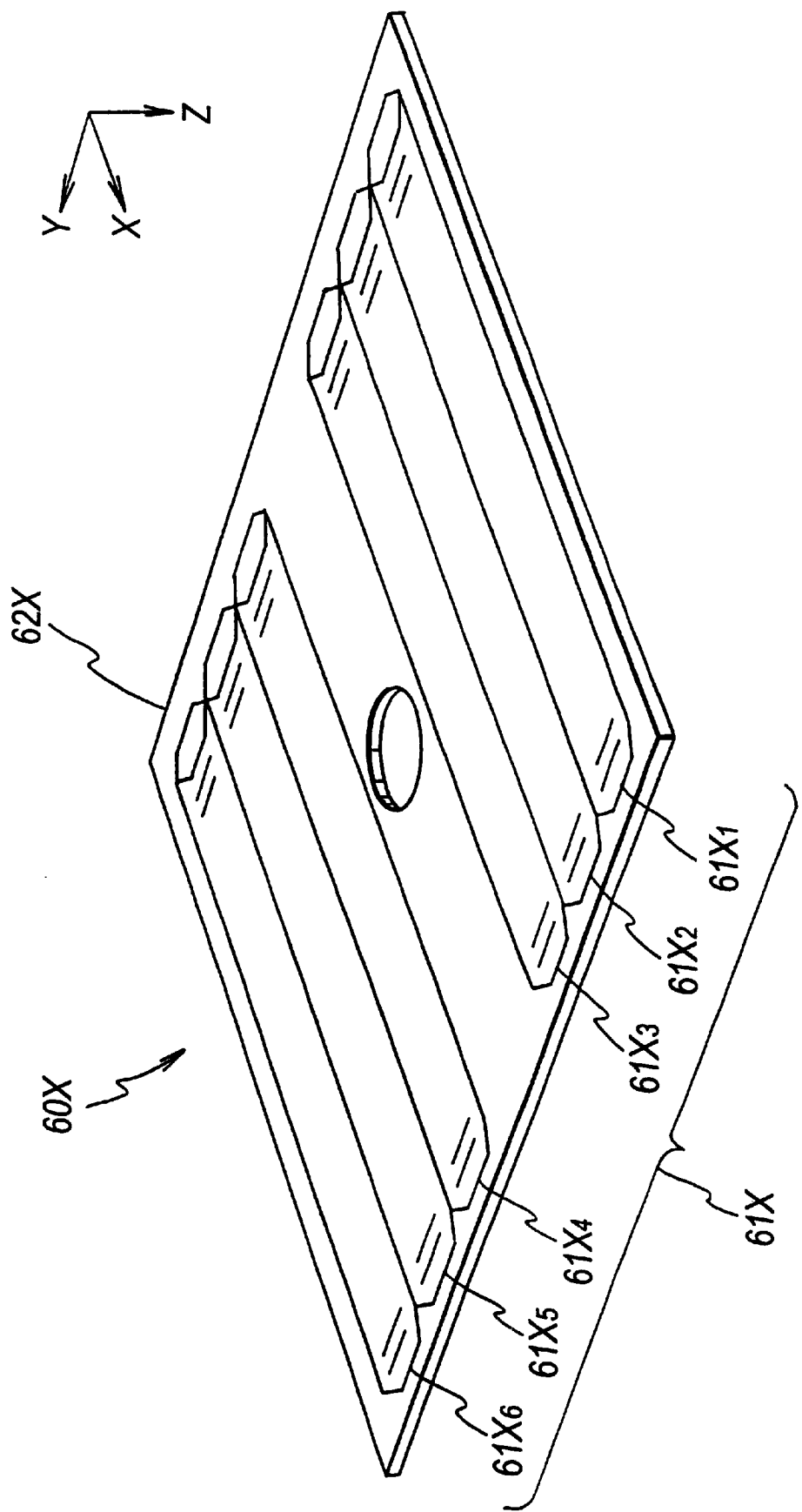
FIGS. 7 is a perspective view of a stationary part for driving in the X-axis direction.

On the lower face of the magnetic member 62X, coil rows $61X_1$–$61X_6$ are disposed. As shown in FIG. 7, the coil rows $61X_1$–$61X_6$ are arrayed in the Y-axis direction and are fixed to the bottom face of the magnetic member 62X by adhesive or the like. Furthermore, FIG. 7 is upside down for drawing convenience. The coil rows $61X_1$–$61X_6$ define a flat coil group 61X as an armature unit, and the stationary part 60X of the driving device 50X is structured by the flat coil group 61X and the magnetic body member 62X.

Figure 8A:
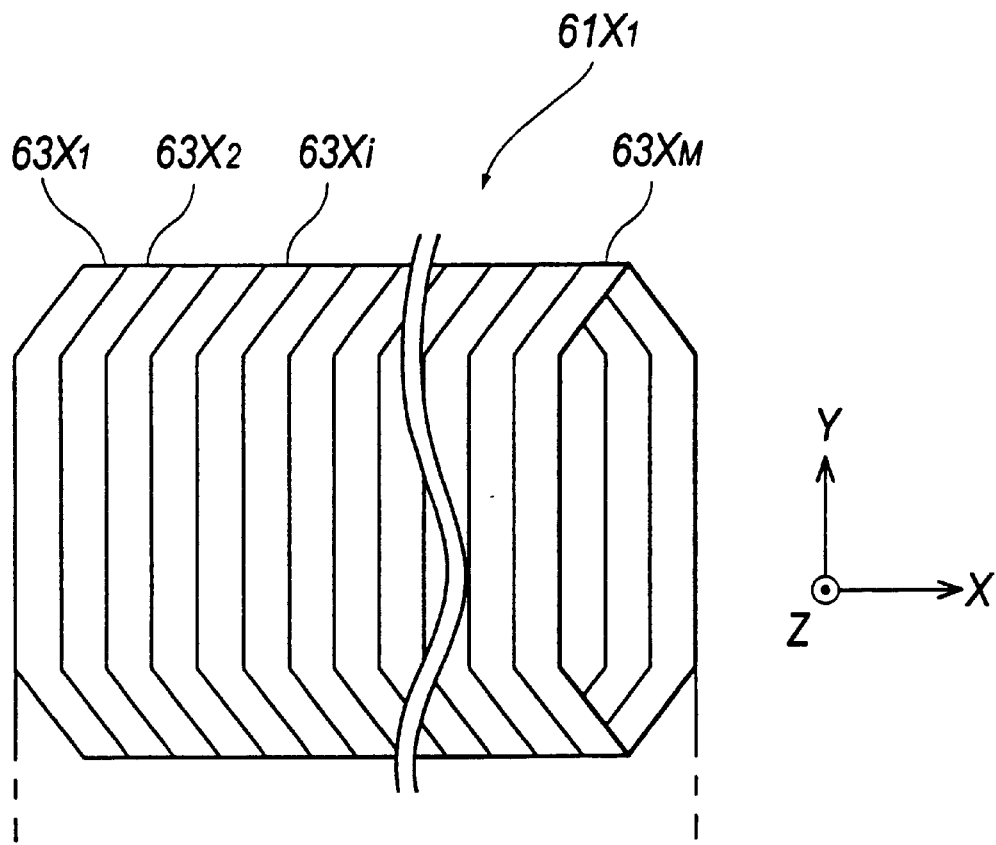
FIGS. 8A and 8B show a structure of coil rows that are structural elements of the FIG. 7 stationary part for driving in the X-axis direction.
Figure 8B:
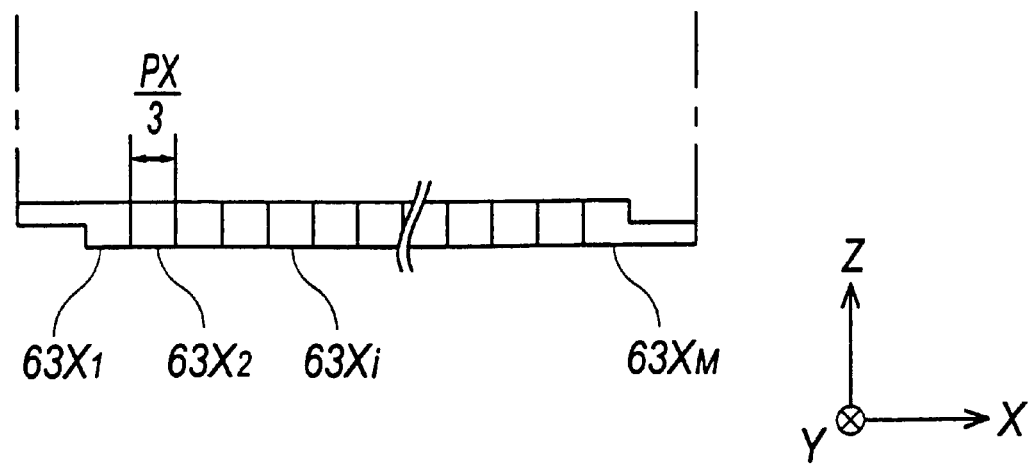

Each coil row $61X_1$–$61X_6$ is structured in the same manner. As shown representatively by the coil row $61X_1$ in FIGS. 8A and 8B, M flat armature coils $63X_1$–$63X_M$ are arrayed in the X-axis direction. Furthermore, FIG. 8A shows the appearance of the coil row $61X_1$ seen from vertically above, and FIG. 8B shows the appearance of the coil row $61X_1$ seen in the +Y direction.

Figure 9C:
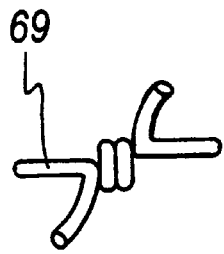
FIGS. 9A–9C show a structure of armature coils that are structural elements of the coil rows shown in FIGS. 8A–8B.
Figure 9A:
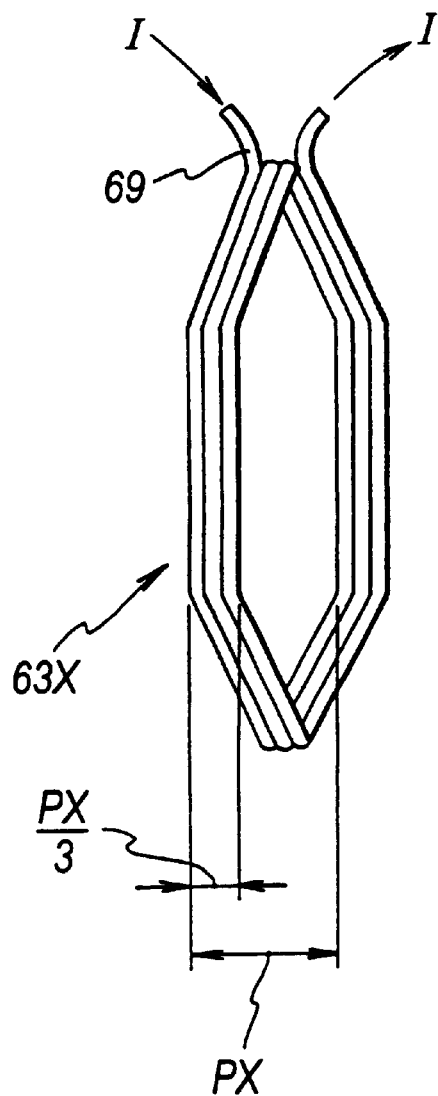
Figure 9B:
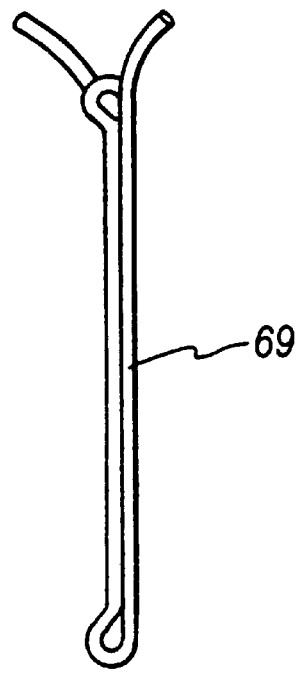

Each armature coil $63X_i$ (i=1–M) (hereafter, an arbitrary one is referred to as "armature coil 63X") is structured in the same manner, and a schematic structure is shown in FIGS. 9A–9C. Here, when the armature coil 63X is seen from vertically above, this is called a front view. The front view is shown in FIG. 9A, a right perspective view is shown in FIG. 9B, and a plan view is shown in FIG. 9C. Furthermore, FIGS. 9A–9C show the case when the number of turns is three for drawing convenience, but, usually, because the wire is sufficiently thin compared to the width PX/3, the number of the turns could be larger than three.

The armature coil 63X is structured as a flat coil with a hexagonal shape and a specified width in the front view, as clarified in FIGS. 9A–9C together. The wire 69 forms hexagons, the ends of which in the Y-axis direction are vertices, and has the width of PX/3 for each piece. The maximum width in the X-axis direction of the empty part (the empty center of the hexagon) is made to be substantially 2PX/3. Furthermore, as shown in FIG. 9A, the armature coil 63X has a virtually symmetrical shape.

After the coil wire 69 is wound and coils are manufactured that have the shape of hexagons, the flat coil 63X that was described above is manufactured by pressing the coil to be flat.

Figure 10A:
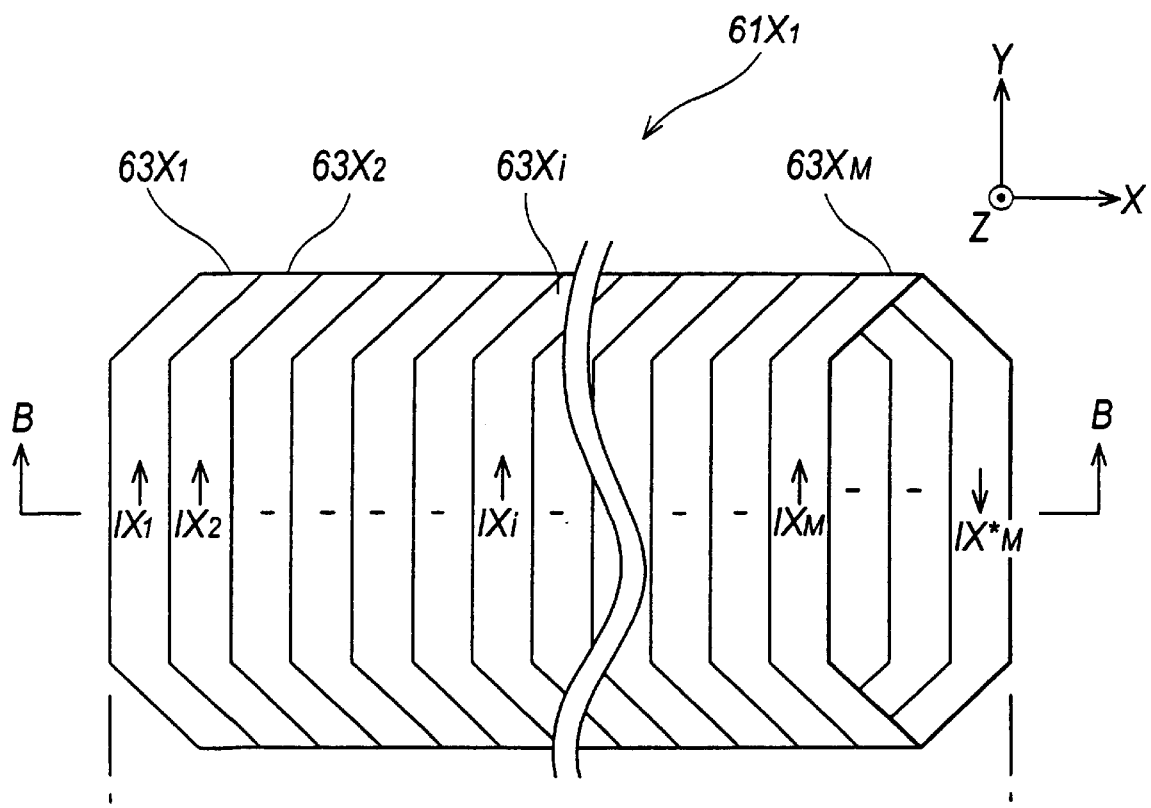
FIGS. 10A–10B explain current distribution in the coil rows shown in FIGS. 8A–8B.
Figure 10B:
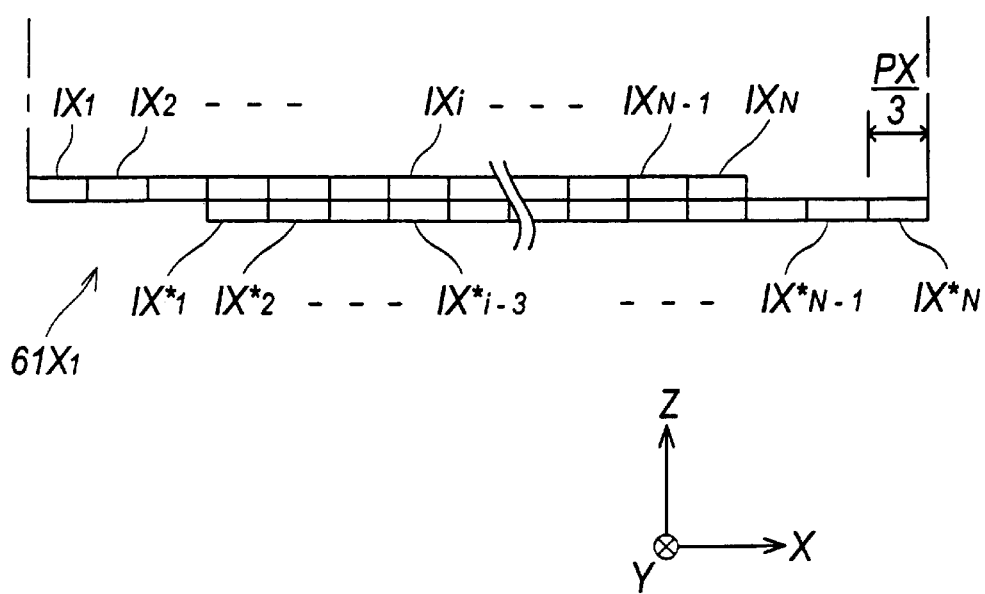

FIGS. 10A and 10B show the space current distribution when current is supplied to the respective armature coils $63X_1$–$63X_M$ of the coil row $61X_1$ that is thus structured. Here, FIG. 10A shows a space current distribution seen from the upper vertical direction, and FIG. 10B shows the space current distribution in the B—B cross section of the coil row $61X_1$ in FIG. 10A. Furthermore, FIG. 10B shows the current supplied to each element by a leader line, and the description of element numbers is omitted.

As shown in FIGS. 10A and 10B, if a current $IX_i$ is supplied in the +Y direction in the vicinity of the left side of the respective armature coil $63X_i$ (i=1–M), in the case of the armature coil $63X_i$, the current $IX_i^*$ is supplied in the vicinity of the right side in the −Y direction. If this state is seen in a cross-section parallel to the X-Z plane, as shown in FIG. 10B, the vicinity of the left side of the armature coil $63X_j$ (j=4–M) overlaps the vicinity of the right side of the armature coil $63X_{j-3}$ in the Z-axis direction (e.g., the left side of coil $63X_4$ overlaps the right side of coil $63X_1$), so a current $IX_j$ and a current $IX_{j-3}^*$ are supplied in the same X position in the center of the coil row $61X_1$. Therefore, because the respective armature coil $63X_i$ is flat, if the Y-component of the current $IX_i$ is shown by $IX_i$, it can be seen that the current of the Y-component ($IX_j$–$IX_{j-3}$) is supplied in the center, in the Y-axis direction, of the coil row $61X_1$.

In order to prevent temperature increase of the surrounding members and the armature coils $63X_1$–$63X_M$ along with the heat of the armature coils $63X_1$–$63X_M$ due to the supply of current to the armature coils $63X_1$–$63X_M$ and fluctuation of the surrounding atmosphere of the armature coils $63X_1$–$63X_M$, in this embodiment, cooling of the armature coils $63X_1$–$63X_M$ is performed. This cooling is performed by making a closed space surrounded by the magnetic body member 62X, the container member 40X, and the flat member 68X shown in FIG. 6 to be a passage for cooling liquid (coolant) to cool the armature coils $63X_1$–$63X_M$ of the flat coil group 61X. That is, on one side of the closed space, an inflowing passage, not depicted, is disposed, and an outflow passage (discharge port), not depicted, is disposed on the other side. A cooling liquid (for example, water or Fluorinert FC-77 (made by 3M Company, Minneapolis, Minn.)) from a cooling controlling machine, not depicted, is sent to the closed space through an inflow passage. When passing through the interior of the closed space, heat exchange is performed with the flat coil group 61X, and after absorbing the heat generated in the flat coil group 61X, the hot cooling liquid is discharged through the outflow passage.

As shown in FIG. 6, the base 21Y has a container member 40Y made of a non-magnetic body material with four legs extending vertically upward and vertically downward, and is rectangular in plan view and has a two-step concave part formed therein, the top face of which is open. The base 21Y also has a flat non-magnetic body member 62Y made of a non-magnetic body material, such as ceramics, disposed in the center in the height direction that engages the lower step part of the container member 40Y from above, and a flat member 68Y made of a non-magnetic body material, such as ceramics, that is integrally fixed in a state such that the top opening of the container member 40Y is closed.

Figure 11:
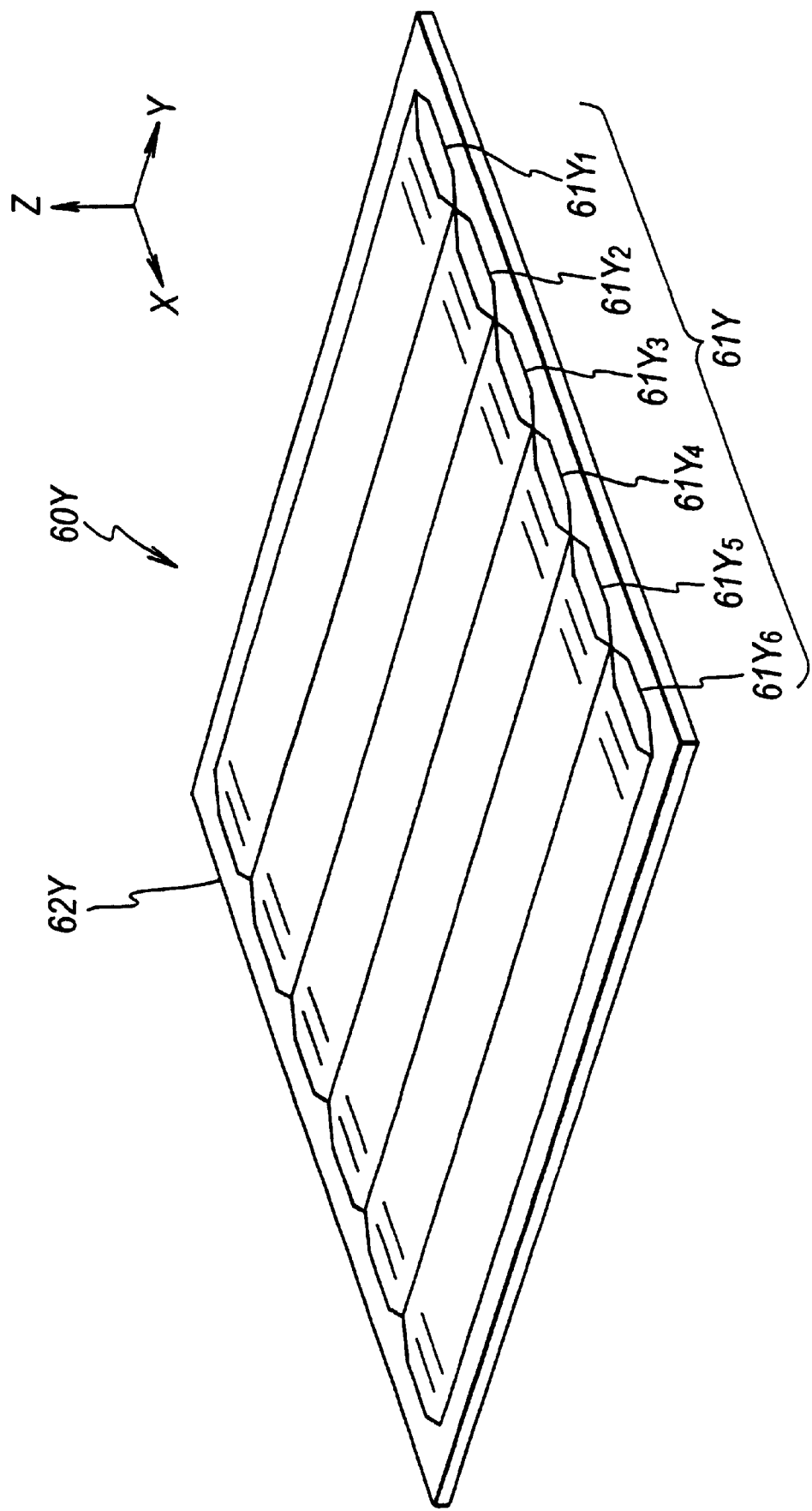
FIG. 11 is a perspective view of a stationary part for driving in the Y-axis direction.

On the top face of the non-magnetic body member 62Y, a flat coil group 61Y is disposed. As shown in FIG. 11, the flat coil group 61Y includes the coil rows $61Y_1$–$61Y_6$ arrayed in the X-axis direction and is fixed to the top face of the non-magnetic body member 62Y by adhesive. By these coil rows $61Y_1$–$61Y_6$, the flat coil group 61Y is structured as an armature unit. The stationary part 60Y of the driving device 50Y is structured by the flat coil group 61Y and the non-magnetic body member 62Y.

In the respective coil rows $61Y_1$–$61Y_6$, N flat armature coils are structured in the same manner as the armature coil 63X (hereafter referred to as "armature coils $63Y_1$–$63Y_N$"). An arbitrary one of the armature coils $63Y_1$–$63Y_N$ is called "armature coil 63Y." The N flat armature coils are arrayed in the Y-axis direction. Furthermore, the armature coil 63Y is different from the armature coil 63X because the width of the current path is PY/3 and the width of the empty center part of the armature coils $63Y_1$–$63Y_N$ in the alignment direction (Y-axis direction) is 2PY/3.

In the same manner as the armature coil 63X, after the coil wire 69 is wound and a coil forming the sides of a hexagon is manufactured, the armature coil 63Y is pressed flat.

Furthermore, the current supply to the armature coils $63Y_1$–$63Y_N$ causes temperature increase of the surrounding members and in the armature coils $63Y_1$–$63Y_N$ due to the heat of the armature coils $63Y_1$–$63Y_N$ and the fluctuation of the surrounding atmosphere of the armature coils $63Y_1$–$63Y_N$. Thus, in order to prevent problems, cooling of the armature coils $63Y_1$–$63Y_N$ is performed in this embodiment. In the same manner as the cooling of the armature coils $63X_1$–$63X_M$, cooling is performed by making the closed space surrounded by the non-magnetic body member 62Y, the container member 40Y, and the flat member 68Y shown in FIG. 6 to be a passage for cooling liquid (coolant) to cool the armature coils $63Y_1$–$63Y_N$ of the flat coil group 61Y.

Figure 12A:
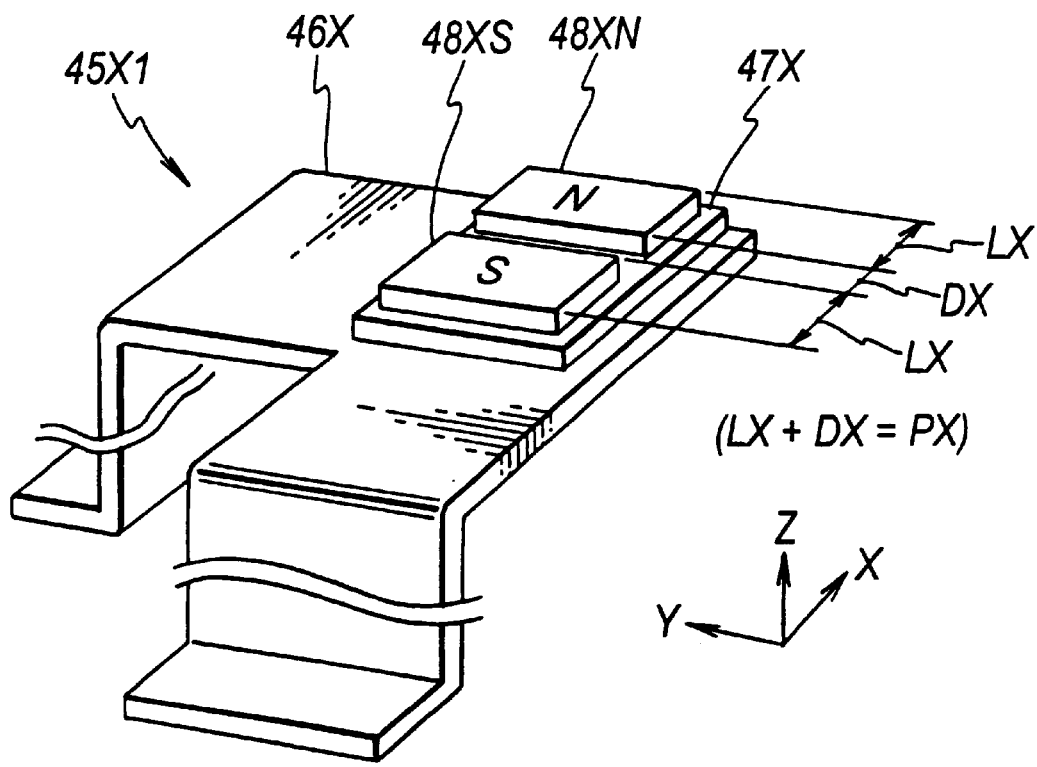
FIGS. 12A and 12B show a structure of a reaction cancellation magnetic pole unit for canceling reaction forces in the X-axis direction.

As shown in FIG. 12A, the reaction cancellation magnetic pole unit 45X1 includes a support member 46X, a flat magnetic body member 47X, and two permanent magnets 48XN and 48XS.

The support member 46X includes a flat L-shaped part virtually parallel to the flat member 68X and is disposed below the container member 40X, a first pillar extending vertically downward from one end of the flat L-shaped part, a second pillar extending vertically downward from another end of the flat L-shaped part, a first fixed part disposed at the lower end of the first pillar, and a second fixed part disposed at the lower end of the second pillar. Furthermore, the first and the second fixed parts are independently fixed to a floor or the like on which the entire device is supported. Because of this, the reaction cancellation magnetic pole unit 45X1 is mechanically independent from the other members that form the exposure device 100, such as the stationary part 60X.

The magnetic body member 47X has a rectangular shape in plan view and is fixed, e.g., by adhesive to the face of the flat L-shaped support member 46X facing toward the container member 40X, that is, the corners of the top face.

The permanent magnets 48XN and 48XS have a rectangular shape, respectively, from the plan view, and the width in the X-axis direction is LX. The permanent magnets 48XN and 48XS are fixed by adhesive or the like to the face of the magnetic body member 47X facing toward the container member 40X such that the permanent magnets 48XN and 48XS are aligned in the X-axis direction, and spaced at a distance DX. The relationship between the width LX, the distance DX and the width (PX/3) of the current path of the armature coil 63X is established as follows:

$$LX+DX=PX \qquad (1)$$

Figure 12B:
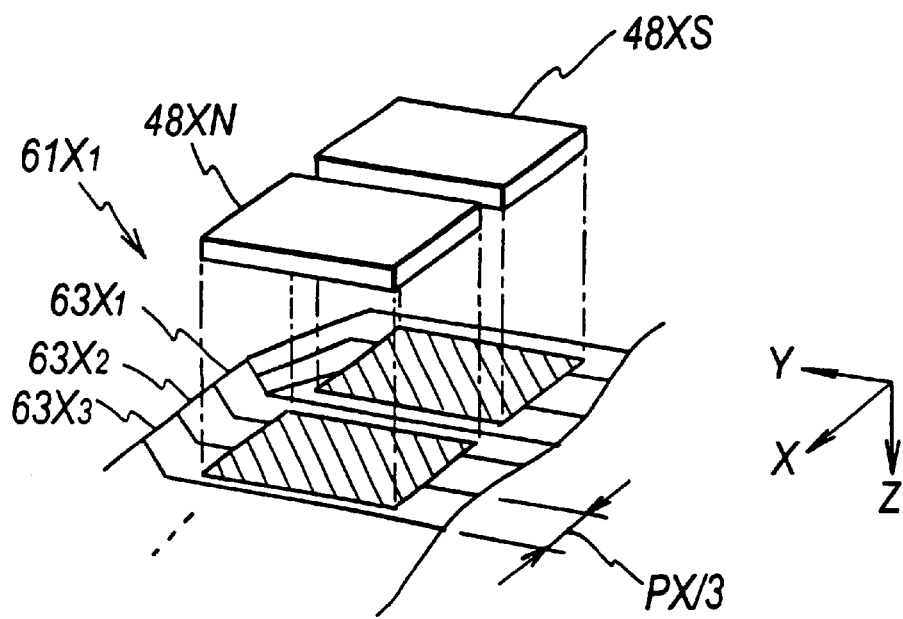

Furthermore, the face of the permanent magnet 48XN facing toward the container member 40X is an N pole face, and the face of the permanent magnet 48XS facing toward the container member 40X is an S pole face. As shown in FIG. 12B, the permanent magnets 48XN and 48XS face the current paths parallel to the Y-axis of the armature coils $63X_1$, $63X_2$, and $63X_3$ of the coil row $61X_1$. Furthermore, the permanent magnet 48XN faces the current paths in which current is supplied in the +Y direction of the respective armature coils $63X_1$, $63X_2$, and $63X_3$, while the permanent magnet 48XS faces the current paths in which current is supplied in the −Y direction of the respective armature coils $63X_1$, $63X_2$, and $63X_3$.

In addition, the reaction cancellation magnetic pole unit 45X2 is structured in the same manner as the reaction cancellation magnetic pole unit 45X1.

Figure 13A:
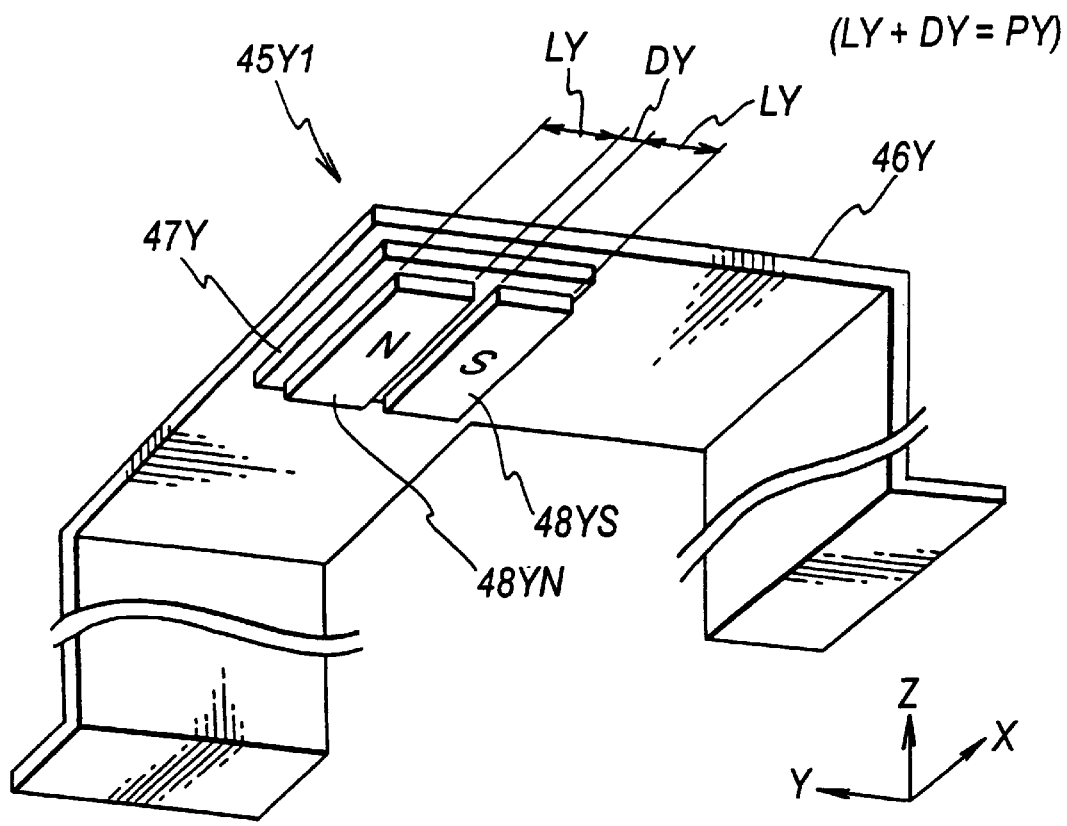
FIGS. 13A and 13B show a structure of a reaction cancellation magnetic pole unit for canceling reaction forces in the Y-axis direction.

As shown in FIG. 13A, the reaction cancellation magnetic pole unit 45Y1 includes a support member 46Y, a flat magnetic body member 47Y, and two permanent magnets 48YN and 48YS.

The support member 46Y includes a flat L-shaped part that is virtually parallel to the flat member 68Y and is disposed above the flat member 68Y, a first pillar extending vertically downward from one end of the flat L-shaped part, a second pillar extending vertically downward from another end of the flat L-shaped part, a first fixed part disposed at the lower end of the first pillar, and a second fixed part disposed at the lower end of the second pillar. Furthermore, the first and second parts are independently fixed to the floor or the like. Because of this, the reaction cancellation magnetic pole unit 45Y1 is mechanically independent from the other members of the exposure device 100, such as the stationary part 60Y.

The magnetic body member 47Y is fixed, e.g., by adhesive to the face of the flat L-shaped part of the support member 46Y facing toward the flat member 68Y, that is, the corner of the lower face.

The permanent magnets 48YN and 48YS have a rectangular shape, respectively, in plan view, and the width in the Y-axis direction is LY. The permanent magnets 48YN and 48YS are fixed by adhesive to the face of the magnetic body member 47Y facing toward the flat member 68Y so that they are spaced at a distance DY in the Y-axis direction. In addition, the relationship between the width LY, the distance DY and the width (PY/3) of the current path of the armature coil 63Y is established as follows:

$$LY+DY=PY \qquad (2)$$

Figure 13B:
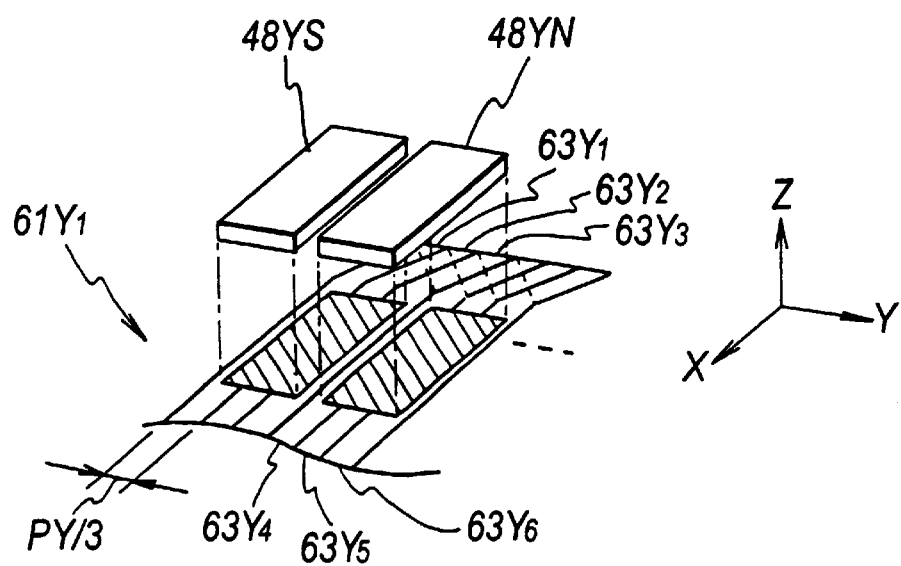

Furthermore, the face of the permanent magnet 48YN facing toward the stationary part 60Y is an N pole face, and the face of the permanent magnet 48YS facing toward the stationary part 60Y is an S pole face. As shown in FIG. 13B, the permanent magnets 48YN and 48YS face the current paths parallel to the X-axis of the armature coils $63Y_1$, $63Y_2$, and $63Y_3$ of the coil row $61Y_1$. The permanent magnet 48YN faces the current paths in which current is supplied in the +X direction of the respective armature coils $63Y_1$, $63Y_2$, and $63Y_3$. The permanent magnet 48YS faces the current paths in which current is supplied in the −X direction of the armature coils $63Y_1$, $63Y_2$, and $63Y_3$. Additionally, the permanent magnet 48YN also faces the current paths in which current is supplied in the +X direction of the respective armature coils $63Y_4$, $63Y_5$, and $63Y_6$ that overlap the current paths in which current is supplied in the −X direction of the respective armature coils $63Y_1$, $63Y_2$, and $63Y_3$.

Additionally, the reaction cancellation magnetic pole unit 45Y2 is structured in the same manner as the reaction cancellation magnetic pole unit 45Y1.

Figure 14:
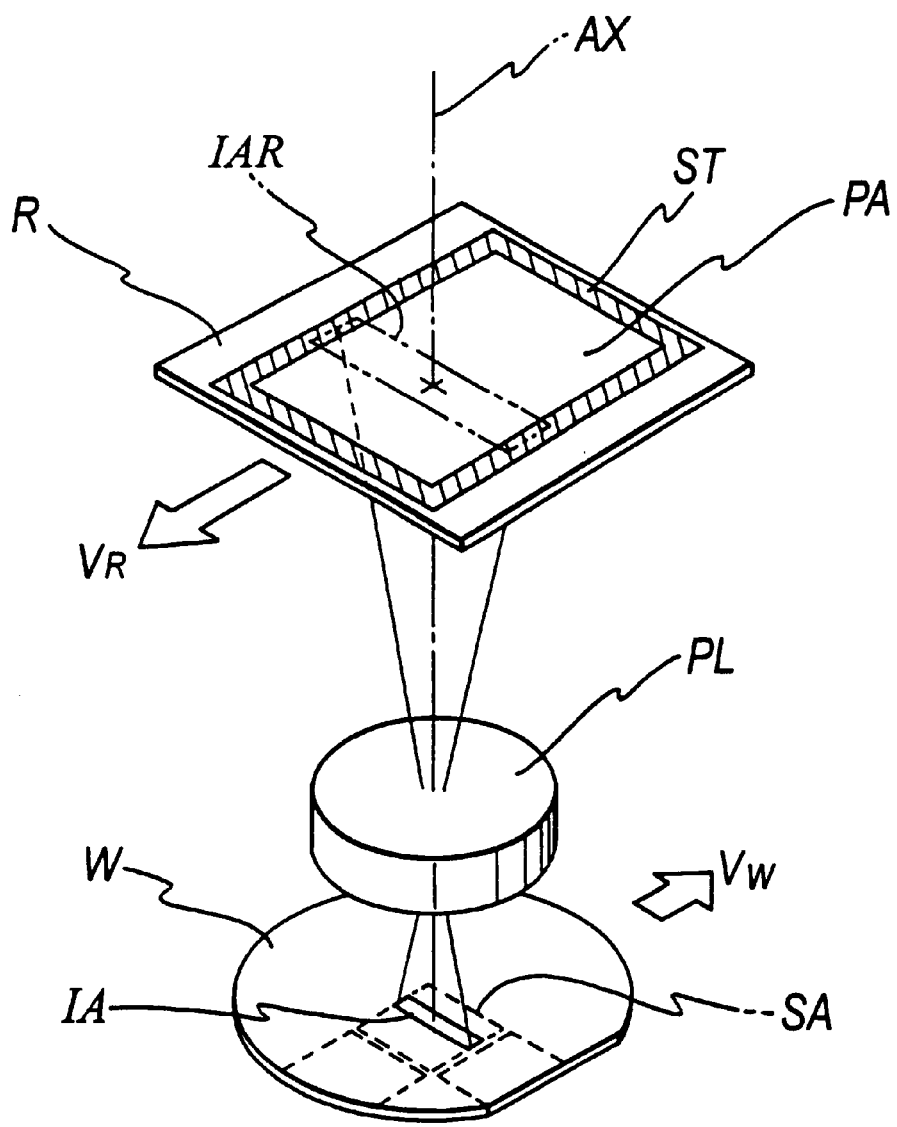
FIG. 14 explains a principle of scanning exposure by the device shown in FIG. 1.

In the exposure device 100 of this embodiment, as shown in FIG. 14, the reticle R is illuminated by the rectangular (slit shape) illumination area IAR with its extending direction in a direction perpendicular to the scanning direction (Y-axis direction) of the reticle R. The reticle R is scanned at speed VR in the −Y direction during exposure. The illumination area IAR (the center is virtually coincident with the optical axis AX) is projected onto the wafer W through the projection optical system PL, and a slit projection area, that is conjugate to the illumination area IAR, that is, an exposure area IA, is formed. Because the wafer W has an inverted image-forming relationship with the reticle R, the wafer W is scanned at a speed $V_W$, synchronized with the reticle R in the opposite direction (+Y direction). Thus, the entire face of the shooting area SA on the wafer W can be exposed. The ratio $V_W/V_R$ of the scanning speed accurately corresponds to the reduction magnification of the projection optical system PL, and the pattern of the pattern area PA of the reticle R is accurately reduced and transferred to the shooting area SA on the wafer W. The width in the extending direction of the illumination area IAR preferably is longer than the pattern area PA on the reticle R, and is preferably smaller than the maximum width of the shaded area ST, so the entire face of the pattern area PA can be illuminated by scanning the reticle R.

The following explains the operation of each part during the movement of the wafer W in this embodiment. First, a summary of the movement in the X-axis direction of the wafer W in this embodiment, that is, the driving principles of the driving magnetic pole units 51X1 and 51X2, that are movable elements of the driving device 50X, is explained with reference to FIGS. 15–20.

Figure 15:
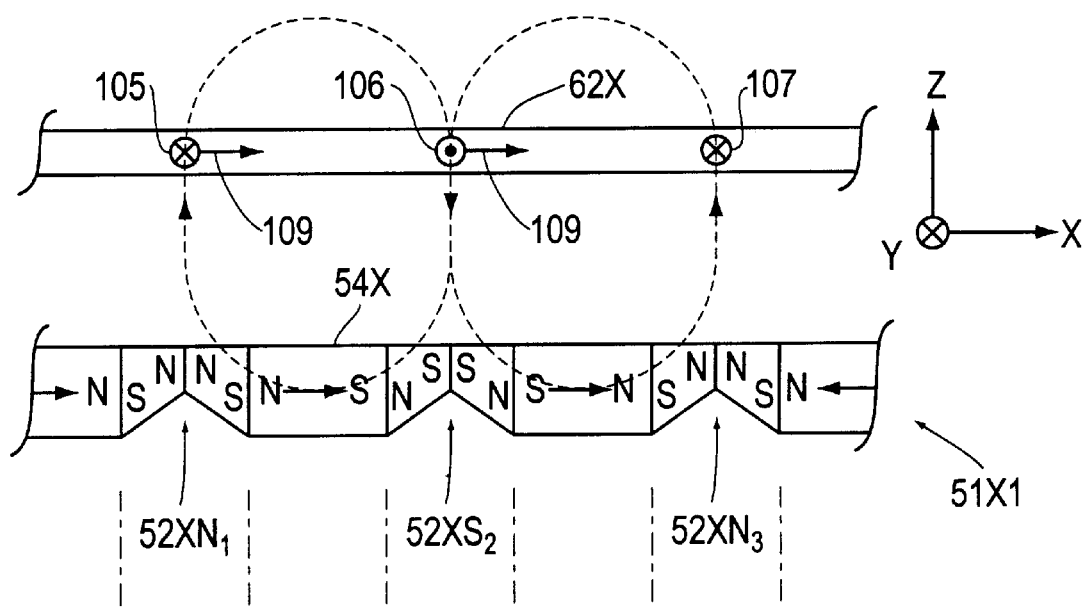
FIG. 15 is a cross-sectional elevational view showing the base of a planar motor including magnets and magnetic circuit material relative to coordinate arrows.

Arrow lines in FIG. 15 show how the permanent wedge magnet groups 52XN and 52XS are interrelated. In the driving magnetic pole unit 51X1, the permanent wedge magnet groups 52XN generate magnetic flux in the +Z direction (the upward direction in the drawing), and the permanent wedge magnet groups 52XS generate magnetic flux in the −Z direction (the downward direction in the drawing). Furthermore, although not depicted in FIG. 15, the permanent magnet 53XN at one end of the driving magnetic pole unit 51X1 generates magnetic flux in the +Z direction (the upward direction in the drawing), and the permanent magnet 53XS at the other end of the driving magnetic pole unit 51X1 generates magnetic flux in the −Z direction (the downward direction in the drawing). The wedge magnet groups 52XS, 52XN, along with the transverse magnets 54X and the magnetic body member 62X, form a magnetic circuit.

The operating principles of a planar motor according to the present invention may be more clearly understood by referring to FIGS. 15–18. FIG. 15 is a cross-sectional elevation view relative to coordinate arrows X, Z showing a planar motor including the wedge magnet array containing wedge magnet groups $52XN_1$, $52XS_2$ and $52XN_3$. The planar motor also includes the coil array that is mounted on magnetic body member 62X. For purposes of simplicity, the coil array is illustrated as consisting of three wires 105, 106 and 107 all connected to a single-phase source of electric current. A three-phase motor, for example, includes two additional phases of wires (not shown).

Figure 16:
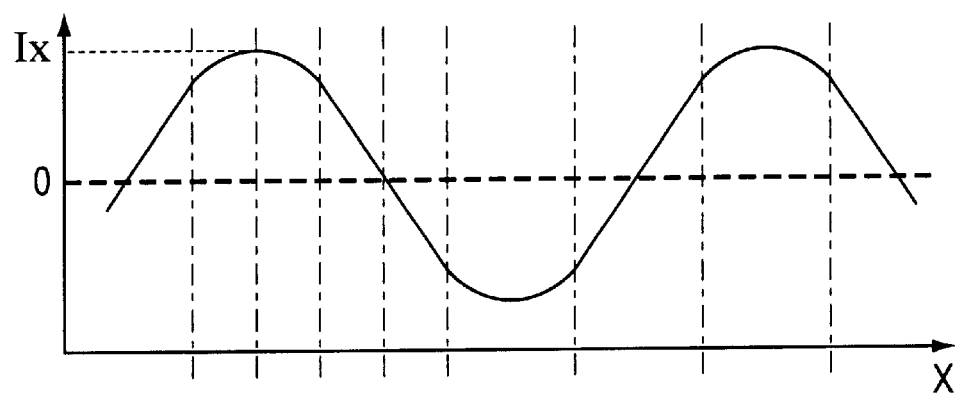
FIG. 16 is a graphical representation of the electromagnetic force component Ix for the FIG. 15 motor.
Figure 17:
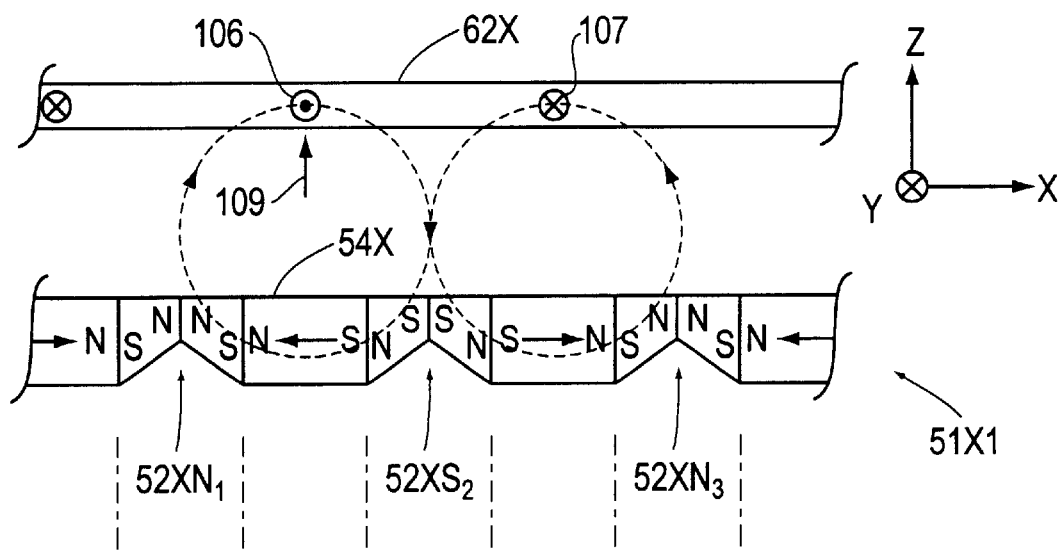
FIG. 17 is similar to FIG. 15, but shows the wires of the magnetic circuit when located between the wedge magnet groups.
Figure 18:
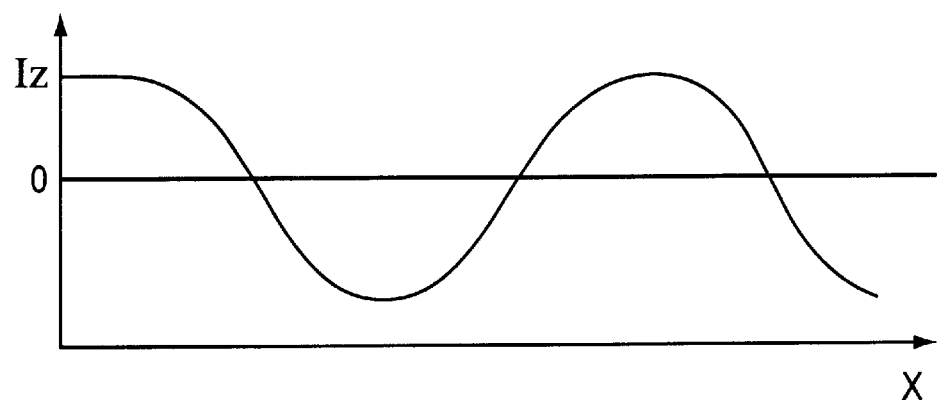
FIG. 18 is a graphical representation of the electromagnetic force component Iz for the FIG. 17 motor.

As shown in FIG. 16, wires 105, 106 and 107 are located directly above the magnet groups $52XN_1$, $52XS_2$ and $52XN_3$, respectively. A commutation circuit (not shown) controls and supplies electric current to wires 105, 106 and 107. In FIGS. 15 and 17, a solid dot on a wire indicates that electric current flows in the +Y direction out of the plane of the figure, whereas a cross on a wire indicates that electric current flows in the −Y direction into the plane of the figure. Thus, electric current on wires 105 and 107 flows into the plane of the figure, while the electric current on wire 106 flows out of the plane of the figure. The magnetic flux of the magnet array is indicated by the dashed lines on FIGS. 15 and 17, while the magnetic polarity is indicated by arrows. In the configuration shown in FIG. 15, those skilled in the art will recognize that according to the Lorentz law, the electromagnetic force acts on the coil array exclusively in the X direction. For convenience, this electric current configuration is designated "X current," or Ix. It should be noted that, in accordance with the laws of physics, each electromagnetic force component acting on the coil is balanced by an equal but oppositely directed electromagnetic force acting on the magnet array. As the magnet array moves laterally relative to the wires 105, 106 and 107, the electric current Ix eventually drops to 0. Electric current Ix typically is supplied by the commutation circuit as a sinusoidal waveform, as shown graphically in alignment with the planar motor in FIG. 16. Although square wave commutation is sufficient in some planar motor embodiments, in other embodiments it is preferable to use a less abrupt and more gradual commutation waveform, such as sinusoidal, for precise motion and positioning of a stage. Positioning stages driven by linear motors are described in U.S. Pat. No. 5,528,118, the disclosure of which is incorporated herein by reference in its entirety.

FIG. 17 is a cross-sectional elevation view showing the configuration of the planar motor at a later time in which the magnet array has moved such that the wires 106 and 107 are positioned midway between respective magnets $52XN_1$, $52XS_2$ and $52XN_3$. The commutation circuit (not shown) provides electric current flowing out of the plane of the figure on wire 106. Similarly, electric current in the direction into the plane of the figure is provided on wire 107. In accordance with the Lorentz law, the resultant electromagnetic force acts on the coil exclusively in the Z direction. For convenience, the electric current configuration generating this force is designated "Z current," or Iz. The Z direction force acts to urge the coil array upward above the magnet array (in the present embodiment, since the coil array is fixed, the magnet array will be forced (downward) away from the fixed coil array). The magnitude of the electric current adjusts the distance of the magnet array below the coil array. The angular inclination of the magnet array relative to the coil array can be adjusted by supplying currents of differing magnitudes through different wires. For example, a stronger current Iz provided to wire 107 than to wire 106 causes the distance between the right hand side of the magnet array and the coil array to be larger than the distance between the left hand side of the magnet array and the coil array (the inclination of the movable magnet array is thus controlled). A sinusoidally-shaped waveform, shown graphically in alignment with the planar motor in FIG. 18, causes electric current Iz to fall eventually to 0, when wires 106 and 107 move farther relative to respective magnet groups $52XN_1$, $52XS_2$ and 52XN3.

Ideally, the electric current through a wire is predetermined by the instantaneous location of the wire relative to the magnets. For example, a wire directly above a magnet should be provided with maximum X current to maximize the X direction force, and a wire equidistant between two magnets should be provided with maximum Z current to maximize the Z direction force. The directions of the currents are reversed for wires located at positions having reversed magnetic flux.

For purposes of clarity, only three coil wires 105, 106 and 107 are shown in FIGS. 15 and 17. As is well-known to those skilled in the art, typical planar motor coil implementations include numerous closely packed wires connected with a commutation circuit in multiple phases, generally two or three phases, with each phase having a plurality of wires, generally with equal numbers of wires for each such phase. Typically all of the wires belonging to a particular phase are commutated together. In an embodiment having coils of more than one phase, when the electric current Ix is decreasing for one phase, a similar electric current Ix is typically increasing for another phase. The sinusoidal currents are adjusted to provide a constant force. This prevents the stage from traveling with uneven speeds. Similarly, in an embodiment when electric current Iz is decreasing for one phase, a similar current Iz is typically increasing for another phase, thus preventing the magnet array from oscillating up and down in elevation with respect to changes in current Iz.

The Lorentz force on the wire 106 in the direction indicated by arrow 109 (see FIGS. 15 and 17) urges coil array to move in that direction. (Since the coil array is fixed, the corresponding reaction force on the movable magnet array causes the magnet array to move in the opposite direction of arrow 109.) At a location midway between two magnets, the magnetic flux direction is as shown in FIG. 17. Accordingly, the Lorentz force (arrow 109) on wire 106 has a Z component, which urges the magnet array downward away from the coil array, and a horizontal X force component, which urges the coil array in the X direction. When only X force is desired, the Z force component is typically offset by an opposing Z force component on a wire commutated by a different phase and having either a magnetic flux or current reversed relative to wire 106, thus leaving a net X direction force.

Figure 19:
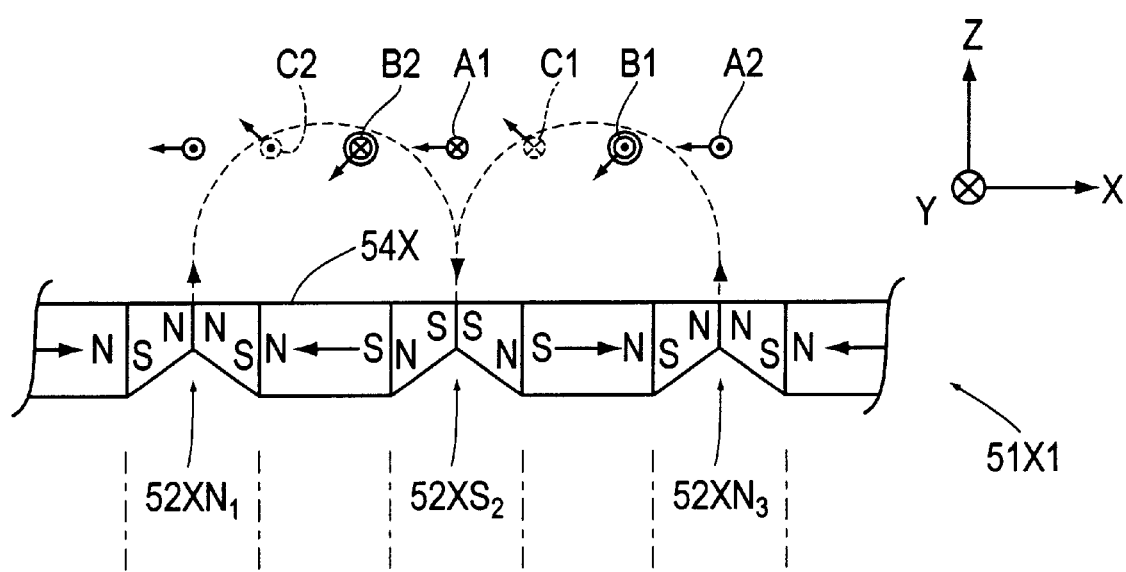
FIG. 19 is a cross-sectional elevational view of a planar motor relative to coordinate arrows X and Z, illustrating three-phase X commutation.

FIG. 19 is a cross-sectional elevation view of a planar motor relative to coordinate arrows X and Z. The planar motor includes a magnet array having magnets $52XN_1$, $52XS_2$ and $52XN_3$ similar to FIGS. 15 and 17. As in FIGS. 15 and 17, the magnetic flux path of the magnet array is indicated by the dashed lines on FIG. 19. The planar motor further includes a coil array having for simplicity six wires A1, A2, B1, B2, C1 and C2 distributed among three different phases A, B and C, with two wires per phase. As with FIGS. 15 and 17, a central solid dot on a wire indicates electric current flow in the +Y direction out of the plane of the figure, whereas a cross on a wire indicates electric current flow in the −Y direction into the plane of the figure. Paired wires of the same phase have oppositely directed current, since they are portions of a single continuous current loop. Thus, wires A1, B1 and C1 have oppositely directed current from wires A2, B2 and C2, respectively. In accordance with the Lorentz law, the electromagnetic force on wires A1, A2, B1, B2, C1 and C2 acts in the direction shown by the arrows pointing from the respective wires. Forces on wires of phase A act exclusively in the X direction. Wires of the B and C phases, however, all have Z components of electromagnetic force. Of importance, in the X commutation configuration of FIG. 19, the +Z force components acting on the wires C1 and C2 of phase C are identically canceled by the −Z force components acting on wires B1 and B2 of phase B, leaving only net X force components on the coil array. In other commutation configurations, X force components are identically canceled between phases, leaving only net Z force components.

Figure 20:
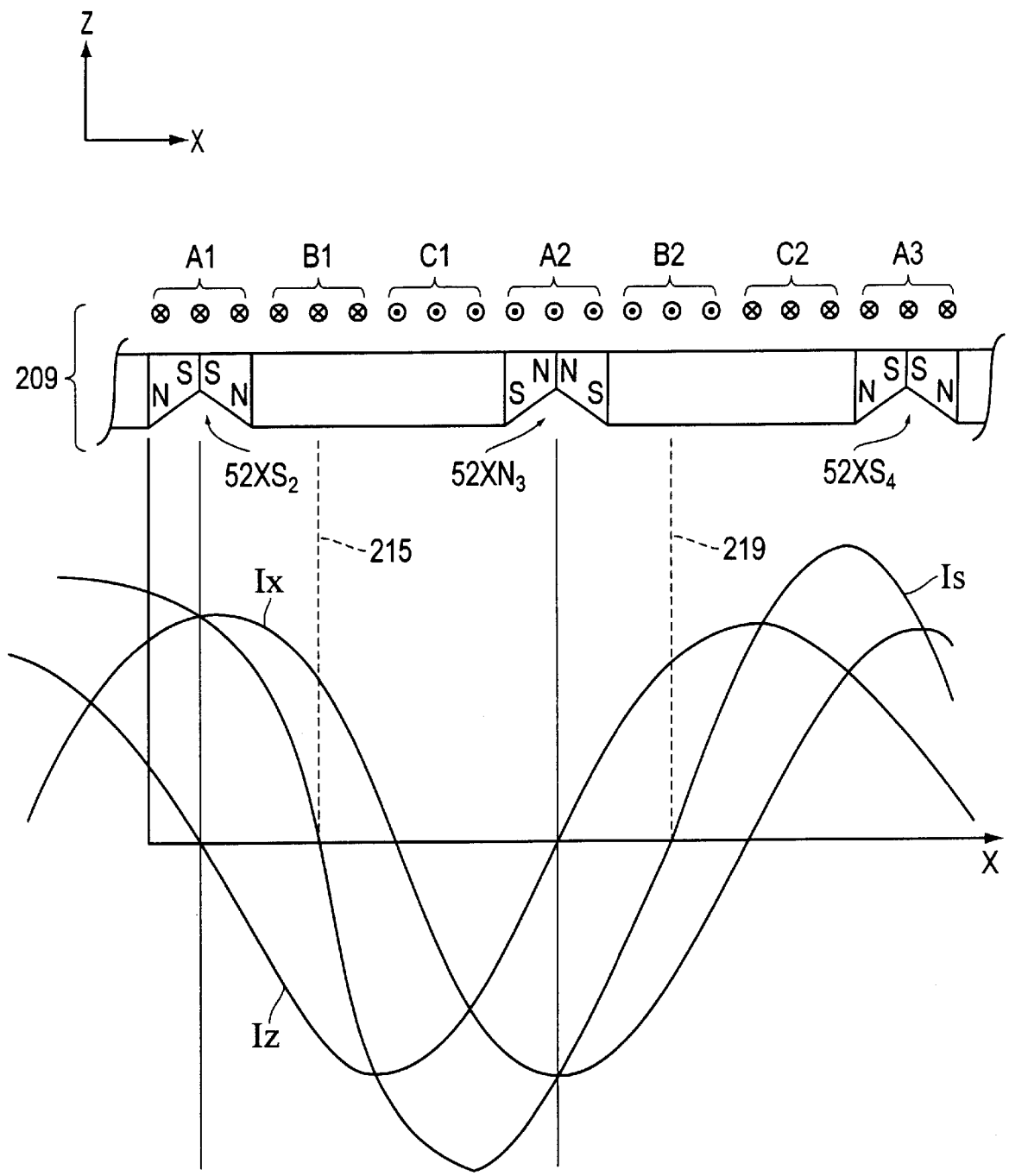
FIG. 20 is a cross-sectional view of a planar motor with a three-phase coil array illustrating the superposition of X and Z commutation currents, in accordance with an embodiment of the invention.

FIG. 20 is a cross-sectional view of a planar motor with a three-phase coil array 209, in accordance with an embodiment of the invention. Aligned with the coil array 209 in the lower portion of FIG. 20 is a graphic representation of the current components through the corresponding coil phases. The current shown in FIG. 20 is the current through any phase as a function of that phase's position in the X direction. In an embodiment having coils of more than one phase, when the electric current Ix is reduced for one phase, a similar electric current Ix is typically increased for another phase. This prevents the magnet array from traveling with uneven speeds. Similarly, when electric current Iz is reduced for one phase, it is typically increased for another phase, thus preventing the magnet array from oscillating up and down in elevation with changing current Iz.

As shown in the lower portion of FIG. 20, both the X current Ix and the Z current Iz follow sinusoidal waveforms. X current Ix has a positive maximum near magnet $52XS_2$, and a negative maximum near magnet $52XN_3$. Z current Iz has a negative maximum at an X position equidistant between magnets $52XS_2$ and $52XN_3$, and a positive maximum at a position equidistant between magnets $52XN_3$ and $52XS_4$. The amplitudes of Ix and Iz are selected independently of one another and depend on the required force in the X and Z directions respectively. Accordingly, the amplitudes of Ix and Iz in FIG. 20 are shown as equal by way of example only. When the currents of all three phases of coil array 209 are sequentially commutated according to the illustrated Ix and Iz curves, the magnet array travels in a level horizontal plane at a steady speed.

The superposition of currents Ix and Iz is represented graphically as superposition current Is in the lower portion of FIG. 20. In this example, the waveform of Is is the result of superposition of equal current amplitudes Ix and Iz. In other embodiments, differing amplitudes of Ix and Iz waveforms result in differing amplitudes and waveforms of superposition current Is. In the example of FIG. 20, for the magnet array to travel from left to right while maintaining a level attitude, superposition current Is has a positive maximum between magnets $52XN_3$ and $52XS_4$, at a position closer to magnet $52XS_4$ than to magnet $52XN_3$. Superposition current Is has a negative maximum between magnets $52XS_2$ and $52XN_3$, at a position closer to magnet $52XN_3$ than to magnet $52XS_2$.

Shown in FIG. 20 are the phases A, B and C of coil array 209. Each phase is represented by coil units in the form of wire loops, for example as described in connection with FIGS. 8A–11. All wires of the same phase carry the same instantaneous current. Thus, for phase A in this embodiment, there is a leg A1 and a leg A2. When electric current flows into the plane of the figure at leg A1, because the coil unit is in the form of a continuous loop, electric current flows out of the plane of the figure at leg A2. Phase A3, shown in the upper right portion of FIG. 20, is centered above magnet $52XS_4$ and carries the same instantaneous current as phase A1, since it is commutated with phase A. A desired electric current configuration can be found by correlating the location of a phase with the sinusoidal curve of superposition current Is. For example, vertical line 215 corresponds to a position on the superposition current Is waveform that has zero current, and thus a phase centered at a position traversed by vertical line 215 should have zero current. Phase B1 approximates this desired position. Likewise, vertical line 219 corresponds to another position on superposition current Is waveform having zero current. Phase B2 approximates this desired position. Because all of the wires B1 and B2 in the same phase B coil unit are commutated together, the current through wires B1 and B2 respectively is the same as for any other wires in the same phase. Accordingly, a zero current Is in both phases B1 and B2 is consistent with the force required for equal X and Z commutation of coil array 209. Thus, in some embodiments, all active coil units of a coil array are simultaneously commutated for X and Z forces by applying a superposition current Is.

Thus, driving of the driving magnetic pole unit 51X1 can be performed by controlling the current supply to the armature coil 63X facing toward the driving magnetic pole unit 51X2, which is the same as the case of the driving magnetic pole unit 51X1 with respect to the driving magnetic pole unit 51X2. Therefore, with respect to both the driving magnetic pole units 51X1 and 51X2, by controlling the current supplied to the facing armature coil 63X according to the position relationship of the flat coil group 61X, it is possible to drive the wafer stage WST by a desired driving force in the Z and X axis directions.

Furthermore, when the wafer stage WST is translated and driven in the X-axis direction, it is necessary to control the current of each armature coil 63X so that the driving force that acts on the driving magnetic pole unit 51X1 and the driving force that acts on the driving magnetic pole unit 51X2 become the same. This is because the rotational force that acts on the wafer stage WST is made to be 0. Meanwhile, when the wafer stage WST is rotated and driven around the Z-axis, the current of each armature coil 63X can be controlled so that the driving force in the X-axis direction that acts on the driving magnetic pole unit 51X1 and the driving force in the X-axis direction that acts on the driving magnetic pole unit 51X2 are different from each other (for example, they can be in the opposite direction to each other). Additionally, when the wafer stage WST is rotated and driven about the X-axis, the current of each armature coil 63X can be controlled so that the driving force in the Z-axis direction that acts on the driving magnetic pole unit 51X1 and the driving force in the Z-axis direction that acts on the driving magnetic pole unit 51X2 are different from each other.

The Y-axis is driven in a similar manner.

Next, driving of the driving magnetic pole units 51Y1 and 51Y2 by the Lorentz electromagnetic force that is generated by the mutual operation between the magnetic flux between the driving magnetic pole units 51Y1 and 51Y2 and the non-magnetic body member 62Y and the current flowing into the armature coil 63Y of the flat coil group 61Y is explained.

When current is supplied to the armature coil 63Y in the environment of the magnetic flux density B by the driving magnetic pole units 51Y1 and 51Y2, a Lorentz electromagnetic force is generated in the armature coil 63Y. In this case, the generation of the Lorentz electromagnetic force is the same as the case of the driving magnetic pole units 51X1 and 51X2. That is, in the same manner as the case of the driving magnetic pole units 51X1 and 51X2, by supplying the three-phase current to each armature coil 63Y, it is possible to drive the wafer stage WST at a desired driving force in the Z- and Y-axis directions.

Furthermore, when driving the driving magnetic pole units 51Y1 and 51Y2, in the same manner as in the case of driving the driving magnetic pole units 51X1 and 51X2, when the wafer stage WST is translated and driven in the Y-axis direction, in order to make the rotation force that acts on the wafer stage WST zero, it is necessary to control the current of each armature coil 63Y so that the driving force that acts on the driving magnetic pole unit 51Y1 and the driving force that acts on the driving magnetic pole unit 51Y2 are the same. Furthermore, when the wafer stage WST is rotated and driven about the Z-axis, the current of each armature coil 63Y is controlled so that the driving force in the Y-axis direction that acts on the driving magnetic pole unit 51Y1 and the driving force in the Y-axis direction that acts on the driving magnetic pole unit 51Y2 are different from each other (for example, they are in opposite directions to each other), causing the Y-force to have a slope in the X-direction. Furthermore, when the wafer stage WST is rotated and driven about the X-axis, the current of each armature coil 63Y is controlled so that the driving force in the Z-axis direction that acts on the driving magnetic pole unit 51Y1 and the driving force in the Z-axis direction that acts on the driving magnetic pole unit 51Y2 are different from each other.

Additionally, in driving the driving magnetic pole units 51Y1 and 51Y2, in the same manner as in the case of driving the driving magnetic pole units 51X1 and 51X2, the current supplied to each armature coil 63Y is determined according to the position relationship between the driving magnetic pole units 51Y1 and 51Y2 and the flat coil group 61Y.

Thus, with respect to driving the wafer stage WST, driving in the X-axis direction is performed by driving the driving magnetic pole unit 51X, and driving in the Y-axis direction is performed by driving the driving magnetic pole unit 51Y. Additionally, driving in the Z-axis direction, rotation driving about the Z-axis, rotation driving about the X-axis, and rotation driving about the Y-axis are performed by the driving magnetic pole unit 51X, the driving magnetic pole unit 51Y, or both of the driving units. Therefore, according to the position relationship between the flat coil group 61X and the driving magnetic pole unit 51X and the position relationship between the flat coil group 61Y and the driving magnetic pole unit 51Y, the current that is supplied to the armature coil 63Y at a position facing toward the driving magnetic pole unit 51Y in the flat coil group 61Y and the armature coil 63X at a position facing toward the driving magnetic pole unit 51X in the flat coil group 61X is controlled so that not only the wafer stage WST but also the wafer W can be driven at a desired driving force in the six degrees-of-freedom directions.

Furthermore, in the stage device 30 of this embodiment, the magnetic body member 62X of the flat coil group 61 disposed above the wafer stage WST is structured by a magnetic body material, so magnetic attraction exists between the driving magnetic pole units 51X1 and 51X2 and the magnetic body member 62X. Therefore, prior to driving the wafer stage WST in the Z-axis direction, upon considering the magnetic attraction, the current supplied to the armature coils 63X and 63Y is controlled.

Therefore, according to the stage device 30 of this embodiment, by taking advantage of strengths of the Lorentz electromagnetic force driving method, which include superior controllability, thrust line shape, and positioning, the driving magnetic pole units 51, which have a reduced weight, can be driven at an arbitrary driving force in an arbitrary direction along the X-Y plane.

In the stage device 30 of this embodiment, as described earlier, because the driving magnetic pole units 51X1, 51X2, 51Y1, and 51Y2 are fixed to the wafer stage WST that is maintained through the wafer holder, by driving and controlling the driving magnetic pole units 51X1, 51X2, 51Y1, and 51Y2 through the stage controlling system 19 in the main controller 20 as described above, it is possible to integrally move the wafer stage WST and the wafer W within the X-Y plane. Furthermore, as further described, as the driving magnetic pole units 51X1, 51X2, 51Y1, and 51Y2, that is, the wafer stage WST, is moved by a desired driving force in a desired direction, in the main controller 20, the mutual position relationship within the X-Y plane between the movable elements 51X1, 51X2, 51Y1, and 51Y2 and the stationary parts 61X and 60Y is obtained by monitoring the measured value (position information or speed information) of the wafer interferometer 31 through the stage controlling system 19. Furthermore, in the main controller 20, according to the mutual position relationship that was thus obtained and the target position to which the wafer stage WST is to be driven, the value and direction of the current to be supplied to each armature coil 63X and 63Y are calculated and determined, and an instruction is given to the stage controlling system 19. By doing this, in the stage controlling system 19, the current value and direction given to each armature coil 63X and 63Y in response to the instruction are controlled through the current driving devices 22X and 22Y. Additionally, according to the distance to the target position, the speed of the wafer stage WST is also controlled in the main controller 20.

Here, based upon the position information (or speed information) that has been obtained from the wafer interferometer 31 for each point in time of the movement, the main controller 20 can also obtain the direction and value of the current that is supplied to each armature coil 63. However, when the controlling response is not sufficiently fast, the direction and value of the current that is supplied to the respective armature coils 63X and 63Y can be obtained according to a feed-forward control technique, in which by controlling the movement of the movable elements 51X1, 51X2, 51Y1, and 51Y2, for example, the wafer W can be located on a desired path at a desired speed in a certain time interval after the movement begins. In this case, based upon the position information (or speed information) that has been obtained from the wafer interferometer 31 for each point in time of the movement, the main controller 20 obtains a shift from a desired path, and after that, the direction and values of the currents that are supplied to the respective armature coils 63X and 63Y are corrected, and the direction and value of the currents that are to be supplied to the respective armature coils 63X and 63Y for a specified time interval after the corrected time interval are obtained time sequentially. Then, based upon the corrected information, the stage controlling system 19 performs controlling of the current for the respective armature coils 63X and 63Y.

Furthermore, in this embodiment, prior to driving the driving magnetic pole unit 51, based upon the position information (or speed information) that has been obtained from the wafer interferometer 31, the armature coils 63X and 63Y that are facing the driving magnetic pole units 51X1, 51X2, 51Y1, and 51Y2 are determined, and the stage controlling system 19 controls the current driving devices 22X and 22Y so that the current to drive the driving magnetic pole units 51X1, 51X2, 51Y1, and 51Y2 is supplied to only the appropriate armature coils 63X and 63Y. Therefore, current is not supplied to armature coils 63X and 63Y that generate only a weak Lorentz electromagnetic force, or that do not generate any Lorentz electromagnetic force. Thus, maintenance of the driving force and decreasing of the consumed current are improved.

Next, a summary of the principles of the reaction cancellation that acts on the stationary parts 60X and 60Y in this embodiment is explained with reference to FIGS. 21A through 24.

Figure 21A:
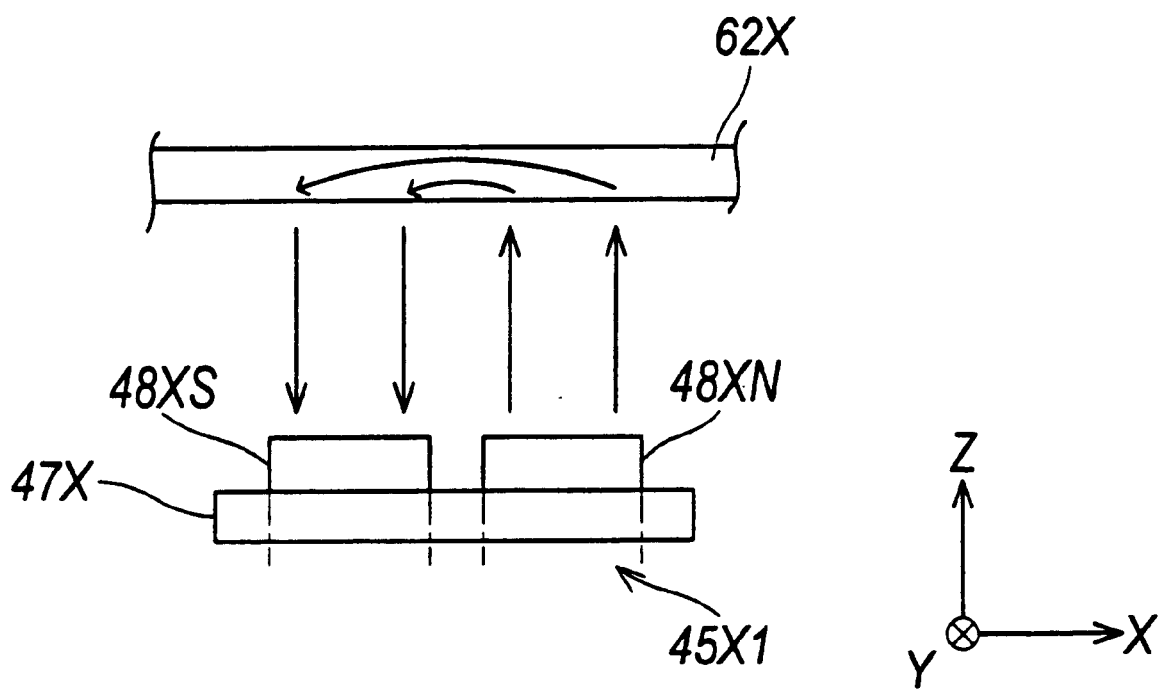
FIGS. 21A and 21B explain a magnetic flux density distribution generated by the reaction cancellation magnetic pole unit in the X-axis direction.

In the reaction cancellation magnetic pole unit 45X1, as shown by solid arrow lines in FIG. 21A, the permanent magnet 48XN generates magnetic flux in the +Z direction (the upward direction in the drawing), and the permanent magnet 48XS generates magnetic flux in the −Z direction (the downward direction in the drawing). Furthermore, a magnetic circuit is formed such that the magnetic flux circulates through the permanent magnet 48XN, the magnetic body member 62X, the permanent magnet 48XS, and the magnetic body member 47X in order.

Figure 21B:
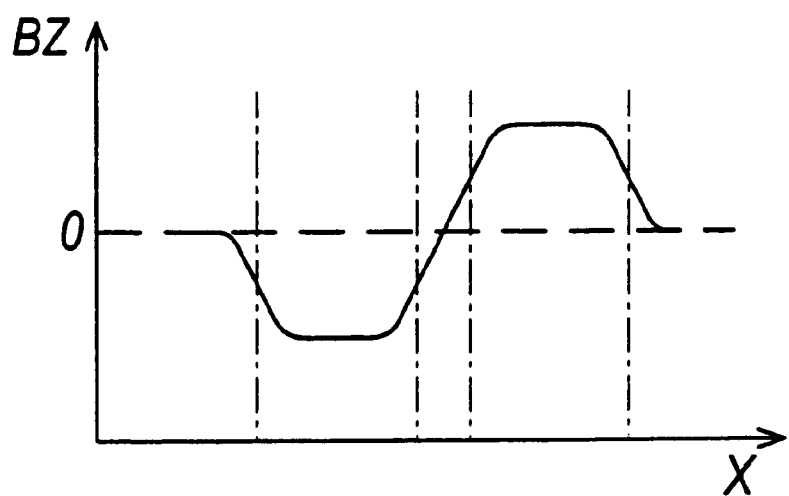

At this time, the Z direction component BZ (hereafter referred to as "magnetic flux density BZ") of the magnetic flux density near the lower surface of the magnetic body member 62X, which is at the Z position where the armature coil 63X comprising the flat coil group 61X is disposed, has the distribution shown in FIG. 21B. That is, the absolute value of the magnetic flux density BZ becomes maximum at positions corresponding to the middle points of the permanent magnets 48XN and 48XS. The absolute value of the magnetic flux density BZ decreases as it approaches the position corresponding to the peripheries of the magnetic pole faces. The magnetic flux density BZ becomes 0 at the middle point position between the position corresponding to the center of the permanent magnet 48XN and the position corresponding to the center of the permanent magnet 48XS. Furthermore, in FIG. 21B, when the direction of the magnetic flux is the +Z direction, the value of the magnetic flux density BZ is positive, and when the direction of the magnetic flux is the −Z direction, the value of the magnetic flux density BZ is negative.

Furthermore, the reaction force cancellation magnetic pole unit 45X2 generates the same magnetic flux density BZ as in FIG. 21B at the Z position where the armature coil 63X is disposed.

Figure 22A:
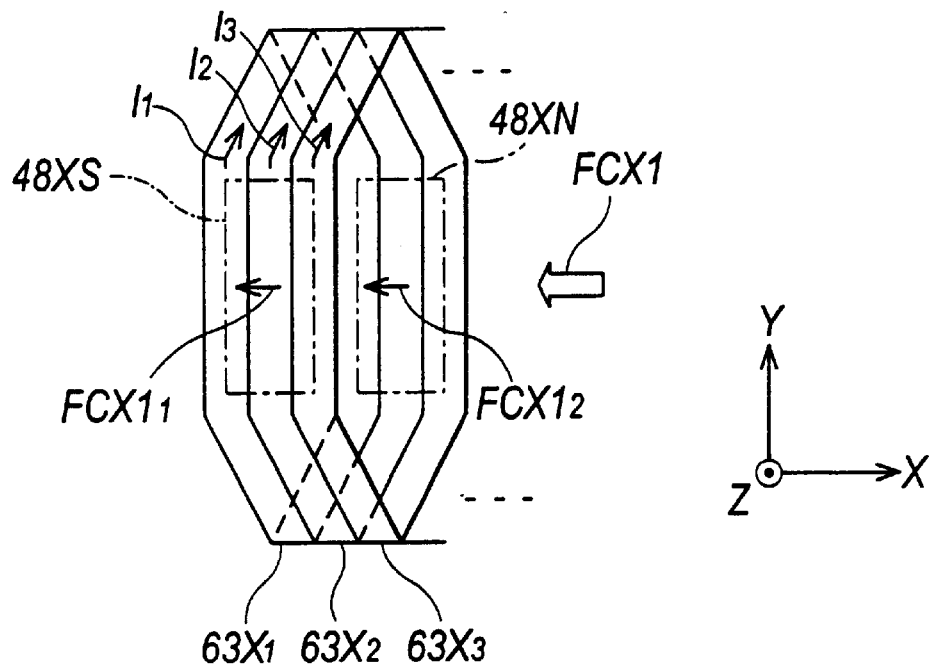
FIGS. 22A and 22B explain structure for generating a reaction canceling force related to the X-axis direction.

When the right-circulating currents $I_1$, $I_2$, and $I_3$, as seen in the plan view, are supplied to the armature coils $63X_1$, $63X_2$, and $63X_3$ where the current path faces both the permanent magnets 48XN and 48XS, as shown in FIG. 22A, the Lorentz electromagnetic force $FCX1_1$ is generated in the −X direction in the area facing the permanent magnet 48XS of the armature coils $63X_1$, $63X_2$, and $63X_3$ by electromagnetic interactions, and the Lorentz electromagnetic force $FCX1_2$ is generated in the −X direction in the area facing the permanent magnet 48XN. As a result, the force FCX1 of the −X direction, that is the combination of the Lorentz electromagnetic forces $FCX1_1$ and $FCX1_2$, acts on the stationary part 60X, and this force FCX1 is thus applied to the stationary part. Thus, it is possible to generate the X-axis direction component of the reaction force that acts on the stationary part 60X driven by the above-mentioned magnetic pole unit 51, that is, the force FCX1, along the same plane as the plane along which the Lorentz electromagnetic force is generated when the wafer stage WST is driven in the X-axis direction. Furthermore, the size of the force FCX1 depends upon the size of the currents $I_1$, $I_2$, and $I_3$.

Figure 22B:
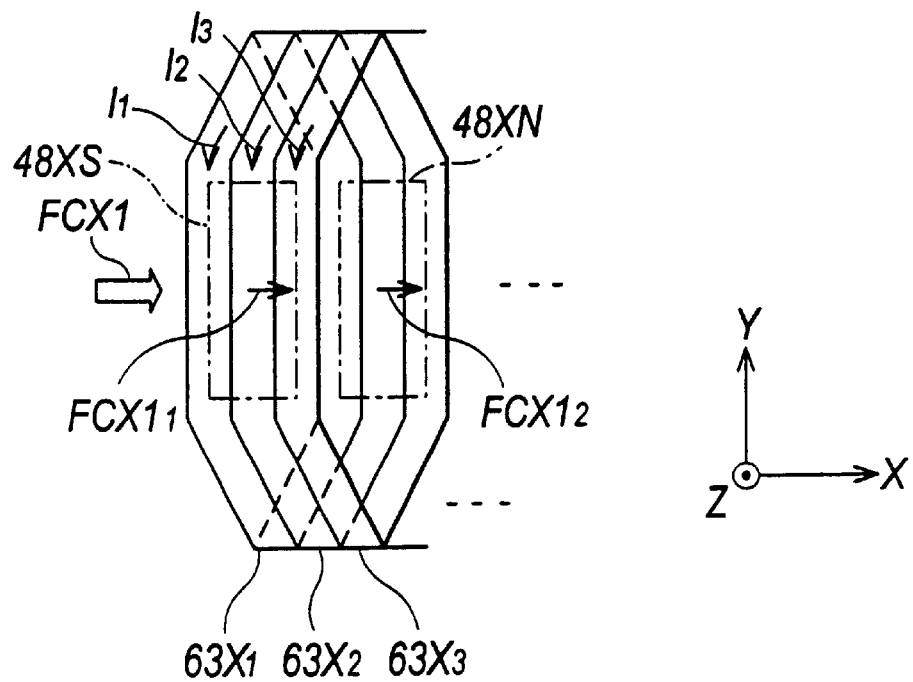

Additionally, when the left-circulating currents $I_1$, $I_2$, and $I_3$ as seen in the plan view, are supplied to the armature coils $63X_1$, $63X_2$, and $63X_3$ as shown in FIG. 22B, a Lorentz electromagnetic force $FCX1_1$ in the +X direction is generated in the area of the armature coils $63X_1$, $63X_2$, and $63X_3$ facing the permanent magnet 48XS by electromagnetic interaction, and a Lorentz electromagnetic force $FCX1_2$ in the +X direction is generated in the area facing the permanent magnet 48XN. As a result, the force FCX1 in the +X direction, that is a combination of the Lorentz electromagnetic forces $FCX_1$ and $FCX1_2$, is applied to the stationary part 60X.

That is, by controlling the size and the direction of the current that is supplied to the armature coils $63X_1$, $63X_2$, and $63X_3$, a desired size of the force FCX1 is applied in a desired direction, from among the −X direction and the +X direction, at the position of arrangement of the armature coils 63X$_1$, 63X$_2$, and 63X$_3$ of the stationary part 60X.

Furthermore, with respect to the armature coil 63X facing the reaction force cancellation magnetic pole unit 45X2, in the same manner as the case of the armature coils 63X$_1$, 63X$_2$, and 63X$_3$, by controlling the size and direction of the current that is supplied to the armature coil 63X, a desired size of the force FCX2 (see FIG. 24) is applied to the stationary part 60X in a desired direction from among the +X and −X directions.

Figure 23A:
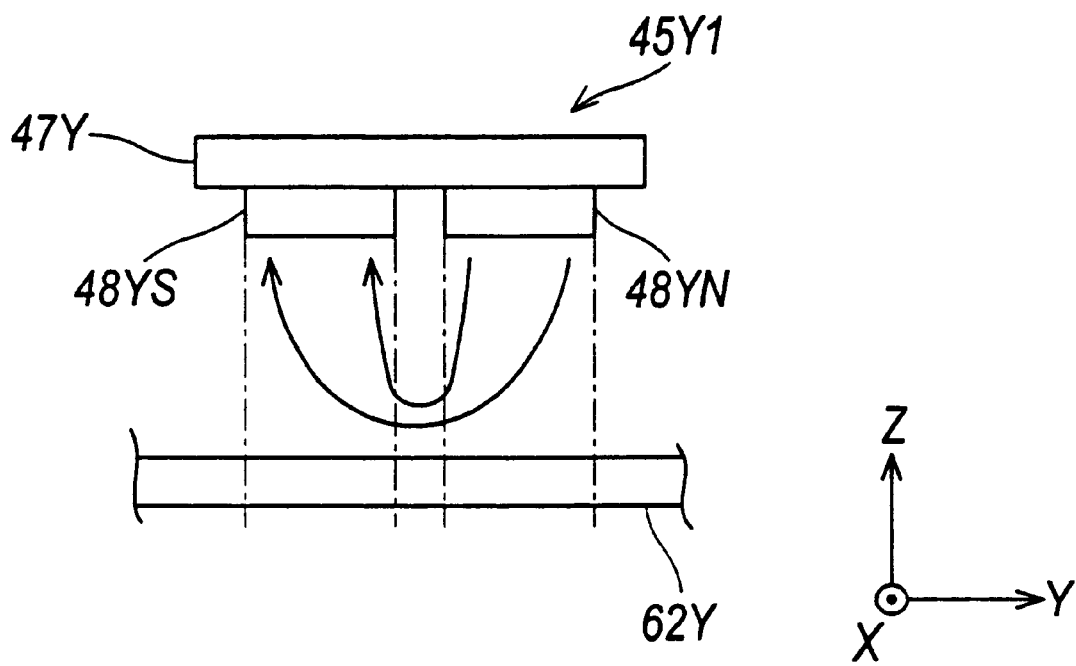
FIGS. 23A and 23B explain a magnetic flux density distribution generated by the reaction cancellation magnetic pole unit in the Y-axis direction.

Additionally, in the reaction force cancellation magnetic pole unit 45Y1, as shown by arrow lines in FIG. 23A, the permanent magnet 48YN generates magnetic flux in the −Z direction (downward direction in the drawing), and the permanent magnet 48YS generates magnetic flux in the Z direction (the upward direction in the drawing). Furthermore, a magnetic circuit is formed such that the magnetic flux circulates through the permanent magnets 48YN and 48YS and the magnetic body member 47Y in order.

Figure 23B:
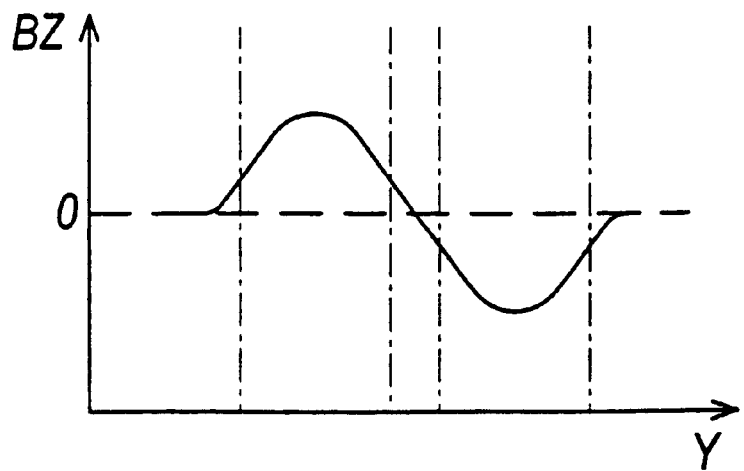

At this time, the Z direction component (hereafter referred to as "magnetic flux density BZ") BZ of the magnetic flux density near the top face of the non-magnetic body member 62Y, which is at the Z position where the armature coil 63Y comprising the flat coil group 61Y is provided, has the distribution shown in FIG. 23B. That is, the absolute value of the magnetic flux density BZ becomes maximum at the positions corresponding to the middle points of the permanent magnets 48YN and 48YS. The absolute value of the magnetic flux density BZ decreases as it approaches positions corresponding to the peripheries of the magnetic pole faces. The magnetic flux density BZ becomes 0 at the middle point position between the position corresponding to the center of the permanent magnet 48YN and the position corresponding to the center of the permanent magnet 48YS. Furthermore, in the same manner as in FIGS. 23B and 21B, when the direction of the magnetic flux is a +Z direction, the value of the magnetic flux density BZ is positive, and when the direction of the magnetic flux is a −Z direction, the value of the magnetic flux density BZ is negative.

Furthermore, the reaction force cancellation magnetic pole unit 45Y2 generates the same magnetic flux density BZ at the Z position where the opposing armature 63Y is disposed as in FIG. 23B.

Furthermore, with respect to the armature coil 63Y facing the reaction force cancellation magnetic pole unit 45Y1, in the same manner as in the case of the armature coils 63X$_1$, 63X$_2$, and 63X$_3$, by controlling the size and the direction of the current that is supplied to the armature coil 63Y, a force of desired size is applied to the stationary part 60Y in a desired direction among the +Y and −Y directions. Additionally, with respect to the armature coil 63Y facing the reaction force cancellation magnetic pole unit 45Y2, in the same manner as the case of the armature coils 63X$_1$, 63X$_2$, and 63X$_3$, by controlling the size and the direction of the current that is supplied to the armature coil 63Y, a desired size of the force is applied to the stationary part 60Y in a desired direction among the +Y and −Y directions.

Figure 24:
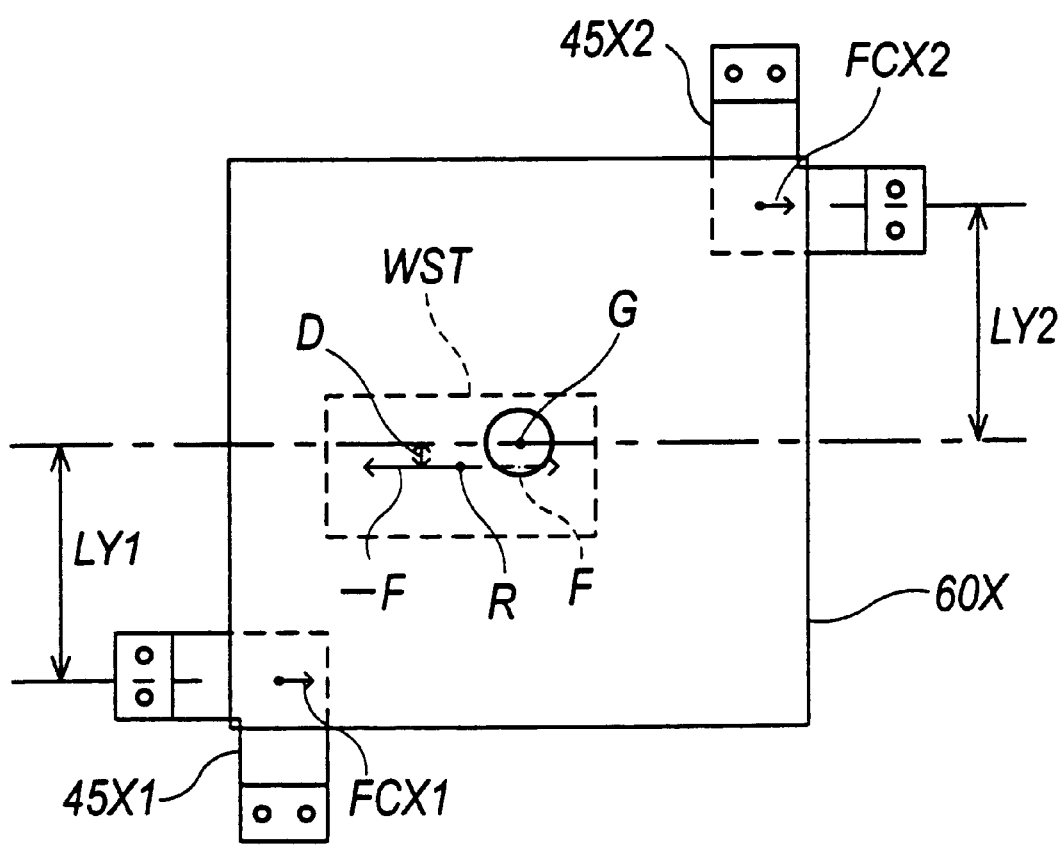
FIG. 24 explains a reaction cancellation in the X-axis direction.

Incidentally, as shown in FIG. 24, when the driving magnetic pole unit 51X is driven by a force F, a force (−F) acts on the point R in the stationary part 60X. Here, the X component of the reaction force (−F) is (−FX). Furthermore, the distance between a straight line along the reaction force (−F) and the center of gravity G of the stationary part 60X is D.

In order to cancel the reaction force, if the X components of the forces FCX1 and FCX2 are defined as CX1 and CX2, forces FCX1 and FCX2 can be applied that satisfy the following equations:

$$FX = FCX1 + FCX2 \quad (3)$$

$$FX \cdot D = FCX1 \cdot LY1 - FCX2 \cdot LY2 \quad (4)$$

Furthermore, as shown in FIG. 24, the Y direction distances from the center of gravity G and the application point of the forces FCX1 and FCX2 are LY1 and LY2.

The above-mentioned equations (3) and (4) are simultaneous equations, so the solution is immediately determined. Therefore, by supplying a current in which FCX1 and FCX2 that satisfy the formulae (3) and (4) are generated to the armature coil 63X facing the reaction force cancellation magnetic pole units 45X1 and 45X2, the X-axis direction component of the reaction force that acts on the stationary part 60X due to driving of the driving magnetic pole units 51X1 and 51X2 can be canceled.

Furthermore, with the Y-axis direction component of the reaction force that acts on the stationary part 60Y due to driving of the driving magnetic pole units 51Y1 and 51Y2, in the same manner as in canceling the reaction force in the above-mentioned stationary part 60X, by controlling the current that is supplied to the armature coil 63Y facing the reaction force cancellation magnetic pole units 45Y1 and 45Y2, cancellation of reaction force is possible.

In the device 100 of this embodiment, the main controller 20 carries out driving of the magnetic pole units 51X1, 51X2, 51Y1, and 51Y2 by supplying current to the armature coils 63X and 63Y facing the above-mentioned driving magnetic pole units 51X1, 51X2, 51Y1, and 51Y2 via the stage controlling system 19 and the current driving devices 22X and 22Y. The main controller 20 simultaneously cancels the reaction forces that act on the stationary parts 60X and 60Y that are already known to the main controller 20 by applying forces that are generated by electromagnetic interactions to the stationary parts 60X and 60Y. Therefore, because the forces to accurately cancel the reaction forces are applied to the stationary parts 60X and 60Y without delay starting at the time of the operation, it is possible to create a state as if the reaction force did not act on the stationary parts 60X and 60Y, due to driving of the driving magnetic pole units 51X1, 51X2, 51Y1 and 51Y2.

Furthermore, the reaction force cancellation in the translational driving is explained above, but in the case of rotational driving, two kinds of reaction forces act on the stationary parts 60X and 60Y. In this case, by obtaining a force to cancel each reaction force and applying the accumulated forces to the stationary parts 60X and 60Y, the entire reaction force can be canceled.

Additionally, with respect to the reaction force cancellation magnetic pole units 45X1, 45X2, 45Y1, and 45Y2, each support member 46X and 46Y is fixed to the floor or the like independently from other structural elements of the exposure device 100. Therefore, if the reaction force that acts on the stationary parts 60X and 60Y due to driving of the driving magnetic pole units 51X1, 51X2, 51Y1, and 51Y2 is applied to the stationary parts 60X and 60Y to cancel the reaction force, the reaction force acts on the reaction force cancellation magnetic pole units 45X1, 45X2, 45Y1, and 45Y2, but the reaction force does not vibrate other structural elements of the exposure device 100.

The stage device 30 is manufactured by assembling the components of stage device 30 other than the bases 21X and 21Y and the reaction force cancellation magnetic pole units 45X1, 45X2, 45Y1, and 45Y2 with respect to the bases 21X and 21Y and providing driving magnetic pole units 51X1, 51X2, 51Y1, and 51Y2 on the wafer stage WST, and performing overall adjustment (electrical adjustment, operational confirmation, and the like).

Next, a flow of an exemplitive exposure operation in the exposure device 100 including the stage device described earlier is briefly explained.

First, the reticle R where a pattern to be transferred is formed is loaded on the reticle stage RST by a reticle loader. In the same manner, a wafer W to be exposed is loaded on the wafer stage WST by a wafer loader.

At this time, the wafer stage WST is floatingly supported between the base 21X and the base 21Y at a specified wafer loading position. Based upon the measurement value of the wafer interferometer, the wafer stage WST is servo-controlled by the main controller 20 through the stage controlling system 19 so that a stopped state of a specified time can be maintained at the loading position. Therefore, during the loading position waiting time, current is supplied to the armature coils 63X and 63Y that form the stationary parts 60X and 60Y of the stage device 30, and cooling of the armature coils 63X and 63Y is performed by using a cooling machine or the like by the main controller 20 so that temperature increase due to heat in the armature coils 63X and 63Y can be prevented.

Next, by control of the main controller 20, after preparation operations of a reticle microscope, not depicted, a reference mark plate on the wafer stage WST, not depicted, and an alignment detection system, not depicted, baseline measurement, and/or the like is performed in a specified order, by using an alignment detection system, alignment measurement is performed such as EGA (enhanced global alignment) or the like disclosed in, for example, Japanese Laid-Open Patent Publication No. 61-44429 corresponding to U.S. Pat. No. 4,780,617. The disclosures of this Japanese Patent Publication and U.S. patent are incorporated herein by reference. In this operation, when movement of the wafer W is needed, as described earlier, the main controller 20 controls the current of the respective armature coils 63X and 63Y within the stage device 30 through the stage controlling system 19, and the wafer W is moved by driving the driving magnetic pole units 51X1, 51X2, 51Y1, and 51Y2. When driving the driving magnetic pole units 51X1, 51X2, 51Y1, and 51Y2, the main controller 20 controls the current of the armature coils 63X and 63Y facing the reaction force cancellation magnetic pole units 45X1, 45X2, 45Y1, and 45Y2 within the stage device 30 through the stage controlling system 19, and the reaction force that acts on the stationary parts 60X and 60Y due to driving of the driving magnetic pole units 51X1, 51X2, 51Y1, and 51Y2 is canceled. After the completion of this alignment measurement, a step-and-scan type of exposure operation is performed as follows.

Prior to this exposure operation, first the wafer stage WST is moved so that the X-Y position of the wafer W can be located at the scanning start position for the exposure of the first shooting area on the wafer W. This movement can be performed by controlling the current of the respective armature coils 63X and 63Y that form the stage device 30 through the stage controlling system 19 by the main controller 20 as described earlier. At the same time, the reticle stage RST is moved so that the X-Y position of the reticle R can be located at the scanning start position. This movement is performed through the reticle driving part or the like, not depicted, and the stage controlling system 19, by the main controller 20.

Furthermore, based upon the X-Y position information of the wafer W measured by the wafer interferometer 31 and the X-Y position information of the reticle R measured by the reticle interferometer 16, the stage controlling system 19 synchronizes and moves the wafer W and the reticle R through the stage device 30 and the reticle driving part, not depicted. At the same time, the reaction force that acts on the stationary parts 60X and 60Y is canceled. Thus, scanning exposure is performed as well as synchronizing movement.

When transfer of the reticle pattern for one shooting area is completed by the scanning exposure that is performed by controlling as described above, the wafer stage WST is stepped by one shooting area, and scanning exposure is performed for the following shooting area. In this stepping, based upon the X-Y position information of the wafer W measured by the wafer interferometer 31, as the wafer W is moved by the stage device 30, the reaction force that acts on the stationary parts 60X and 60Y is canceled.

Thus, as stepping and scanning exposure are sequentially repeated, the necessary number of shooting patterns are transferred to the wafer W. Therefore, according to the exposure device 100 of this embodiment, the wafer W can be positioned at high speed with high accuracy by the stage device 30 so that throughput can be improved and exposure can be performed with high exposure accuracy. That is, the exposure device 100 of this embodiment is structured by assembling the stage device 30 of this embodiment with each element shown in FIG. 1, such as the illumination optical system 10 and the projection optical system PL described earlier, so throughput can be improved and an exposure device that exposes with high exposure accuracy can be realized.

The exposure device 100 of this embodiment can be manufactured by assembling a reticle stage RST structured by many mechanical parts, a projection optical system PL structured by a plurality of lenses, a stage device 30, and the like, performing overall adjustment (electrical adjustment, operation confirmation, and/or the like).

In addition, it is preferable to manufacture the exposure device 100 in a clean room where the temperature, cleanliness, and the like, are managed.

Next, manufacturing a device using the exposure device and method of this embodiment is explained.

Figure 25:
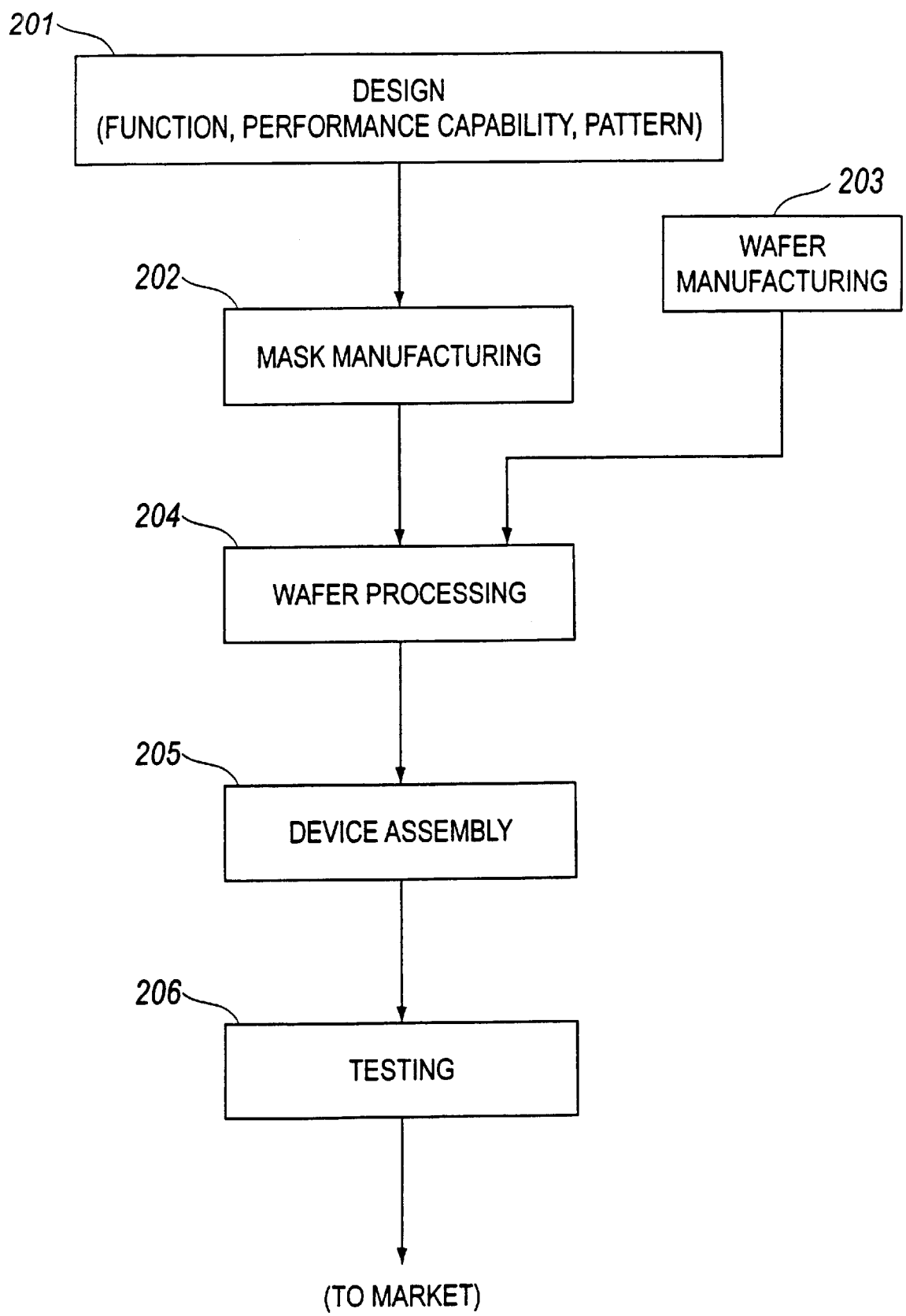
FIG. 25 is a flowchart explaining a method of manufacturing a micro-device using the exposure device shown in FIG. 1.

FIG. 25 shows a flowchart of a process for manufacturing a device (e.g., a semiconductor chip such as an IC or an LSI, a liquid crystal panel, a CCD, a thin film magnetic head, a micromachine, or the like) according to this embodiment. As shown in FIG. 25, first, in step 201 (design step), functional design of a device (for example, a circuit design of a semiconductor device or the like) is performed, and pattern designing is performed to realize the function. Subsequently, in step 202 (mask manufacturing step), a mask is manufactured on which is formed a circuit pattern that has been designed. Meanwhile, in step 203 (wafer manufacturing step), a wafer is manufactured by using a material such as silicon.

Next, in step 204 (wafer processing step), using the wafer and the mask that have been prepared in steps 201–203, as discussed, an actual circuit or the like is formed on the wafer by a lithographic technique. Next, in step 205 (assembling step), using the wafer that has been processed in step 204, the circuit can be made into a chip. In this step 205, processing such as assembly processing (dicing and bonding) and packaging processing (chip packaging) can be performed.

Finally, in step 206 (testing step), an operation confirmation test, resistance test, and/or the like is performed for the device that has been manufactured in step 205. After the process, this device is completed and can be sent to the market.

Figure 26:
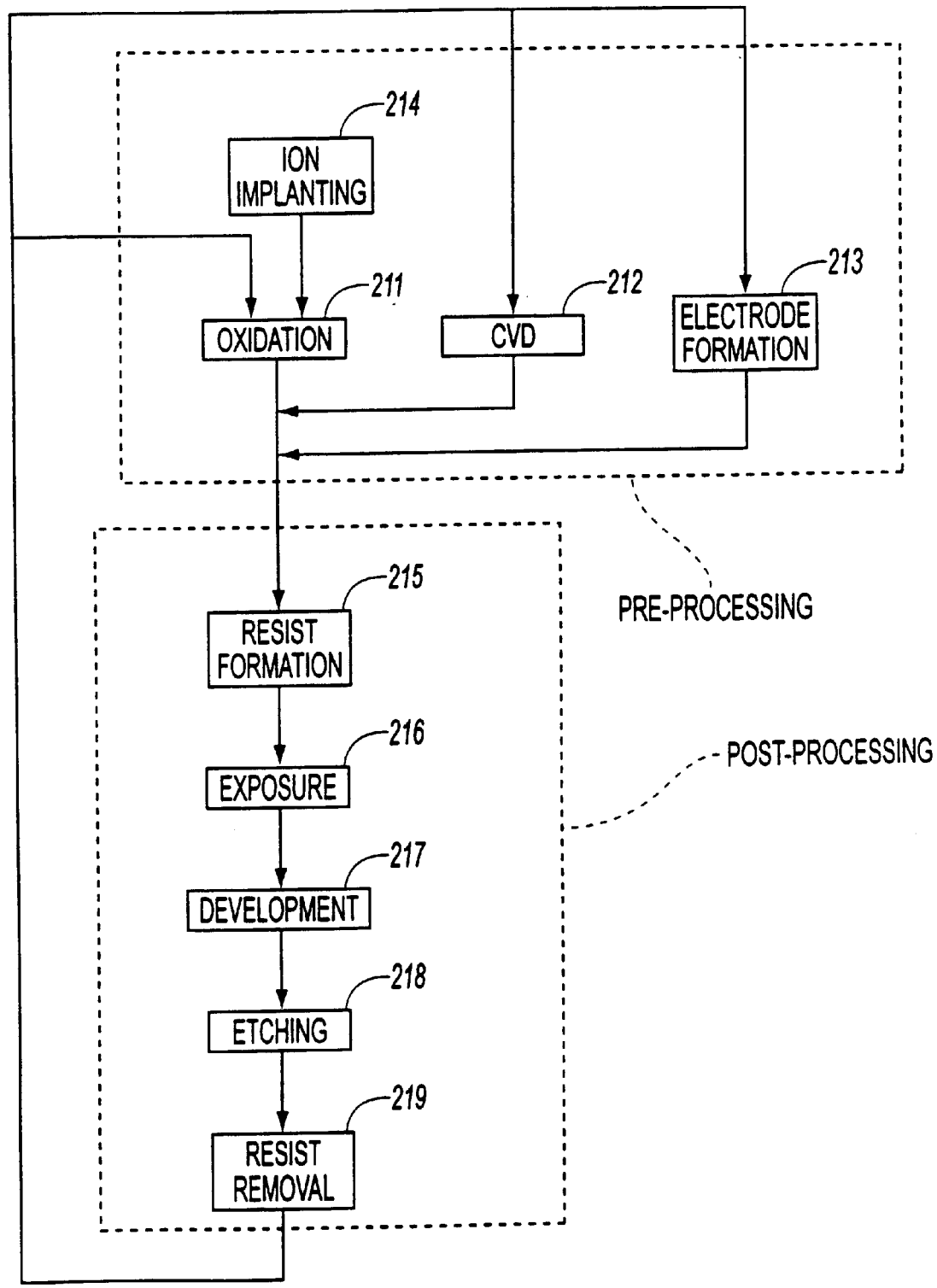
FIG. 26 is a process flowchart in a wafer processing step (step 204) of FIG. 25.

FIG. 26 shows a detailed flowchart of the above-mentioned step 204 in the case of a semiconductor device. In FIG. 26, the surface of the wafer is oxidized in step 211 (oxidation step). In step 212 (CVD step), an insulating film is formed on the wafer surface. In step 213 (electrode formation step), an electrode is formed by deposition on the wafer. In step 214 (ion embedding or implanting step) ions are embedded in the wafer. The respective steps 211 through 214 each form a pre-processing step of the wafer process, and are selected and performed according to the necessary processing.

In each step of the wafer process, when the pre-processing is completed, the following post-processing is performed. In the post-processing, first in step 215 (resist formation step), a sensitive material is coated on the wafer, and in the following step 216 (exposure step), the circuit pattern of the mask is exposed onto the wafer by the exposure device and the exposure method described above. Next, in step 217 (development step), the exposed wafer is developed, and in step 218 (etching step), the parts of the exposed member other than the parts where resist still remains are removed by etching. Then, in step 219 (resist removal step), the resist for that etching is completed, and that which is no longer needed is removed.

As the pre-processing and post-processing are repeated, many layers of circuit patterns are formed on the wafer.

Thus, a device where a refined pattern is accurately formed is manufactured at high productivity.

Figure 27:
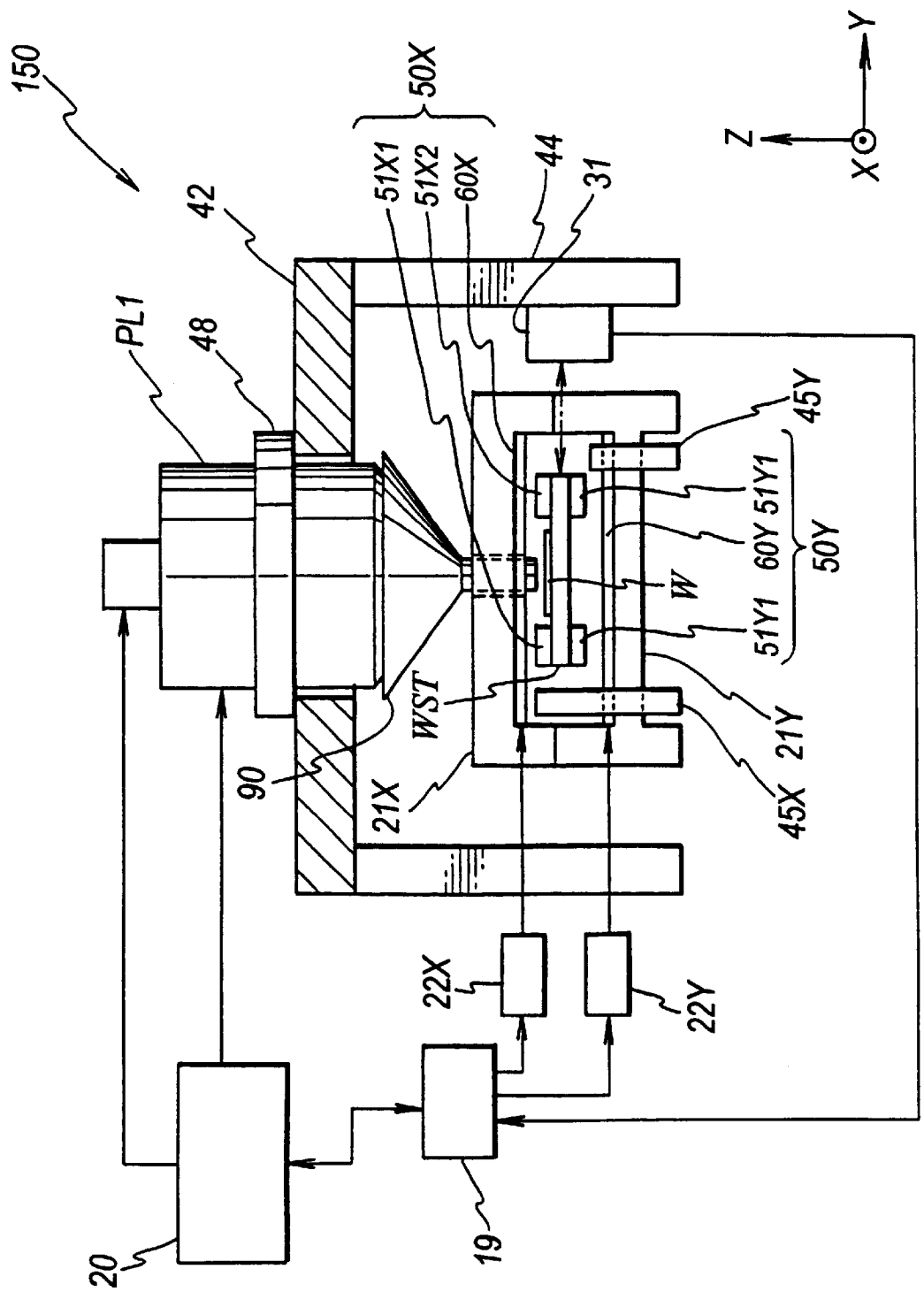
FIG. 27 is a schematic diagram of an exposure device of a second embodiment of this invention.
Figure 28:
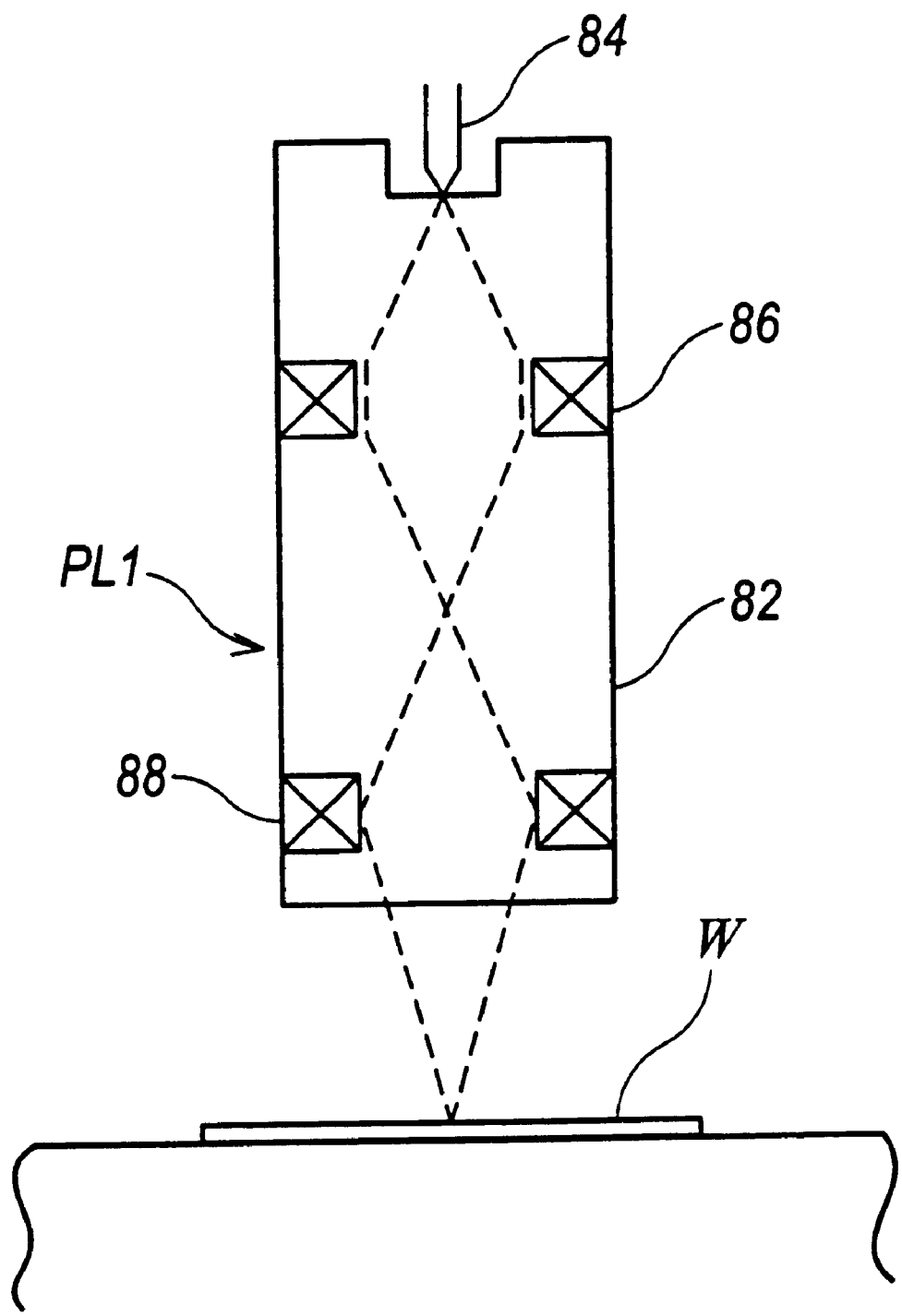
FIG. 28 shows a projection optical system of the device shown in FIG. 27.
Figure 29:
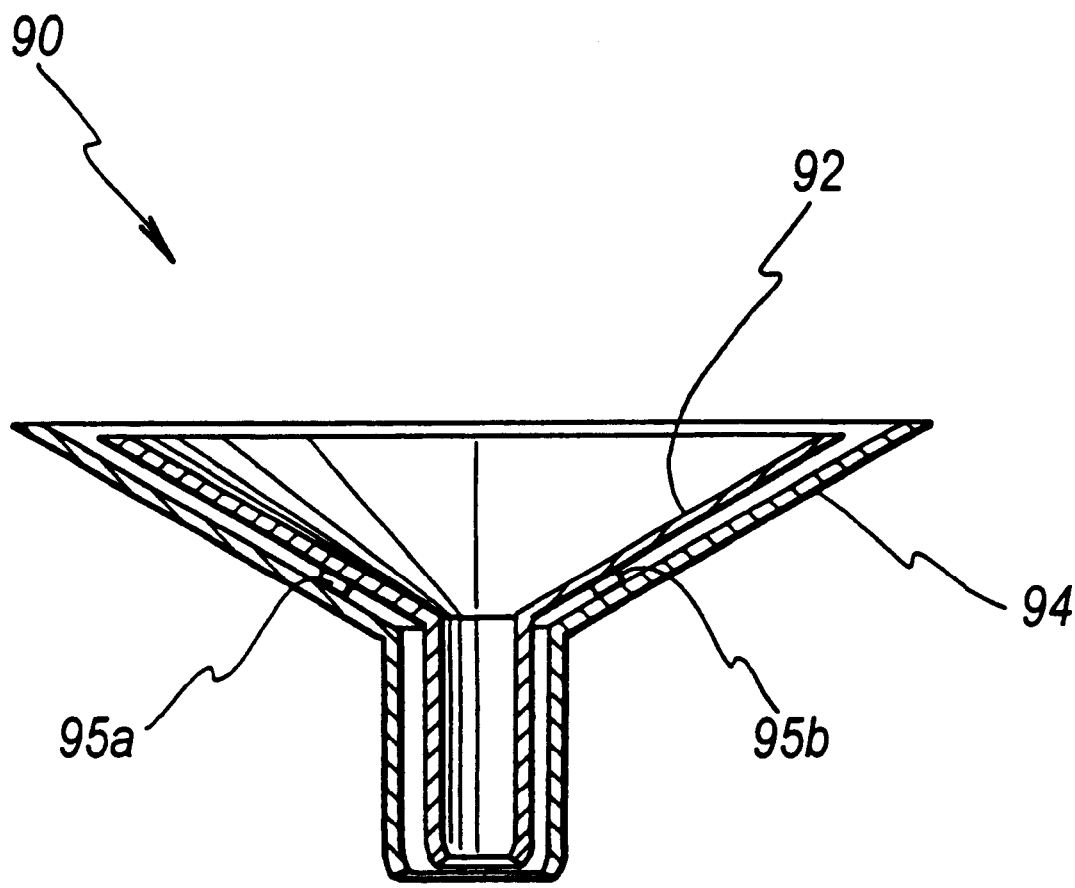
FIG. 29 shows a structure of a magnetic shield of the device shown in FIG. 27.

The following explains a second embodiment of this invention based on FIGS. 27–29. Here, the same symbols are used for the same or similar structural parts as in the first embodiment described earlier, and explanation thereof is abbreviated or omitted.

FIG. 27 is a cross-sectional view of a schematic structure of an exposure device 150 according to the second embodiment. This exposure device 150 is an electron beam exposure device that performs exposure of the resist on the wafer W using an electron beam.

The exposure device 150 of this embodiment is different from the first embodiment described earlier and is stored within a vacuum chamber, not depicted, disposed in a high-pressure clean room, not depicted. This exposure device 150 differs from the exposure device 100 in that an electron optical system PL1, which is a type of a charged particle beam optical system, is disposed as a projection optical system instead of the projection optical system PL discussed earlier, and the table 41, the reticle stage RST, and the reticle interferometer 16 are not disposed.

As shown in FIG. 28, a pencil beam type (Gaussian beam type) electron optical system having an electron lens barrel 82 that functions as a charged particle beam lens barrel, an electron gun 84, and first and second electromagnetic lenses 86 and 88 is used as the electron optical system PL1. In this electron optical system PL1 of FIG. 28, resist on the wafer W is exposed and a desired pattern is transferred to the surface of the resist as an electron beam generated by the electron gun 84 is accelerated by an electromagnetic lens system structured by the first and second electromagnetic lenses 86 and 88, to which respective specified voltages are applied. The electron beam is formed on a spot, and the spot is raster-scanned or vector-scanned. Furthermore, in FIG. 28, the internal structure of the electron optical system PL1 is shown, but an objective aperture, polarizing electrode, reflected electron detection elements, an astigmatic correction coil and the like are actually also included.

Furthermore, in this exposure device 150, as shown in FIG. 27, a funnel-shaped magnetic shield 90 is provided that covers the parts of the electron lens barrel 82 of the electron optical system PL1 excluding the output port of the electron beam output end part. FIG. 29 shows a cross-sectional view of the magnetic shield 90. This magnetic shield 90 has a two-layer structure with an internal barrel 92 shaped like a funnel and an external barrel 94 that has substantially the same shape disposed at a specified clearance from the periphery of the internal barrel 92. The internal barrel 92 is supported by a plurality of protruding parts 95a, 95b, . . . disposed at a specified interval on the internal surface of the external barrel 94 so that substantially the same clearance can be maintained over the entire periphery of the external barrel 94. The internal barrel 92 is formed by, for example, permalloy, which has a large permeability, and the external barrel 94 is formed by, for example, carbon steel, which has a smaller permeability, compared to that of the internal barrel 92.

This is done because the magnetic flux that enters into the path of the electron beam from outside should be as small as possible. That is, because the external barrel 94 uses a material with smaller permeability, magnetic flux enters at some ratio to the internal barrel 92 through the external barrel 94, but the magnetic flux that has entered goes through the internal part of the internal barrel 92 structured by a material with large permeability, and it substantially reliably prevents the magnetic flux from entering into the electron lens barrel 82. Therefore, it is possible to keep deflections of the electron beam in unexpected directions due to magnetic effects to a minimum.

If the external barrel is formed by a material with large permeability and the internal barrel is formed by a material with small permeability, the magnetic flux from outside goes through the inside of the external barrel. However, some flux enters into the internal barrel and most of the magnetic flux that entered the internal barrel enters into the electron lens barrel 82 via the internal barrel that is formed by a material with small permeability. This is not preferable.

The other parts of the structure are the same as in the first embodiment described earlier.

According to the exposure device 150 that is thus structured, during exposure, a plurality of divided areas on the wafer W are sequentially positioned at the exposure position, respectively, via the stage device 30 by the controller 20, that is, they are positioned below the electron optical system PL1, and a specified circuit pattern is sequentially transferred to the respective divided areas. This is different from the exposure device 100 described earlier, but the same effects can be obtained overall. Furthermore, according to the exposure device 150, by using the magnetic shield 90 with the two-layer structure described earlier, due to the magnetic effects of the magnetic circuit that structures the stage device 30, there is an effect such that the electron beam that is irradiated from the electron optical system PL1 to the wafer W can be controlled such that deflections of the electron beam in unexpected directions are minimized. Needless to say, according to the exposure device 150, because an electron beam is used, finer exposure can be performed compared to the exposure device 100 using light.

The exposure device 150 of this embodiment can be manufactured by assembling an electron optical system PL1 structured by many parts, a magnetic shield 90, a stage device 30, and the like, and performing overall adjustment (electrical adjustment, operation confirmation, and/or the like).

Furthermore, it is preferable to manufacture the exposure device 100 in a clean room where the temperature and cleanliness are managed.

Furthermore, by using the exposure device 150 of this embodiment, step 202 in FIG. 25 described earlier is defined as a step of generating control data for the electron beam, and a device with an ultra-fine pattern can be manufactured by the same method of manufacturing as used for the device in the first embodiment discussed earlier.

Figure 30:
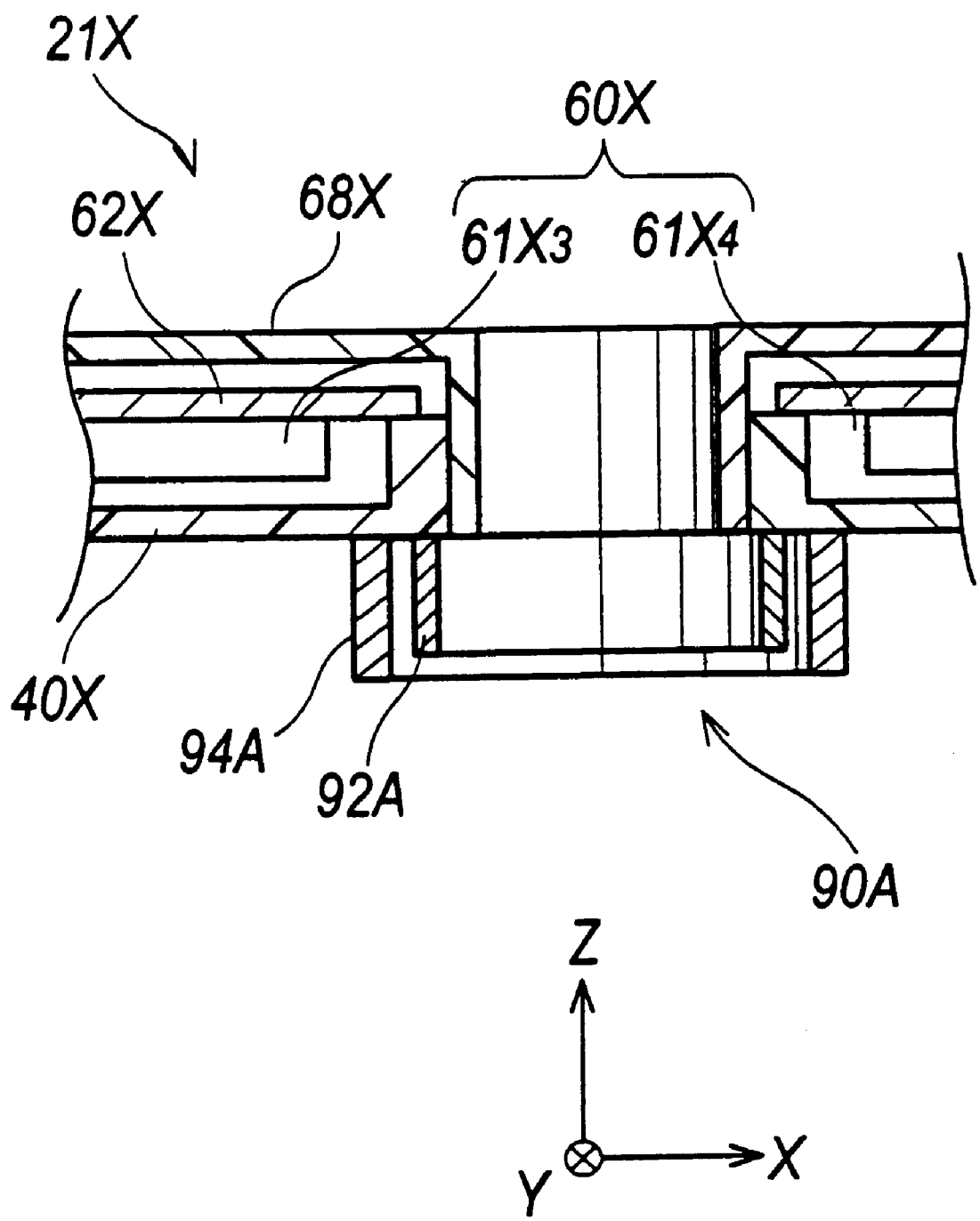
FIG. 30 explains a modification of the magnetic shield.

In addition, in this embodiment, the parts of the electron lens barrel 82 of the electron optical system PL1 excluding the output port of the electron beam output end are covered by the magnetic shield 90. However, as shown in FIG. 30, it is also acceptable to use a magnetic shield 90A structured by an external barrier 94A and an internal barrier 92A in the lower face of the base 21X. In that case, due to the same reason as mentioned above, the internal barrier 92A is formed by, for example, permalloy with large permeability, and the external barrier 94A is preferably formed by, for example, carbon steel with small permeability compared to the internal barrier 92A. When the magnetic shield 90A is used, it is possible to decrease the magnetic flux that enters the electron beam path and affects the stage device 30.

In addition, in this embodiment, as an electron optical system, the case when the pencil beam-type (Gaussian beam-type) electron optical system is used is explained, but the invention is not limited to this. Any of the following can be used: ① a cell projection-type electron optical system that projects a simple pattern such as square, parallelogram, or the like that is preformed in a mask (aperture), and one side of which is approximately 5 μm, ② a variable formation beam-type electron optical system that applies a beam of a certain size (a square, one side of which is 5 μm) to a mask (aperture) on which a somewhat more complicated pattern is preformed, compared to the cell projection type, and projects a pattern corresponding to a cross-sectional shape of the electron beam that goes through the mask, ③ a blanking aperture array type of EBDW (EB direct-writing type) which has a plurality of shutters in the mask can be used (normally, electrodes are formed in a matrix in a dielectric mask, and by applying or not applying voltage to the respective electrode positions, each respective electrode part is caused to function as a type of condenser, thereby forming a shutter), and ④ EBPS (EB projection system) which simultaneously exposes an area with an approximately 250 μm square area by using a stencil mask. Alternatively, an electron lens barrel can be structured by an arbitrary combination of respective methods like ①-④ in the above-mentioned pencil beam method.

Furthermore, in this embodiment, the case when the magnetic shield 90 has a two-layer structure is explained, but this invention is not limited to this. The magnetic shield can have a single layer structure. In this case, due to the effects of the magnetic flux that is generated in the stage device 30 by the magnetic shield, it is possible to control the electron beam output from the electron lens barrel 82 so that it is not deflected in an unexpected direction, and exposure with high accuracy can be performed using the electron beam. The material of the magnetic shield in this case can be a material with large permeability such as permalloy.

In addition, in each embodiment described above, the cases were described in which this invention was applied to an ArF exposure device and an electron line exposure device, respectively, but the applicable scope of this invention is not limited to this. This invention is also applicable to an exposure device using a charged particle beam such as an ion beam exposure device, and to an X-ray exposure device, in addition to an EUV exposure device that uses light of the wavelength 5–15 nm as the exposure illumination light, and a VUV exposure device using vacuum ultraviolet light such as $F_2$ laser light (wavelength 157 nm) as exposure illumination light. Furthermore, in this invention, inside of the chamber can be air atmosphere, and needless to say, this invention is preferably applicable to a DUV exposure device using KrF excimer laser light, g rays or i rays as the exposure illumination light. Furthermore, this invention may be used with a step-and-repeat machine, step-and-scan machine, or step-and-stitch machine.

Figure 31A:
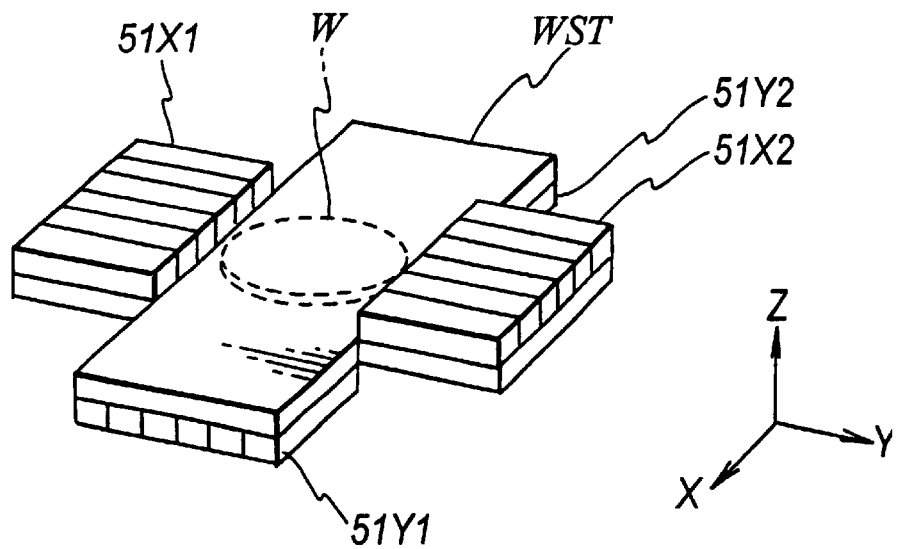
FIGS. 31A and 31B show a first modification of a wafer stage and of a driving magnetic pole unit.
Figure 31B:
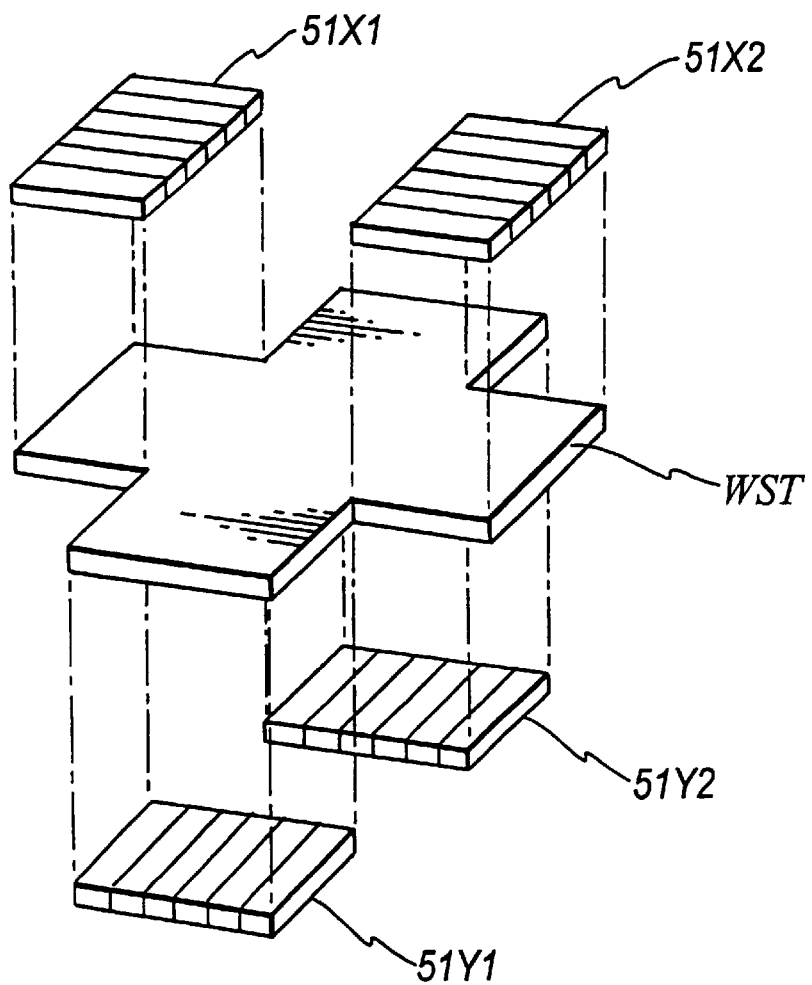
Figure 32A:
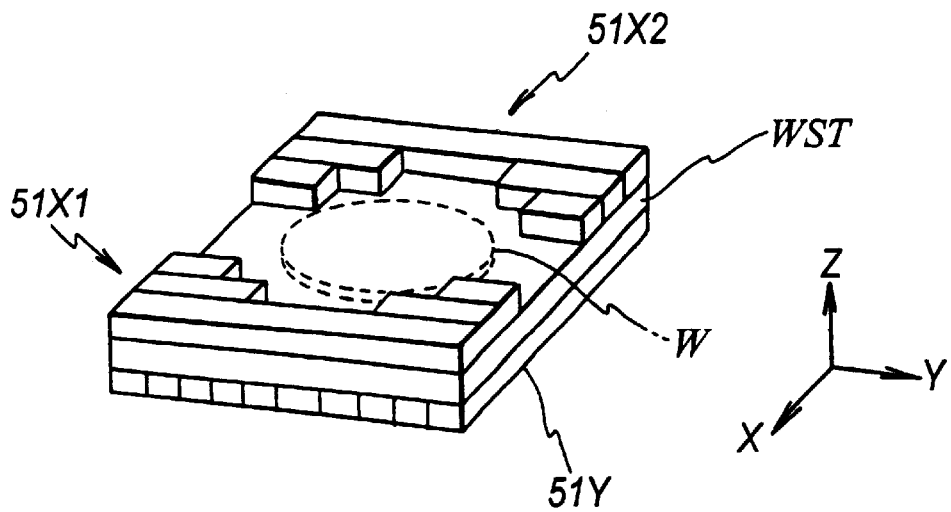
FIGS. 32A and 32B show a second modification of a wafer stage and of a driving magnetic pole unit.
Figure 32B:
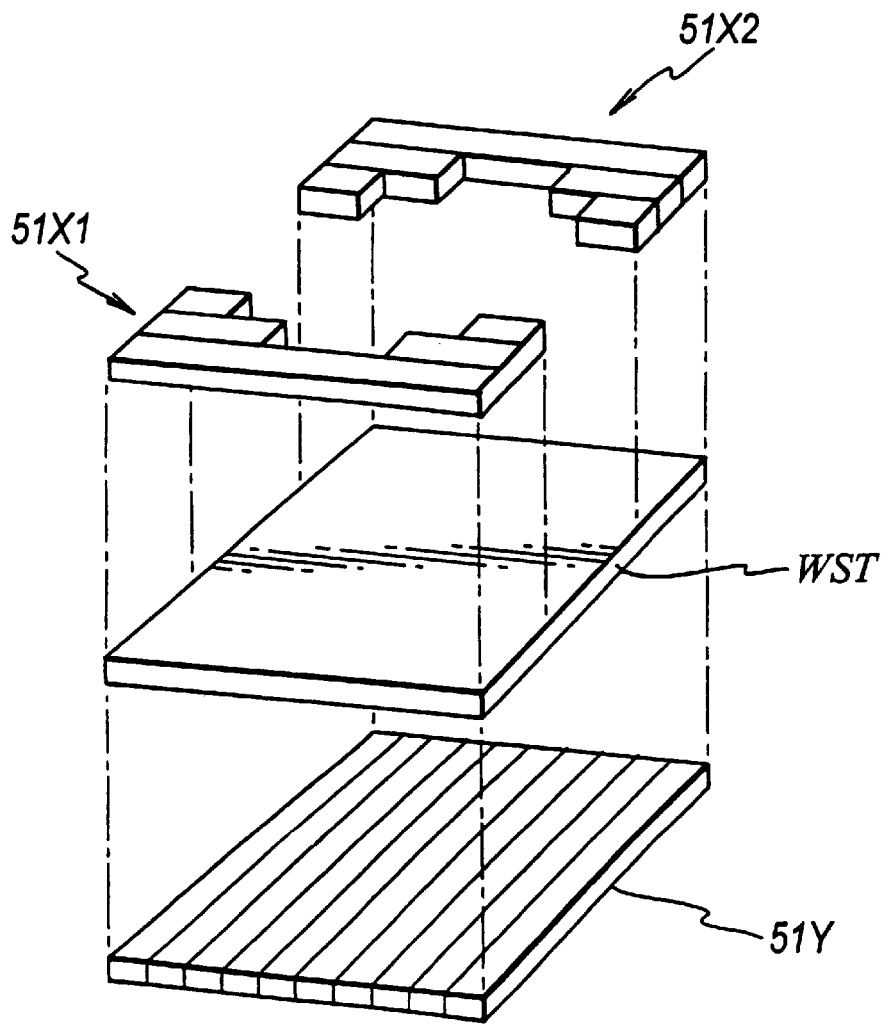

Furthermore, in the above-mentioned embodiment, the driving magnetic pole units 51Y1 and 51Y2 are disposed on areas of the surface of the wafer stage WST opposite the surface where the wafer is loaded, corresponding to areas where the driving magnetic pole units 51X1 and 51X2 are disposed, but as shown in FIGS. 31A and 31B, it is possible to use areas on the surface opposite the wafer loading surface that do not correspond to the areas where the driving magnetic pole units 51X1 and 51X2 are located as areas on which the driving magnetic pole units 51Y1 and 51Y2 are disposed. In addition, as shown in FIGS. 32A and 32B, the area where the driving magnetic pole units 51Y1 and 51Y2 are disposed can be the entire surface opposite the surface where the wafer is loaded. In any case, it can be operated in the same manner as the above-mentioned embodiment, and the same effects can be obtained.

Furthermore, after the stage device 30 is fixed to the exposure device 100, the origin position is obtained (magnetic poles are aligned) with respect to the position relationship between the stationary part 60X and movable elements 51X1 and 51X2, and the origin position with respect to the position relationship between the stationary part 60Y and movable elements 51Y1 and 51Y2 is obtained. The details of obtaining the origin position are disclosed in U.S. patent application Ser. No. 09/156,772, the disclosure of which is incorporated herein by reference.

Furthermore, even though the wafer stage WST is stopped within the X-Y plane, the floating force acts in the Z direction, but the magnetic pole alignment is not affected. Additionally, during the magnetic pole alignment, movement of the wafer stage WST in the Z direction can be restricted by using, for example, a stopper member. Furthermore, based upon the result of the magnetic pole alignment described earlier, the magnetic poles for floating can also be aligned.

Furthermore, in the above-mentioned embodiment, the magnetic body member 62X was used as a member that supports the armature coil 63X in the stationary part 60X, but a non-magnetic body member can also be used. Furthermore, a non-magnetic body member 62Y was used as a member that supports the armature coil 63Y in the stationary 60Y, but a magnetic body member can also be used.

Furthermore, in the above-mentioned embodiment, the magnets where the magnetic direction is different from the Z-axis direction were combined to form the driving magnetic pole units, but it is also acceptable to structure the driving magnetic pole units by combining a flat magnetic body member with a plurality of magnets where the magnetic direction is the Z-axis direction.

Additionally, in the above-mentioned embodiment, three-phase current was supplied to the coil row, but it is also possible to supply a plurality of phases of the current that is different from three phases. At this time, the width of the current path of the armature coil must be determined in response to the number of phases of the current to be supplied.

Furthermore, in the above-mentioned embodiment, permanent magnets are arrayed in the movable elements (driving magnetic pole units) and the reaction force cancellation magnetic pole units, and armature coils are arrayed in the stationary part. However, it is also possible to array the armature coils in the movable elements and the reaction force cancellation magnetic pole units, and to array the permanent magnets in the stationary part. Such an arrangement is particularly advantageous when an electron beam is used to expose the substrate because the changing magnetic field caused by stage motion is much smaller.

In addition, in the above-mentioned embodiment, the reaction force cancellation magnetic pole units are disposed corresponding to two respective corners that have a diagonal relationship with the respective stationary parts, but the reaction forces can be canceled by disposing the reaction force cancellation magnetic pole units in three corners. Furthermore, reaction forces can be canceled by disposing reaction force cancellation magnetic pole units that do not all generate force in the same direction in three or more arbitrary stationary parts.

In addition, a cooling liquid was used for cooling of the armature coil in the above-mentioned embodiment, but gas coolant can be used, as long as it is a fluid that can be a coolant.

Figure 33:
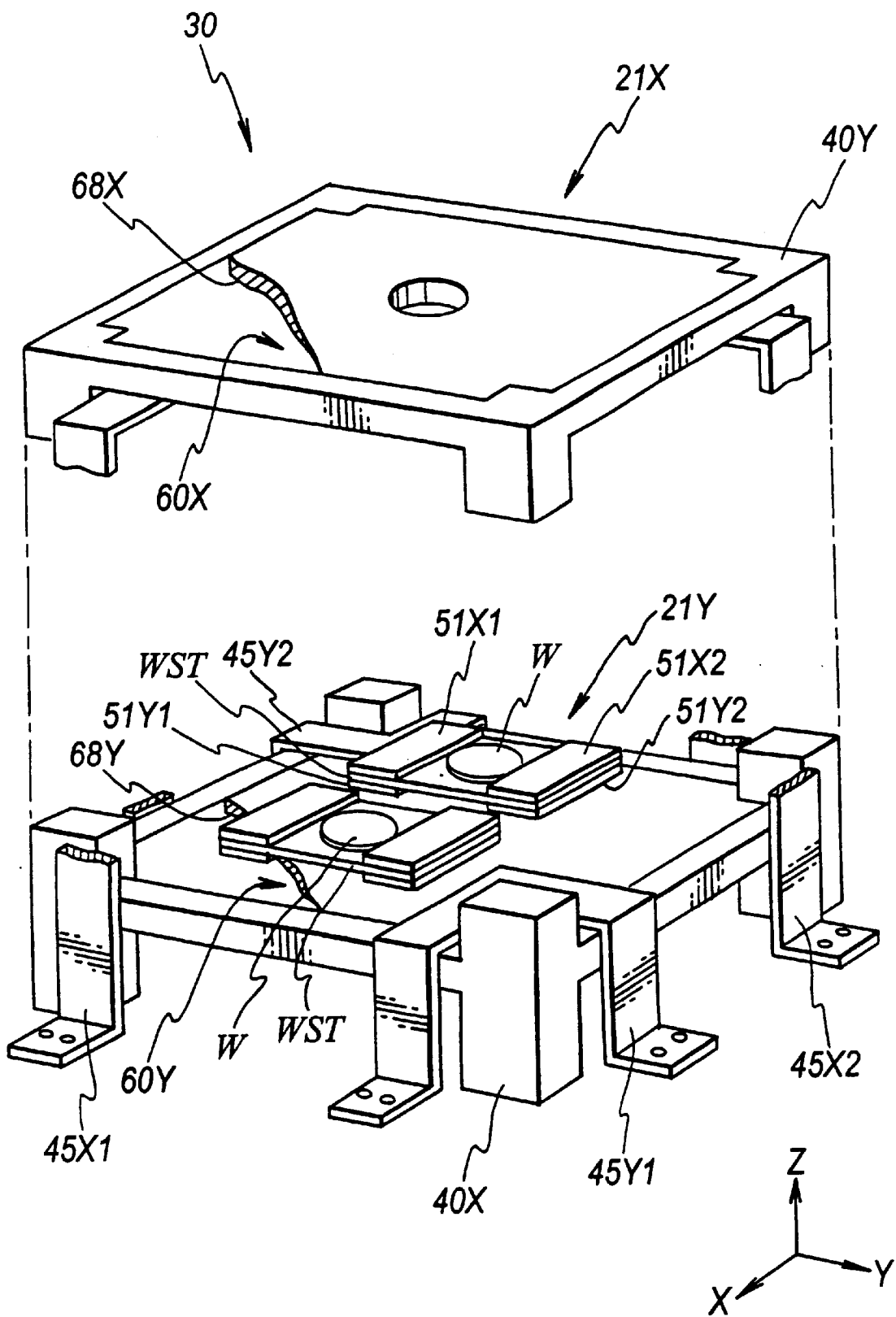
FIG. 33 is an exploded perspective view of a modification of a stage device.

Furthermore, the number of wafer stages WST to be disposed is not limited to one. For example, as shown in FIG. 33, two wafer stages WST may be disposed and driven independently, and it is acceptable to perform another operation, such as the receipt of the wafer W, on one wafer stage WST while the exposure of the wafer is being performed using the other wafer stage WST.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A stage device that controls a position of an object loaded on the stage device, comprising:
   a stage having a loading face on which the object is loaded;
   a first driving device that drives the stage in a first-axis direction in a plane that is parallel to the loading face, the first driving device having a first movable element that is disposed on a side of the loading face of the stage and a first stationary part that faces the side of the loading face of the stage; and
   a second driving device disposed on an opposite side of the loading face side of the stage, and that drives the stage in a second-axis direction crossing the first-axis direction within a plane that is parallel to the loading face.

2. The stage device as set forth in claim 1, wherein the first-axis direction is perpendicular to the second-axis direction.

3. The stage device as set forth in claim 1, wherein the first moveable element has a first magnetic pole unit, and the first stationary part has a first armature unit, and wherein the first driving device drives the first moveable element in the first-axis direction by an electromagnetic interaction between the first armature unit, to which a current is supplied, and the first magnetic pole unit.

4. The stage device as set forth in claim 3, wherein the first magnetic pole unit generates an alternating field that changes in a first cycle along the first-axis direction between the first magnetic pole unit and the first armature unit.

5. The stage device as set forth in claim 4, wherein the first magnetic pole unit is magnetized in a direction that is not perpendicular to the loading face and has a plurality of magnets arrayed in the first-axis direction.

6. The stage device as set forth in claim 1, wherein the stage comprises a non-magnetic material.

7. The stage device as set forth in claim 4, wherein the first magnetic pole unit is magnetized in a direction that is perpendicular to the loading face and comprises a plurality of magnets arrayed in the first-axis direction so that polarities of magnetic pole faces of the plurality of magnets facing the first armature unit alternate.

8. The stage device as set forth in claim 7, wherein the first magnetic pole unit further comprises a magnetic body member comprising a magnetic material that supports the plurality of magnets on the side opposite the face that faces the first armature unit.

9. The stage device as set forth in claim 4, wherein the first armature unit has a current path along the plane parallel to the loading face and comprises a coil row comprising a plurality of armature coils arrayed in the first-axis direction, and M, where M is an integer of 2 or more, kinds of current path are arrayed per length of the first cycle along the first-axis direction in the coil row, and wherein the first driving device further comprises a first current supply that supplies a cyclic current having mutually different phases in the M kinds of current paths, respectively.

10. The stage device as set forth in claim 9, wherein a width of the current path in the first-axis direction for the armature coil is 1/M of the first cycle.

11. The stage device as set forth in claim 9, wherein the shape of the armature coil is a flat polygon.

12. The stage device as set forth in claim 11, wherein the shape of the armature coil is a flat hexagon.

13. The stage device as set forth in claim 9, further comprising a flat coil support member that supports the coil row on a side of the coil row opposite the side facing the first magnetic pole unit.

14. The stage device as set forth in claim 13, wherein the coil support member comprises a magnetic material.

15. The stage device as set forth in claim 13, wherein the coil support member comprises a non-magnetic material.

16. The stage device as set forth in claim 9, wherein the first magnetic pole unit generates magnetic flux having a first component in a direction perpendicular to the loading face, which changes cyclically in a first cycle along the first-axis direction in an alignment face of the coil row facing the first magnetic pole unit, and a second component in a direction perpendicular to the first-axis direction along the plane parallel to the loading face;
   wherein the current supply supplies a current to the armature coil, the current having a first current that has an electromagnetic interaction with the first component and drives the moveable element in the first-axis direction, and a second current that has an electromagnetic interaction with the second component and drives the moveable element in a direction perpendicular to the loading face, the first and second currents being superimposed.

17. The stage device as set forth in claim 1, wherein the first driving device further comprises a first reaction force cancellation mechanism that applies a force to cancel a reaction force that acts on the first stationary part, due to driving of the first moveable element relative to the first stationary part.

18. The stage device as set forth in claim 1, wherein the second driving device comprises a second moveable element disposed on a face of the stage opposite the loading face of the stage, and a second stationary part facing the second moveable element.

19. The stage device as set forth in claim 18, wherein the second moveable element has a second magnetic pole unit, and the second stationary part has a second armature unit, and wherein the second driving device drives the second moveable element in the second-axis direction by an electromagnetic interaction between the second magnetic pole unit and the second armature unit to which current is supplied.

20. The stage device as set forth in claim 19, wherein the stage comprises a non-magnetic material.

21. The stage device as set forth in claim 19, wherein the second magnetic pole unit generates an alternating field that changes in a second cycle along the second-axis direction between the second magnetic pole unit and the second armature unit.

22. The stage device as set forth in claim 21, wherein the second magnetic pole unit is magnetized in a direction that is not perpendicular to the loading face and has a plurality of magnets arrayed in the second-axis direction.

23. The stage device as set forth in claim 21, wherein the second magnetic pole unit is magnetized in a direction that is perpendicular to the loading face and comprises a plurality of magnets arrayed in the second-axis direction so that polarities of magnetic poles of the plurality of magnets facing the second armature unit alternate.

24. The stage device as set forth in claim 23, wherein the second magnetic pole unit further comprises a magnetic body member comprising a magnetic material that supports the plurality of magnets on the side opposite the face that faces the second armature unit.

25. The stage device as set forth in claim 21, wherein the second armature unit has a current path along the plane parallel to the loading face and comprises a coil row comprising a plurality of armature coils arrayed in the second-axis direction, and N, where N is an integer of 2 or more, kinds of current paths are arrayed per length of the second cycle along the second-axis direction in the coil row, and wherein the second driving device further comprises a second current supply that supplies a cyclic current having mutually different phases in the N kinds of current paths, respectively.

26. The stage device as set forth in claim 25, wherein a width of the current path in the first-axis direction for the armature coil is 1/N of the second cycle.

27. The stage device as set forth in claim 25, wherein the shape of the armature coil is a flat polygon.

28. The stage device as set forth in claim 27, wherein the shape of the armature coil is a flat hexagon.

29. The stage device as set forth in claim 25, further comprising a flat coil support member that supports the coil rows on a side of the coil row opposite the side facing the second magnetic pole unit.

30. The stage device as set forth in claim 29, wherein the coil support member comprises a magnetic material.

31. The stage device as set forth in claim 29, wherein the coil support member comprises a non-magnetic material.

32. The stage device as set forth in claim 25, wherein the second magnetic pole unit generates magnetic flux having a first component in a direction perpendicular to the loading face, which changes cyclically in a second cycle along the second-axis direction in an alignment face of the coil row facing the second magnetic pole unit, and a second component in a direction perpendicular to the second-axis direction along the plane parallel to the loading face;
wherein the second current supply supplies a current to the armature coil, the current having a first current that has an electromagnetic interaction with the first component and drives the moveable element in the second-axis direction, and a second current that has an electromagnetic interaction with the second component and drives the moveable element in a direction perpendicular to the loading face, the first and second currents being superimposed.

33. The stage device as set forth in claim 18, wherein the second driving device further comprises a first reaction force cancellation mechanism that applies a force to cancel a reaction force that acts on the second stationary part due to driving of the second moveable element relative to the second stationary part, by electromagnetic interaction.

34. The stage device as set forth in claim 1, wherein the first moveable element is disposed on a first area of a vicinity of a loading area of the loading face of the stage on which the object is loaded;
wherein the second driving device comprises a second moveable element disposed on a second area on the rear face of the loading face of the stage and a second stationary part facing the second moveable element.

35. The stage device as set forth in claim 34, wherein the second area is a corresponding area of the first area, on the rear face.

36. The stage device as set forth in claim 35, wherein the first area comprises two areas on either side of the loading area on which the object is loaded on the loading face of the stage.

37. The stage device as set forth in claim 34, wherein the second area includes an area other than a corresponding area of the first area on the rear face.

38. The stage device as set forth in claim 37, wherein the first area comprises two areas on either side of the loading area on which the object is loaded on the loading face of the stage; and
wherein the second area includes a corresponding area of the loading area where the object is loaded, on the rear face.

39. The stage device set forth in claim 37, wherein the second area is an area that does not correspond to the first area on the rear face.

40. The stage device as set forth in claim 39, wherein the first area comprises areas disposed on both sides of the loading area on which the object is loaded, in a third-axis direction within a plane parallel to the loading face, and the second area comprises areas disposed on both sides of the corresponding area of the loading area on which the object is loaded, on the rear face, in a fourth-axis direction crossing the third-axis direction within a plane parallel to the loading face.

41. The stage device as set forth in claim 1, further comprising:
a position detector that detects a position of the stage; and
a controller that controls the first and second driving devices, based upon the detection result of the position detector.

42. The stage device as set forth in claim 1:
wherein at least one of the first and second driving devices has a magnetic pole unit and an armature unit that cooperate to drive the stage; and
further comprising an origin position detector that determines an origin in the position relationship between the armature unit and the magnetic pole unit.

43. The stage device as set forth in claim 1, wherein the first stationary part has an opening to process the object.

44. A method of controlling a position of an object loaded on a stage, comprising the steps of:

driving the stage in a first-axis direction within a plane that is parallel to a loading face on which the object is loaded, from an upper side of the loading face of the stage; and driving the stage in a second-axis direction crossing the first-axis direction within a plane that is parallel to the loading face from an opposite side of the loading face side of the stage.

45. The position controlling method as set forth in claim 44, wherein the first and second steps are simultaneously performed.

46. The position controlling method as set forth in claim 44:

wherein the stage driving is performed with an armature unit and a magnetic pole unit; and further comprising the step of performing an origin detection that determines an origin in the position relationship between the armature unit and the magnetic pole unit.

47. A method of manufacturing a stage device that controls a position of an object that is loaded on the stage device, comprising the steps of:

providing a stage on which to load the object;

disposing a first driving device that drives the stage in a first-axis direction within a plane that is parallel to a loading face on which the object is loaded, the first driving device having a first movable element that is disposed on a loading face side of the stage and a first stationary part that faces the loading face side of the stage; and disposing a second driving device that drives the stage in a second-axis direction crossing the first-axis direction within a plane that is parallel to the loading face.

48. The method as set forth in claim 47:

wherein the step of disposing the second driving device comprises a first sub-step of disposing a second moveable element, that is a structural element of the second driving device, on a face on the opposite side of the loading face of the stage; and a second sub-step of disposing a second stationary part, that is a structural element of the second driving device, opposite the second moveable element.

49. The method as set forth in claim 47:

wherein at least one of the first and second driving devices has a magnetic pole unit and an armature unit that cooperate to drive the stage; and comprising the step of providing an origin position detector that determines an origin position in the position relationship between the armature unit and the magnetic pole unit.

50. The stage device as set forth in claim 47, wherein the first stationary part has an opening to process the object.

51. An exposure device comprising:

an optical system through which an exposure energy beam passes;

a stage having a loading face on which an object is loaded, the object being disposed on a path of the energy beam;

a first driving device that drives the stage in a first-axis direction in a plane that is parallel to the loading face, the first driving device having a first movable element that is connected to a side of the loading face of the stage and a first stationary part that faces the side of the loading face of the stage; and a second driving device connected to an opposite side of the loading face side of the stage, and that drives the stage in a second-axis direction crossing the first-axis direction within a plane that is parallel to the loading face.

52. The exposure device as set forth in claim 51, wherein the object is a substrate that is exposed by the energy beam, and to which a specified pattern is transferred.

53. The exposure device as set forth in claim 52, wherein driving force generating members of the optical system and of the stage device are provided mechanically independently from each other.

54. The exposure device as set forth in claim 52, wherein the exposure device has a plurality of the stages to hold a plurality of substrates respectively.

55. The exposure device as set forth in claim 51:

wherein the optical system is a charged particle beam optical system comprising a charged particle beam lens barrel.

56. The exposure device as set forth in claim 55, further comprising a magnetic shield that prevents entrance of magnetic induction flux to a path of progression of the charged particle beam output from the charged particle beam lens barrel.

57. The exposure device as set forth in claim 56, wherein the magnetic shield has a two-layer structure including an internal wall member and an external wall member that is arranged at a specified clearance from a periphery of the internal wall member, and wherein the external wall member is formed by a material having a smaller permeability compared to the internal wall member.

58. A device manufactured by using the exposure device as set forth in claim 51.

59. The exposure device as set forth in claim 51, wherein the first stationary part has an opening to pass the exposure energy beam.

60. The exposure device as set forth in claim 51, further comprising a reaction force suppressor that suppresses a reaction force caused by the movement of the stage.

61. A method of manufacturing an exposure device, comprising the steps of:

providing an optical system through which an exposure energy beam passes;

providing a stage on which to load an object;

disposing a first driving device that drives the stage in a first-axis direction within a plane that is parallel to a loading face of the stage on which the object is loaded, the first driving device having a first movable element that is connected to a loading face side of the stage and a first stationary part that faces the loading face side of the stage; and disposing a second driving device that drives the stage in a second-axis direction crossing the first-axis direction within a plane that is parallel to the loading face.

62. The method as set forth in claim 61, wherein the first stationary part has an opening to pass the exposure energy beam.

63. The method as set forth in claim 61, further comprising providing a reaction force suppressor that suppresses a reaction force caused by the movement of the stage.

64. The method as set forth in claim 61, wherein the exposure device has a plurality of the stages to hold a plurality of objects respectively.

65. A method of manufacturing a device, comprising the steps of:

driving a stage in a first-axis direction within a plane that is parallel to a loading face of the stage on which a substrate is loaded, from an upper side of the loading face of the stage;

driving the stage in a second-axis direction crossing the first-axis direction within the plane that is parallel to the loading face from an opposite side of the loading face side of the stage; and transferring a specified pattern to the substrate while the stage moves in the first-axis direction.

* * * * *